United States Patent

Suzuki et al.

[11] Patent Number: 5,416,338
[45] Date of Patent: May 16, 1995

[54] SEMICONDUCTOR DEVICE WITH QUANTUM WELL RESONANCE STATES

[75] Inventors: Takamasa Suzuki, Nagoya; Hiroshi Ito, Toyohashi, both of Japan

[73] Assignee: Nippondenso Co., Ltd., Kariya, Japan

[21] Appl. No.: 22,631

[22] Filed: Feb. 25, 1993

[30] Foreign Application Priority Data

| | | | |
|---|---|---|---|
| Feb. 29, 1992 | [JP] | Japan | 4-079159 |
| Mar. 25, 1992 | [JP] | Japan | 4-100519 |
| Mar. 26, 1992 | [JP] | Japan | 4-101740 |
| Mar. 26, 1992 | [JP] | Japan | 4-101741 |
| Mar. 26, 1992 | [JP] | Japan | 4-101742 |
| Mar. 26, 1992 | [JP] | Japan | 4-101743 |

[51] Int. Cl.$^6$ ............... H01L 29/205; H01L 31/06; H01L 33/00
[52] U.S. Cl. ............... 257/21; 257/85; 257/97; 359/248; 372/50
[58] Field of Search ............... 257/21, 97, 85; 359/248; 372/50

[56] References Cited

U.S. PATENT DOCUMENTS

| | | | |
|---|---|---|---|
| 5,008,893 | 4/1991 | Amman et al. | 342/50 |
| 5,013,685 | 5/1991 | Chiu et al. | 257/745 |
| 5,047,822 | 9/1991 | Little, Jr. | 257/21 |
| 5,077,593 | 12/1991 | Sato et al. | 257/21 |
| 5,160,991 | 11/1992 | Delacourt et al. | 257/21 |
| 5,216,261 | 6/1993 | Inata et al. | 257/21 |

FOREIGN PATENT DOCUMENTS

| | | | |
|---|---|---|---|
| 60-68330 | 4/1985 | Japan | G02F 3/00 |
| 3165071 | 7/1991 | Japan | 257/21 |

OTHER PUBLICATIONS

Absorption of Light in GaAs/AlGaAs Double Quantum Well Structure OQE90-124 Apr. 1985 Hisada et al.
Electroabsorption in GaAs/AlGaAs coupled quantum well waveguides Appl. Phys. Lett. 50(16), Apr. 1987 pp. 1098-1100.
Waveguide-Type Optical Modulator of GaAs Quantum Well Double Heterostructures Using Electric Field Effect on Excition Absorption J.J. of Applied Physics vol. 24, No. 6, Jun. 1985 L442-L444.
Ultrafast all-optical gate with subpicosecond ON and OFF Response time Appl. Phys. Let. 49(13), Sep. 1986 pp. 749-751.
Quantum well oscillators Appl. Phys. Lett. 45(12), Dec. 1984 pp. 1319-1321.
English Abstract of JP60-68330 Apr. 1985.

*Primary Examiner*—Jerome Jackson
*Attorney, Agent, or Firm*—Cushman, Darby & Cushman

[57] ABSTRACT

An object of the invention to vary a light absorption coefficient within wider limits in a light absorption control semiconductor device. The device includes at least three quantum wells Q1, Q2, Q3. The width of the respective quantum wells and barriers is set such that wave functions of electrons in the respective quantum wells interact in a resonance state where the quantized energy levels in either one of conduction and valence bands are matched. In addition, the width and material of the respective quantum wells are set so that one of the bands is brought into the resonance state where the quantized energy levels at the respective quantum wells are matched in a state where no electric field is applied or a state where a suitable electric field is applied in a direction perpendicular to the junctions. The light absorption is changed by controlling components of the electric field perpendicular to the junctions. Since only one band is brought into the resonance state, the light absorption coefficient can be made greater.

27 Claims, 42 Drawing Sheets

SEMICONDUCTOR DEVICE WITH QUANTUM WELL RESONANCE STATES

BACKGROUND OF THE INVENTION

1. Field of the Invention

This invention relates to a semiconductor device capable of controlling electrically a light absorption coefficient using a quantum well and, more particularly to a light absorption control semiconductor device for changing characteristics such as frequency modulation, intensity modulation, switching, and filtering a propagating light by controlling electrically the light absorption coefficient using the quantum well.

2. Description of the Related Art

There has been conventionally known a semiconductor device including quantum wells enclosed by energy barriers of junctions of different semiconductor materials (heterojunctions). By narrowing the width of this quantum well, quantized energy levels are formed at the quantum wells. There have been proposed a variety of devices taking advantage of the discreteness of the quantized energy levels. A resonant tunneling diode, a resonant tunneling transistor, and the like are known as examples of these devices. These devices take advantage of the fact that the quantized energy level is changed by applying an electric field in a direction perpendicular to the junction to thereby produce a resonant state which brings about a tunnel effect between two layers holding each barrier therebetween.

Further, concerning the light absorption characteristic, the light absorption under the influence of direct transition is being studied between the quantized energy level in a valence band and the quantized energy level in a conduction band using two quantum wells formed of the same material and having the same width (Appl. Phys. Lett. 50(16), 20 Apr. 1987, P1098). According to this reference, the energy of two quantum wells are the same in both the conduction and valence bands when the electric field is not applied thereto, thus realizing the resonance state where the wave functions of electrons interact.

However, in a state where the quantized energy levels at the two quantum wells match in the conduction and valence bands, these two quantum wells are equivalent to a single quantum well having width equal to a sum of the widths of the two quantum wells. The light absorption coefficient is not necessarily large in this state. The above reference analyzes the fact that light absorption is unlikely to occur since the electrons localize in one of the quantum wells when the electric field is applied to these two quantum wells, which are identically structured. However, this mechanism is not always clear.

On the other hand, there has been known a semiconductor device including a semiconductor layer having a function obtained by growing a compound semiconductor on a substrate by an epitaxy method, and then forming lower and upper electrode layers holding the semiconductor layer in parallel from opposite sides (in parallel with the substrate surface). For example, a light emitting diode, a laser diode, and a resonance tunnel diode are known as examples of these devices. In these semiconductor devices, the lower electrode layer is formed of a conductive compound semiconductor of a thickness of about 1 $\mu$m in which impurities of a concentration of $1 \times 10^{17}$ cm$^{-3}$ to $1 \times 10^{18}$ cm$^{-3}$ are included.

However, in these semiconductor devices, it is necessary to grown an epitaxial semiconductor layer having a device function on the lower electrode layer. This degrades the crystallinity of the conductive semiconductor layer in which the impurities are doped, and accordingly the important semiconductor layer having the device function formed on the doped layer by the epitaxy method exhibits poor crystallinity.

According to experiments conducted by the inventors of the present invention, in the case where a GaAs semiconductor layer has a device function on an n$^+$-GaAs layer having an impurity concentration of $3 \times 10^{18}$ cm$^{-3}$ and a thickness of about 1 $\mu$m and a multiple quantum well, it was found that the crystallinity of the multiple quantum well was poor based on the measured half value width of a photoluminescence spectrum. Since the crystallinity of the GaAs semiconductor layer having the device function is poor, the device characteristics are also poor.

The spectrum of the photoluminescence intensity of the n$^+$-GaAs layer is as shown in FIG. 11. Specifically, there are obtained peaks at 805 nm (indicated at a), 820 nm (indicated at b), and 832 nm (indicated at c). The peak c is an absorption peak due to the transition of carriers between a donor level and an acceptor level; the peak b is an absorption peak due to the direct transition of carriers between the bottom of the conduction band and the top of the valence band; and the peak a is an absorption peak due to the transition of carriers between a higher position in the conduction band and the valence band resulting from an improvement in a Fermi level caused by the doping of the high concentration impurities. It is not desirable that the light absorption occurs in the band shorter than 800 nm when the light absorption control device is constructed using the multiple quantum well of the present invention to be described later.

SUMMARY OF THE INVENTION

The invention solves the above problems, and an object thereof is to realize a highly efficient light absorption control device.

Another object of the invention is to improve the crystallinity of a functional semiconductor layer.

Still another object of the invention is to provide a semiconductor device which can be used as a light modulator for use in an optically integrated circuit, as a variable wavelength semiconductor laser, or the like as will be clear from the specific examples of the invention to be described later.

In order to solve the aforementioned problems, a first mode of the invention is directed to a semiconductor device including a quantum well which is formed by a junction of different types of semiconductors having different band gaps and has a quantized energy level enclosed by energy barriers comprising at least three quantum wells, the width of the respective quantum wells and barriers being set such that wave functions of electrons in the respective quantum wells interact in a resonance state where the quantized energy levels in either one of the conduction and valence bands are matched, the width and material of the respective quantum wells being set so that one of the bands is brought into the resonance state where the quantized energy levels at the respective quantum wells are matched in a state where no electric field is applied or in a state where a suitable electric field is applied in a direction perpendicular to the junction, and the light absorption characteristic being changed by controlling components of the electric field perpendicular to the junction.

A second mode of the invention is directed to a semiconductor device including a semiconductor layer having a device function formed on a substrate through the epitaxy method, lower and upper layers (first and second electrodes) formed to hold the semiconductor layer therebetween in parallel from opposite sides and to apply an electric field perpendicularly to the semiconductor layer, characterized by a first semi-insulating layer formed by growing undoped semi-insulating compound semiconductor on the substrate through the epitaxy method, a conductive δ doped layer of a thickness of about one atom formed by doping impurity atoms sparsely on a surface of the first semi-insulating layer, and a second semi-insulating layer formed by growing undoped semi-insulating compound semiconductor on the δ doped layer through the epitaxy method, and the δ doped layer being used as the second electrode.

In the first mode of the semiconductor device according to the invention, when the respective quantum wells are formed of the same material in the device including at least three quantum wells, the quantized energy levels formed at the respective quantum wells change according to the width of the quantum wells. Accordingly, by designing the width of the three quantum wells properly, the quantized energy levels at the respective quantum wells are not equalized, but rather they are increased or decreased according to an arrangement order wherein the quantum wells whose quantized energy levels are closest are arranged in the state where no electric field is applied. When the electric field is applied perpendicularly to the junction, the close quantized energy levels at the respective quantum wells can be brought to the same level. When the quantized energy levels of the quantum wells are at the same level in the presence of the electric field and the wave functions of electrons mutually overlap at the three quantum wells, the three quantized energy levels are separated by a minute energy difference and bring about a state where the three quantum wells are connected continuously. This state is referred to as a resonance state. The light absorption coefficient can be increased remarkably by bringing only one band, e.g. the conduction band, into the resonance state while holding the valence band in a non-resonance state. At this time, light absorption occurs under the influence of direct transitions between a quantized energy level in the valence band at the respective quantum wells (levels mainly contributing to the light absorption are base levels) and three quantized energy levels in the conduction band in the resonance state.

The quantized energy levels formed at the respective quantum wells can be changed according to the material forming the quantum wells. Accordingly, the resonance state may be generated in only one band when the suitable electric field is applied, by changing the materials forming the respective quantum wells instead of changing the width of the quantum wells. Further, the resonance state may be generated in only one band when the suitable electric field is applied by changing the width and materials of the quantum wells.

In the case where the materials of the quantum wells are changed, the resonance state may be set in only one band where no electric field is applied.

The resonance state may be changed to the non-resonance state by changing the applied electric field or by applying an electric field where the resonance state is generated in the absence of an electric field.

In this way, the light absorption coefficient and the absorption wavelength can be varied by controlling the electric field acting in the direction perpendicular to the junction.

Thus, the invention pertains to a semiconductor device including at least three quantum wells whose width is determined together with the width of the barriers such that the wave functions of electrons at the respective quantized energy wells interact in the resonance state, and which generate the resonance state where the quantized energy levels at the respective quantum wells are continuous and which generate the non-resonance state in only one band by controlling components of the electric field acting in the direction perpendicular to the junction so as to control the light absorption.

Therefore, there can be obtained a characteristic of changing the light absorption greatly according to a change in the electric field, which enables the control of the absorption coefficient and absorption wavelength by means of an electric field.

On the other hand, in the second mode, the first semi-insulating layer formed on the substrate through the epitaxy method is semi-insulating undoped compound semiconductor. Being undoped (free from impurities), the crystallinity of the first semi-insulating layer is preserved. On the first semi-insulating layer is formed the conductive δ doped layer of the thickness of one atom which is obtained by doping the impurity atoms sparsely. On the δ doped layer is further formed the second semi-insulating layer obtained by growing the undoped compound semiconductor through the epitaxy method. At this time, since the impurity atoms are sparsely doped on the planar surface in the thickness of one atom in the δ doped layer, the crystallinity of the lower located first semi-insulating layer is not destroyed. Since the regularity of crystal lattices of the lower located first semi-insulating layer is found on the surface of the δ doped layer, the second semi-insulating layer grown on the δ doped layer through the epitaxy is allowed to have exceedingly high crystallinity succeeding the regularity of crystal lattices of the first semi-insulating layer. Thus, the crystallinity of the functional semiconductor layer formed on the second semi-insulating layer is highly satisfactory. Particularly, in the case where the functional semiconductor layer is constituted by a multiple quantum well, a semiconductor layer of exceedingly high quality is obtained. Further, being conductive, the δ doped layer is allowed to function as an electrode layer for the functional semiconductor layer by etching the semiconductor layer formed thereon to form a window to thereby provide a lead.

The invention is characterized in that the first semi-insulating layer is formed on the substrate by growing the undoped compound semiconductor through the epitaxy method, the δ doped layer is formed on the first semi-insulating layer by doping the impurity atoms sparsely in the thickness of one atom, the second semi-insulating layer is formed on the δ doped layer by growing the undoped compound semiconductor through the epitaxy method, the functional semiconductor layer is formed on the second semi-insulating layer through the epitaxy method, and the δ doped layer is used as an electrode layer.

Since the δ doped layer is used as the electrode layer, the semiconductor layer formed thereon is not influenced by the impurity atoms and can be grown through the epitaxy method while maintaining the high crystallinity. As a result, good crystallinity can be obtained despite the presence of the conductive layer between the semiconductor layers, thereby improving a device characteristic of the semiconductor device.

DETAILED DESCRIPTION OF THE PREFERRED EMBODIMENTS

Hereafter, specific examples according to the invention will be described with reference to the accompanying drawings.

First Embodiment

Figure 1:
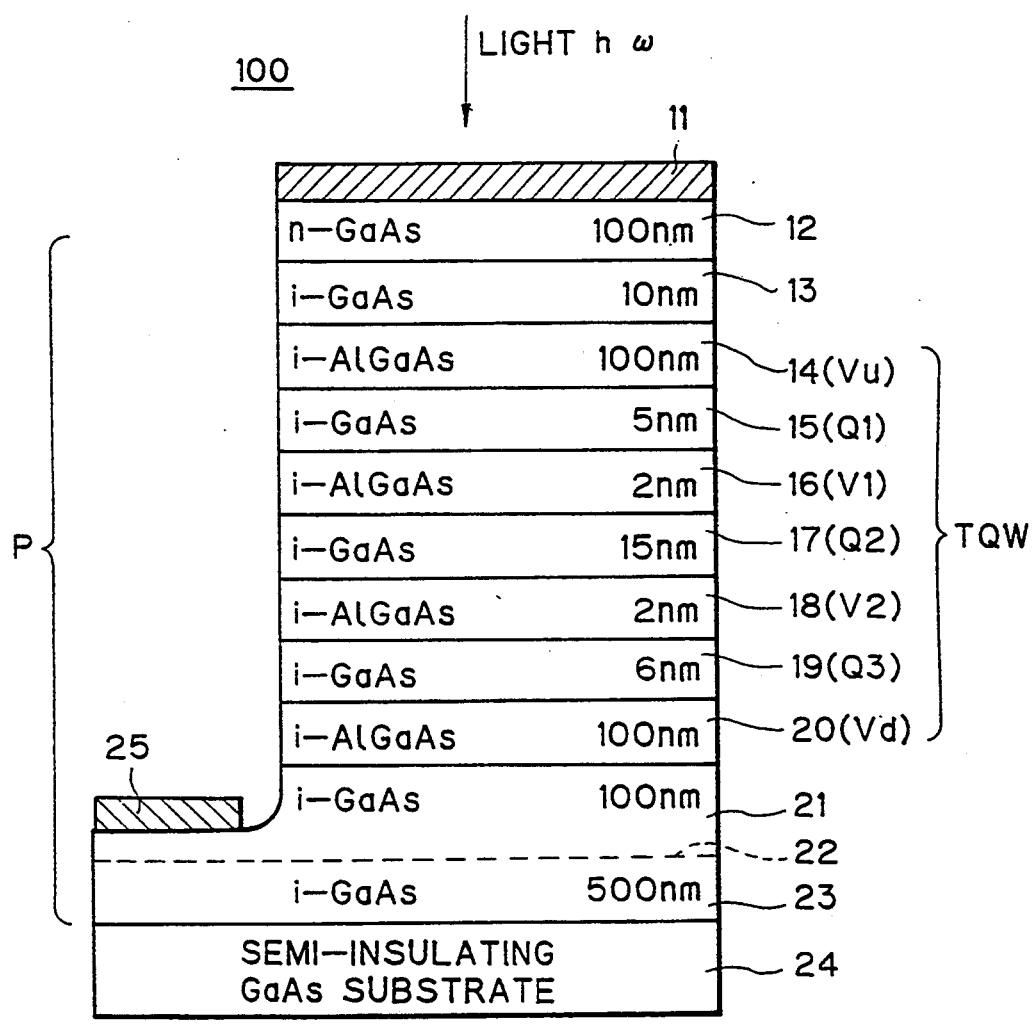
FIG. 1 is a diagram showing the construction of a light absorption control semiconductor device pertaining to a first embodiment showing a specific example of a first mode of the invention.

FIG. 1 is a sectional view showing the construction of a semiconductor device pertaining to an embodiment of a first mode of the invention. An illustrated semiconductor device 100 is formed by a junction of different types of semiconductors having different band gaps and includes quantum wells having a quantized energy level enclosed by energy barriers. The semiconductor device 100 includes at least three quantum wells Q1, Q2, Q3. The widths of the respective quantum wells and barriers are set such that wave functions of electrons in the respective quantum wells interact in a resonance state where the quantized energy levels of either one of conduction and valence bands are matched. In addition, the width and material of the respective quantum wells are set so that one of the bands is brought into the resonance state where the quantized energy levels at the respective quantum wells are matched in at least one state selected from a state where no electric field is applied and in a state where a suitable electric field is applied in a direction perpendicular to the junction. The illustrated semiconductor device 100 is a light absorption control semiconductor device using the quantum wells constructed so that the light absorption is changed by controlling components of the electric field perpendicular to the junction.

More specifically, on a semi-insulating GaAs substrate 24 is grown a first unit epitaxial GaAs semiconductor layer having a thickness of 500 nm and in which no impurity is doped (hereinafter referred to as "i-GaAs") through the epitaxy method, thereby forming an i-GaAs layer 23 which is a first unit semiconductor layer. Thereafter, the crystal growth is interrupted and Si is doped in the surface density of $1 \times 10^{12} \text{cm}^{-2}$ to form a δ doped layer 22 which is a second unit semiconductor layer. The i-GaAs is grown again to a thickness of 100 nm to form an i-GaAs layer 21 which is a third unit semiconductor layer. Then, i-AlGaAs (Al composition ratio=0.3) is grown to a thickness of 100 nm to form an i-AlGaAs layer 20 which is a fourth unit semiconductor layer.

Hereafter, illustrated unit semiconductor layers 19 to 12 are formed one after another. Specifically, i-GaAs, i-AlGaAs, i-GaAs, i-AlGaAs, and i-GaAs are grown in this order respectively to thicknesses of 6 nm, 2 nm, 15 nm, 2 nm, and 5 nm to thereby form an i-GaAs layer 19, an i-AlGaAs layer 18, an i-GaAs layer 17, an i-AlGaAs layer 16, and an iGaAs layer 15. Next, i-AlGaAs is grown to a thickness of 100 nm to thereby form an i-AlGaAs layer 14.

Layers 20 to 14 form a triple quantum well structure TQW which is an example of a multiple quantum well. The i-GaAs layer 15 is a first quantum well Q1; the i-GaAs layer 17 is a second quantum well Q2; and the i-GaAs layer 19 is a third quantum well Q3. The i-AlGaAs layers 14, 20 are potential barriers Vu, Vd at opposite ends. The i-AlGaAs layers 16, 18 are intermediate potential barriers V1, V2 for separating the respective quantum wells.

Thereafter, on the i-AlGaAs layer 14 are grown i-GaAs and n-GaAs respectively to thicknesses of 10 nm and 100 nm to thereby form an i-GaAs layer 13 and an n-GaAs layer 12. In this way, an epitaxial film structure is completed. Next, in a region of the epitaxial film, the unit semiconductor layers 12 to 20 and and a portion of the semiconductor layer 21 are removed by etching to expose the i-GaAs layer 21 on the doped layer 22. In the exposed area is formed a double layer structure of AuGe alloy and Au (50 nm, 200 nm respectively) by vacuum deposition. An alloying process is applied to the thus formed structure in a hydrogen and nitrogen atmosphere at a temperature of 400 degrees for 2 minutes to obtain an electrode 25 having an ohmic contact. Further, on the n-GaAs layer 12, namely, the uppermost unit semiconductor layer, an Au layer of a thickness of 20 nm if formed to obtain a semi-transparent electrode 11 which is a first electrode. By holding this semi-transparent electrode 11 at a positive potential relative to the second electrode 25, an electrode field can be applied in a direction perpendicular to the junction of the triple quantum well TQW.

The δ doped layer 22 is formed by sparsely accumulating a layer of silicon atoms on the i-GaAs layer 23. Thus, the δ doped layer 22 acts as an electrode for applying an electric field uniformly to the surfaces of the three quantum wells. In addition, since the δ doped layer 22 does not disorder the lattice of the lower located i-Gas layer 23, the layers 21 to 12 formed thereon are allowed to have the good crystallinity.

As is clear from the construction of the above semiconductor device, a semiconductor device in a first mode of the invention is characterized in that the multiple quantum well TQW including at least three quantum wells is formed on the specified substrate 24 through the epitaxy method as a functional semiconductor layer P.

In order to apply the electric field in the direction normal to the layer forming direction of the functional semiconductor layer P, there are provided the first electrode 11, i.e., the semi-transparent electrode 11, which is formed in contact with the surface of the unit semiconductor layer 12 located most outward from the substrate over a multitude of layers 12 to 23 constituting the functional semiconductor layer P, and the second electrode 25 which is formed at least partially in contact with the unit semiconductor layer 21.

The semiconductor device 100 in the above specific example causes a light to be incident upon the triple quantum well TQW to which a bias voltage is applied between the semi-transparent electrode (first electrode) 11 and the second electrode 25 perpendicularly from the side of the electrode 11, and changes the absorption of the incident light in the triple quantum well TQW by changing the bias voltage.

There will next be described a light absorbing mechanism by the semiconductor device 100.

Figure 2:
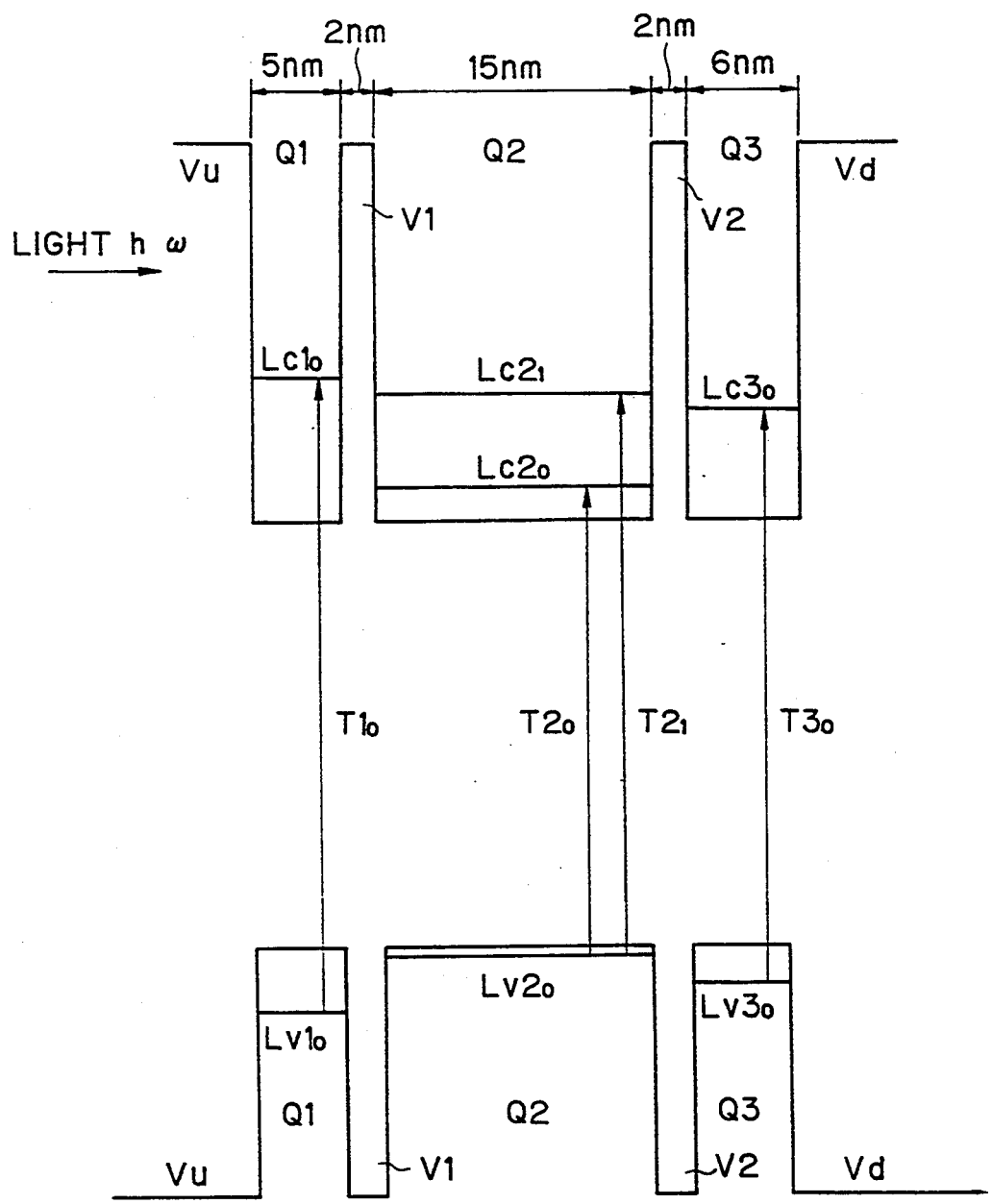
FIG. 2 is a diagram showing the structure of energy bands when no electric field is applied to the device.

FIG. 2 is a diagram showing energy bands in a state where no electric field is applied to the triple quantum well TQW.

In each of the conduction and valence bands are formed the potential barriers Vu, V1, V2, Vd including the AlGaAs layers 14, 16, 18, 20, and the first, second, and third quantum wells Q1, Q2, Q3 including the GaAs layers 15, 17, 19.

There are formed a ground state quantized energy level $Lc1_o$ corresponding to the thickness of 5 nm in the conduction band at the first quantum well Q1; a ground state quantized energy level $Lc2_o$ corresponding to the thickness of 15 nm and a first excited state energy level $Lc2_1$ in the conduction band at the second quantum well Q2; and a ground state energy level $Lc3_0$ corresponding to the thickness of 6 nm in the conduction band at the third quantum well Q3.

Further, there are formed a ground state quantized energy level $Lv1_o$ corresponding to the thickness of 5 nm in the valence band at the first quantum well Q1; a ground state quantized energy level $Lv2_o$ corresponding to the thickness of 15 nm in the valence band at the second quantum well Q2; and a ground state quantized energy level $Lv3_o$ corresponding to the thickness of 6 nm in the valence band at the third quantum well Q3. Other excited state energy levels are not illustrated since they are not controlled by the light absorption.

In this way, electrons are confined at certain discrete levels at the quantum wells when the widths of the wells are narrowed.

In this state, the quantized energy levels are not at the same levels (not continuous) in the conduction band at the three quantum wells Q1, Q2, Q3. Accordingly, the electrons cannot drift through the intermediate barriers V1, V2 between the respective quantum wells. In other words, the light absorption occurs under the influence of direct transitions between the quantized energy level $Lv1_0$ of the valence band and the quantized energy level $Lc1_0$ of the conduction band at the first quantum well Q1, between the quantized energy level $Lv2_0$ of the valence band and the quantized energy level $Lc1_0$ of the conduction band at the second quantum well Q2, and between the quantized energy level $Lv3_0$ of the valence band and the quantized energy level $Lc3_0$ of the conduction band in the third quantum well Q3.

More specifically, the three quantum wells Q1, Q2, Q3 do not interact, and the electrons transit from the valence band to the conduction band at the individual quantum wells upon the incidence of light having energy between the quantized energy levels in the valence and conduction bands at the respective quantum wells. Thus, the light absorption coefficient is small in this state.

Figure 4A:
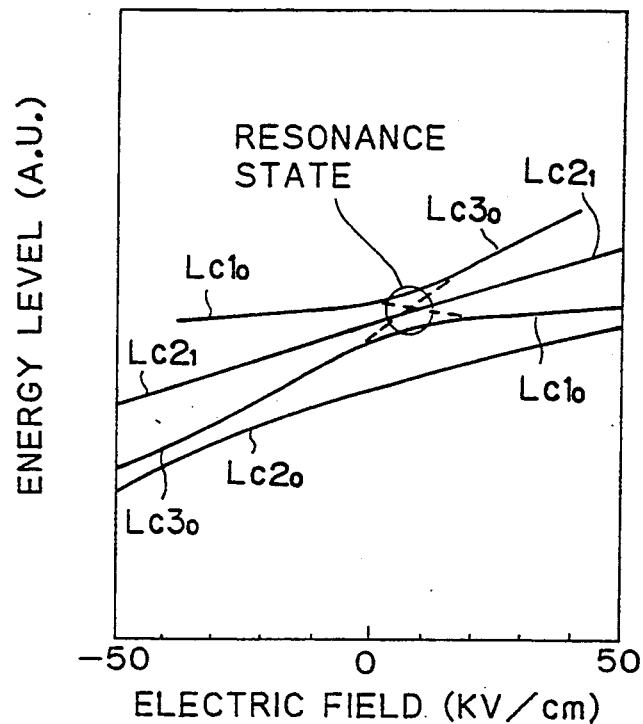
FIGS. 4A and 4B are graphs showing the transition of a quantized energy level in response to the intensity of the electric field obtained based on theory, FIG. 4A showing the dependence on the electric field of an energy level in a conduction band and FIG. 4B showing the dependence on the electric field of the energy level in a valence band.
Figure 4B:
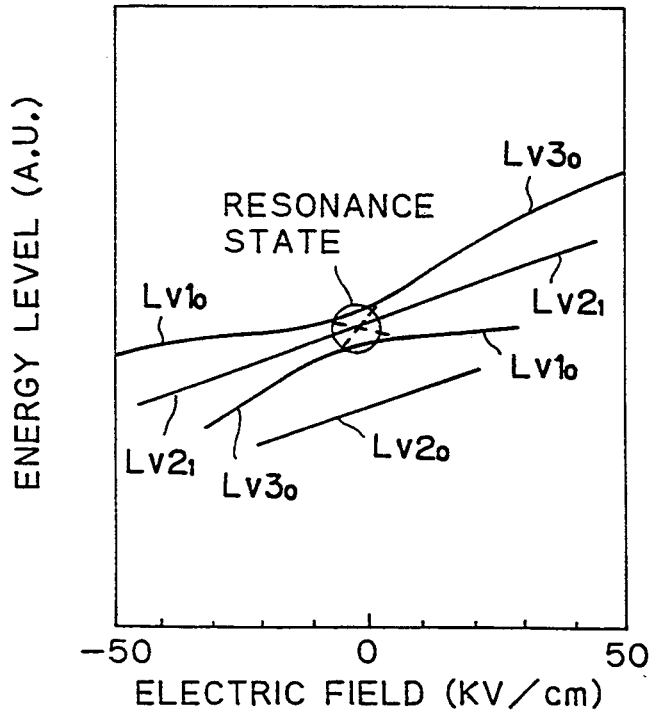

However, when the bias voltage is applied perpendicularly to the junction surface, an electric field is generated which equalizes the ground state energy level $Lc1_0$, the first excited energy level $Lc2_1$, and the ground state energy level $Lc3_0$ in the conduction band at the respective quantum wells Q1, Q2, Q3 as shown in FIG. 4A. To say that in the opposite way, the widths of the respective quantum wells Q1, Q2, Q3 are designed such that three quantized energy levels match at the same level in response to a certain value of the electric field. At this time, as shown in FIG. 4B, the quantized energy levels do not match in the valence band with the electric field where the quantized energy levels are matched in the conduction band. When a negative electric field is applied, the quantized energy levels match in the valence band at the three quantum wells. If the quantized energy levels at the respective quantum wells are matched in the conduction band in this way, wave functions of the electrons at the quantum wells interact and accordingly the electrons are permitted to exist at the quantized energy level of a desired quantum well through the intermediate barriers V1, V2. In the case of three quantum wells, there exist three separate levels E1, E2, E3 which differ by a minute energy difference in this state (the degeneracy is released and three separate levels exist).

Figure 3:
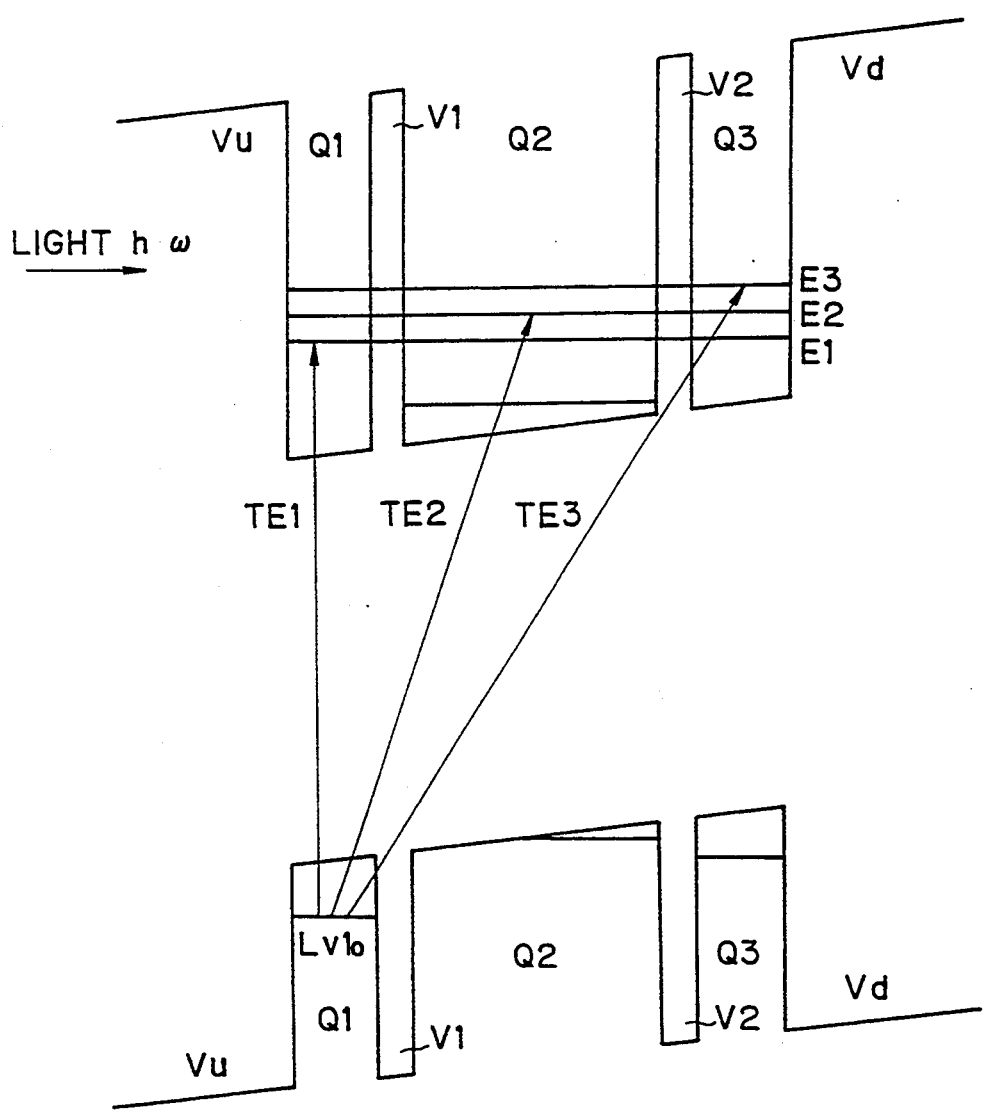
FIG. 3 is a diagram showing the structure of the energy bands when an electric field is applied to the device.

In this state, the light absorption occurs under the influence of the direct transitions TE1, TE2, TE3 between the ground state quantized energy level $Lv1_0$ in the valence band at the first quantum well Q1 and the quantized energy levels E1, E2, E3 commonly spread in the conduction band at the three quantum wells as shown in FIG. 3. Accordingly, the electrons are permitted to transit from the valence band to the quantized energy level of any quantum well in the conduction band by the light absorption. This state is referred to as a resonance state. In this resonance state, the light absorption coefficient becomes exceedingly large.

According to the observation of the inventors, the light absorption coefficient is improved about 100 times compared to a semiconductor device including two quantum wells formed of the same material and having the same width.

To be more precise, since the resonance conditions of the three quantized energy levels E1, E2, E3 differ slightly, it is difficult to observe three absorption spectra simultaneously and the wavelengths at the peaks of the absorption spectra change according to the intensity of the electric field. In other words, the electron transition which is the major controlling factor in the light absorption can be selected to be a desired one of the transitions TE1, TE2, TE3 by changing the intensity of the applied electric field slightly. Taking advantage of this characteristic, using a light source with a broad spectrum, the output light wavelength can be changed according to the intensity of the electric field. If a light of a single wavelength is to be controlled, the light absorption coefficient can be changed greatly according to the intensity of the electric field. Thus, the amplitude of the light can be modulated using the electric field as a modulation signal.

Figure 5:
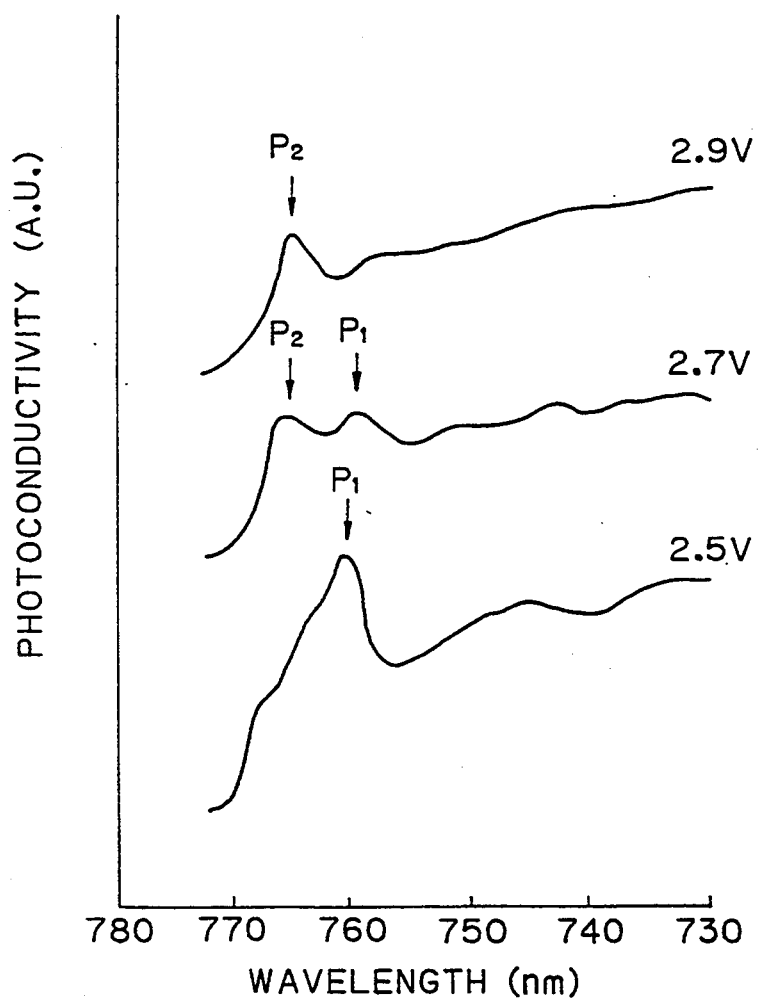
FIG. 5 is a graph showing measured photoconductivity in relation to the wavelength when the intensity of the applied electric field is changed in the device of the first embodiment.

FIG. 5 is a graph showing a characteristic of the photoconductivity based on the electrons excited by making the light incident upon the semiconductor device 100 of this embodiment, which characteristic is measured by changing the applied voltage and the wavelength of the incident light.

The light is incident upon the semitransparent electrode (first electrode) 11 and is transmitted through the quantum wells Q1, Q2, Q3. The bias voltage is changed from 2.5 V to 2.9 V. At 2.5 V, a photoconductivity peak P1 appears at 760 nm. At 2.9 V, the peak P1 disappears and a photoconductivity peak P2 appears at 765 nm. At an intermediate voltage of 2.7 V, both the peaks P1 and P2 are observed weakly.

As seen from the above, such an excellent characteristic was observed that the wavelength at the photoconductivity peak, i.e., the wavelength at the peak of the light absorption, could be controlled by changing the bias voltage by only 0.4 V. When the wavelength at a particular peak is taken note of, the light absorption coefficient can be controlled.

Second Embodiment

Figure 6:
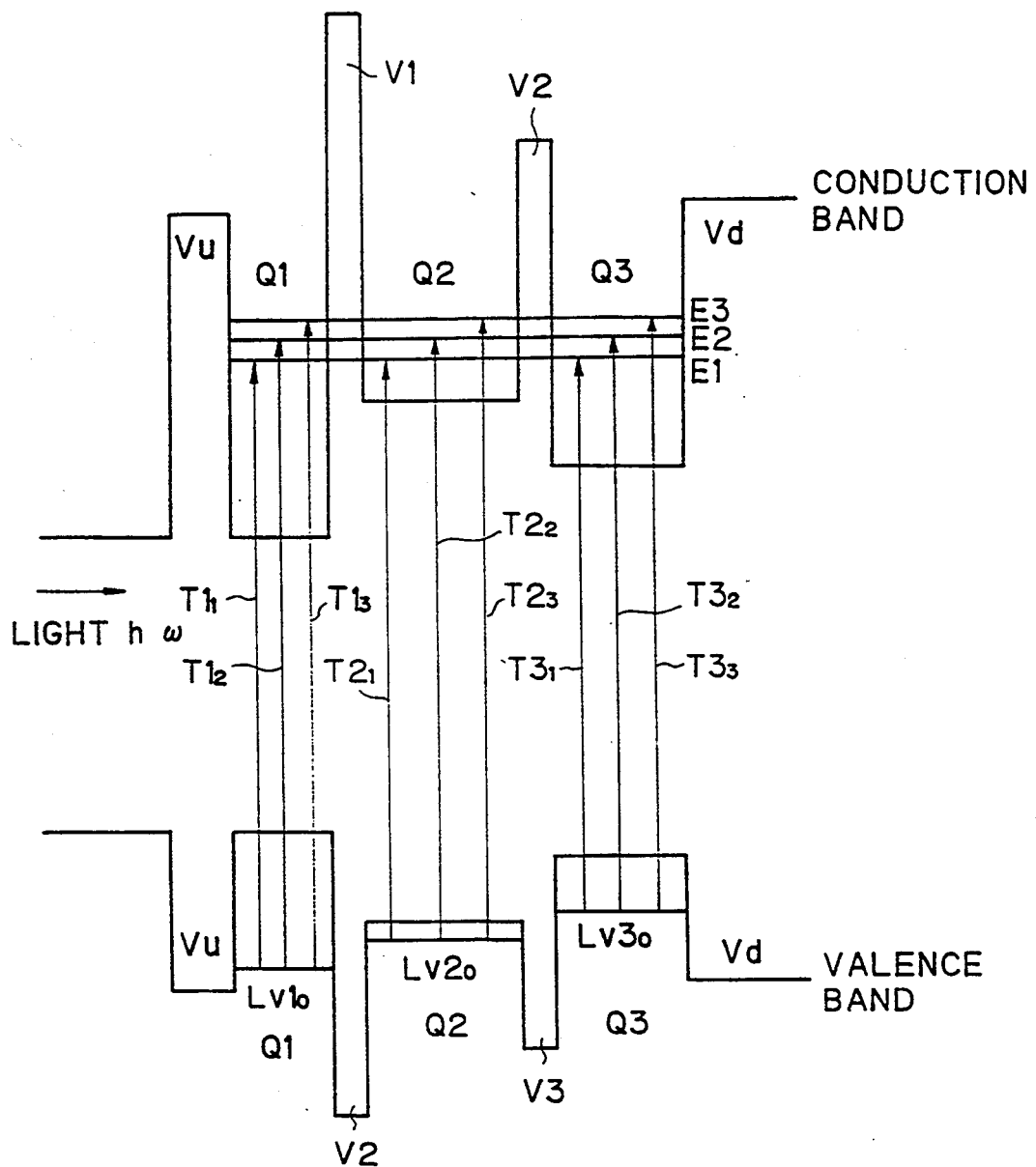
FIG. 6 is a diagram showing the structure of energy bands of a light absorption control semiconductor device pertaining to a second embodiment showing the first mode of the invention.

FIG. 6 is a diagram showing the structure of energy bands of a semiconductor device pertaining to a second embodiment showing the first mode of the invention. In the second embodiment, semiconductors formed of different materials are used for first, second and third quantum wells Q1, Q2, Q3. Specifically, the first well Q1 is formed of InGaAs; the second quantum well Q2 is formed of AlGaAs; the third quantum well Q3 is formed of GaAs; and barriers Vu, V1, V2, Vd are formed of AlGaAs having a large Al composition ratio. By regulating the width of the respective quantum wells Q1, Q2, Q3, ground state quantized energy levels coincide (match) only in a conduction band at the respective quantum wells in the absence of an electric field. The quantized energy levels do not coincide in a valence band. In this structure, the conduction bands of the three quantum wells can be brought into a resonance state in the state no electric field is applied. In the resonance state of the conduction band, the matched quantized energy levels are separated into three quantized energy levels E1, E2, E3 which differ by a minute energy, thereby releasing the degeneracy.

In this structure, the direct transitions of electrons by light absorption include: transitions $T1_1$, $T1_2$, $T1_3$ between a ground state quantized energy level $Lv1_o$ in the valence band at the first quantum well Q1 and the three quantized energy levels E1, E2, E3 commonly spread in the conduction band at the respective quantum wells; transitions $T2_1$, $T2_2$, $T2_3$ between a ground state quantized energy level $Lv2_o$ in the valence band at the second quantum well Q2 and the three quantized energy levels E1, E2, E3 commonly spread in the conduction band at the respective quantum wells; and transitions $T3_1$, $T3_2$, $T3_3$ between a ground state quantized energy level $Lv3_o$ in the valence band at the third quantum well Q3 and the three quantized energy levels E1, E2, E3 commonly spread in the conduction band at the respective quantum wells.

Accordingly, the light absorption occurs at three wavelengths corresponding to the transitions T1, T2, T3 from the different quantized energy levels in the valence band at the three quantum wells Q1, Q2, Q3. Thus, the peak wavelength and the absorption coefficient at the peak wavelength in the absorption characteristic having a single light absorption peak at a different wavelength for each quantum well can be changed by changing the intensity of the applied electric field. In other words, this device has three simultaneous absorption lines in a single structure and is capable of electrically switching between the three absorption lines which differ slightly from one another.

Third Embodiment

Figure 7:
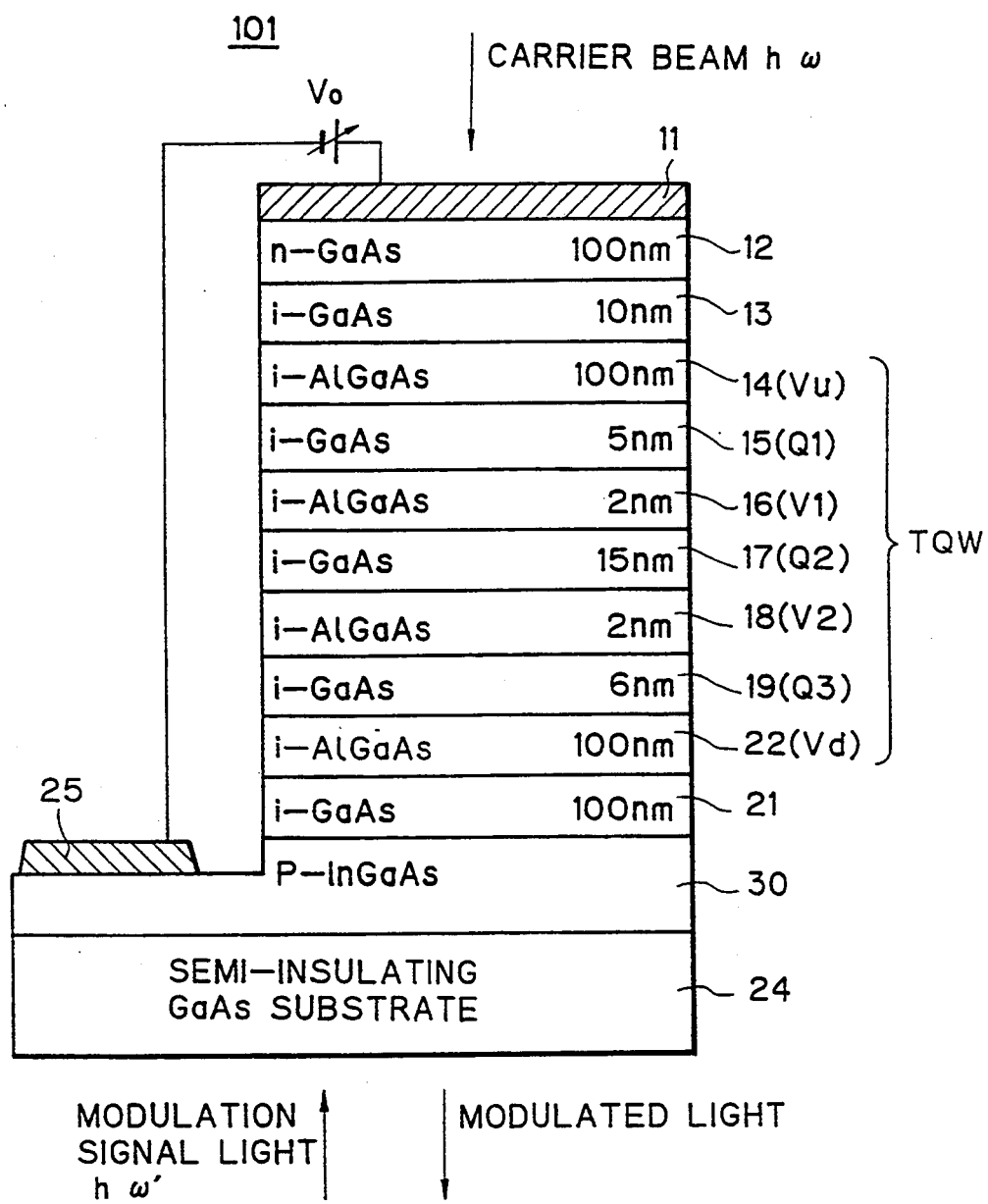
FIG. 7 is a diagram showing the structure of the light absorption control semiconductor device pertaining to the second embodiment.

FIG. 7 is a sectional view showing the structure of a semiconductor device 101 pertaining to a third embodiment showing another example of the first mode of the invention. The device 101 is applicable to a light-light modulator capable of varying the amplitude of a carrier beam according to the intensity of a modulated signal light. If the carrier beam is a light having a broad spectrum, the device 101 is applicable to a light-light modulator capable of modulating a wavelength (frequency) of the carrier beam according to the intensity of the modulated signal light.

The semiconductor device 101 of FIG. 7 is structured such that a p-InGaAs layer 30 is formed between the i-GaAs layer 21 of the triple quantum well structure TQW of FIG. 1 and the semi-insulating GaAs substrate 24. The carrier beam is incident upon a first electrode 11, modulated in the semiconductor device 101, and output from the GaAs substrate 24.

Figure 8:
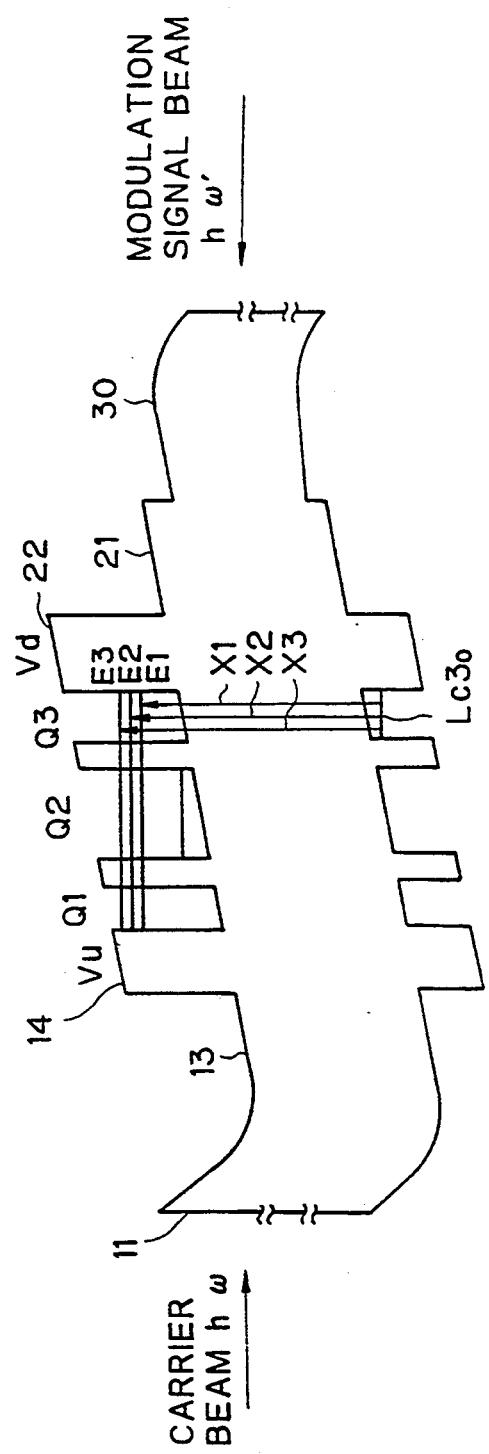
FIG. 8 is a diagram showing the structure of energy bands of a light absorption control semiconductor device pertaining to a third embodiment showing the first mode of the invention when a modulation signal light is not incident.

An absorbing mechanism of this device will be described with referenced to FIG. 8 showing a band structure. In this example, the conduction band is brought into a resonance state at a specified bias voltage $V_o$, and one of the transitions X1, X2, X3 is set to occur strongly.

Accordingly, a transmitting light of the carrier beam is a light having a small amplitude.

Figure 9:
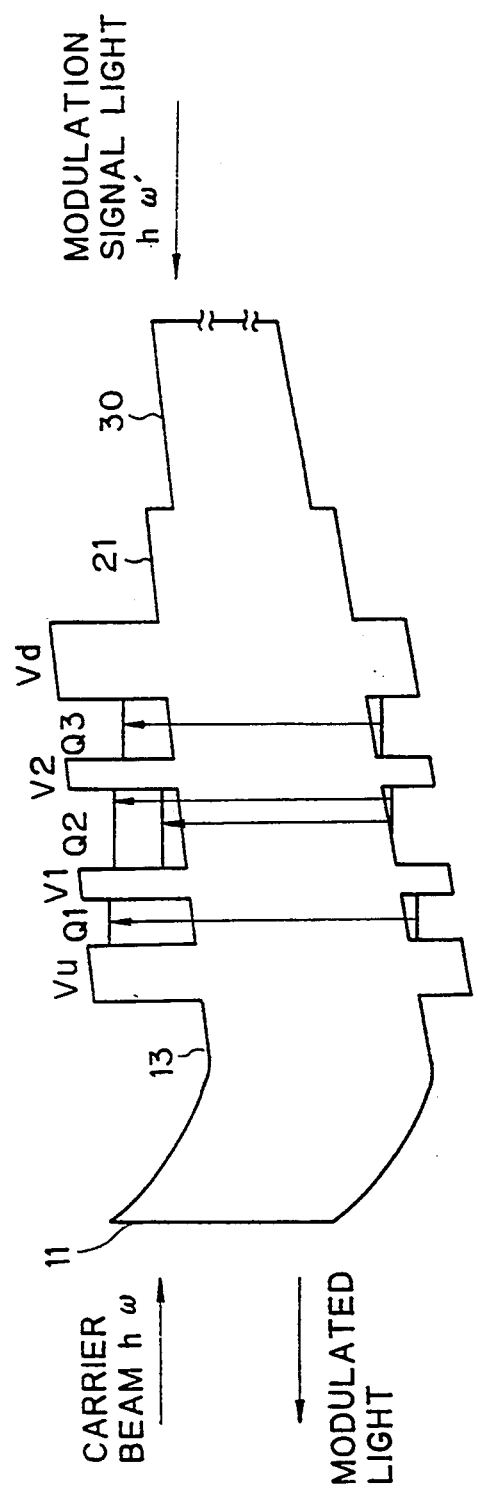
FIG. 9 is a diagram showing the structure of the energy bands of the light absorption control semiconductor device pertaining to the third embodiment when the modulation signal light is incident.

When the modulated signal light whose energy is smaller than a forbidden bandwidth of GaAs and larger than a forbidden bandwidth of InGaAs is made incident upon the GaAs substrate 24 from the outside, the modulated signal light is absorbed in the p-InGaAs layer 30 and holes are excited by the valence band. Thereby, an electric field is applied in such a direction as to hold the second electrode 25 at a positive potential relative to the first electrode 11. At his time, the band structure is as shown in FIG. 9. Accordingly, the resonance state cannot be maintained in the conduction band at the three quantum wells Q1, Q2, Q3, and the carrier beam cannot be absorbed in the quantum wells. As a result, the transmitting light becomes a light having a large amplitude.

In this way, the modulated signal light provides a light-light switching device for binary control of the intensity of the transmitting light of the carrier beam.

If the transitions X1, X2, X3 are selectively utilized while making an electromotive force generated by the modulated light smaller, a light-light amplitude modulator device is realized for carrying out amplitude modulation by the modulated signal light of the carrier light.

Further, if the light having a broad spectrum is used as a carrier beam, the wavelength of the absorption peaks in the quantum wells can be shifted by the selection of the transitions X1, X2, X3 by the modulated light, thereby changing the spectrum of the transmitting light of the carrier beam. Therefore, light-light frequency modulation and light-light frequency-shift keying (FSK) modulation can be carried out in analog and digital technologies respectively.

In all the foregoing embodiments, it is possible to increase a working temperature by narrowing the width of the three quantum wells and by using different semiconductor materials.

Next will be described a specific example of a semiconductor device pertaining to a second mode of the invention. An object of the second mode of the invention is to improve the crystallinity of the functional semiconductor layer P constituting the light absorption control device as mentioned in the description of the first mode, and accordingly the second mode is directed first mode, and accordingly the second mode is directed to a semiconductor device in which the δ doped layer serving as a second electrode is formed entirely in the interior of the unit semiconductor layer formed in contact with the substrate.

Fourth Embodiment

Figure 12:
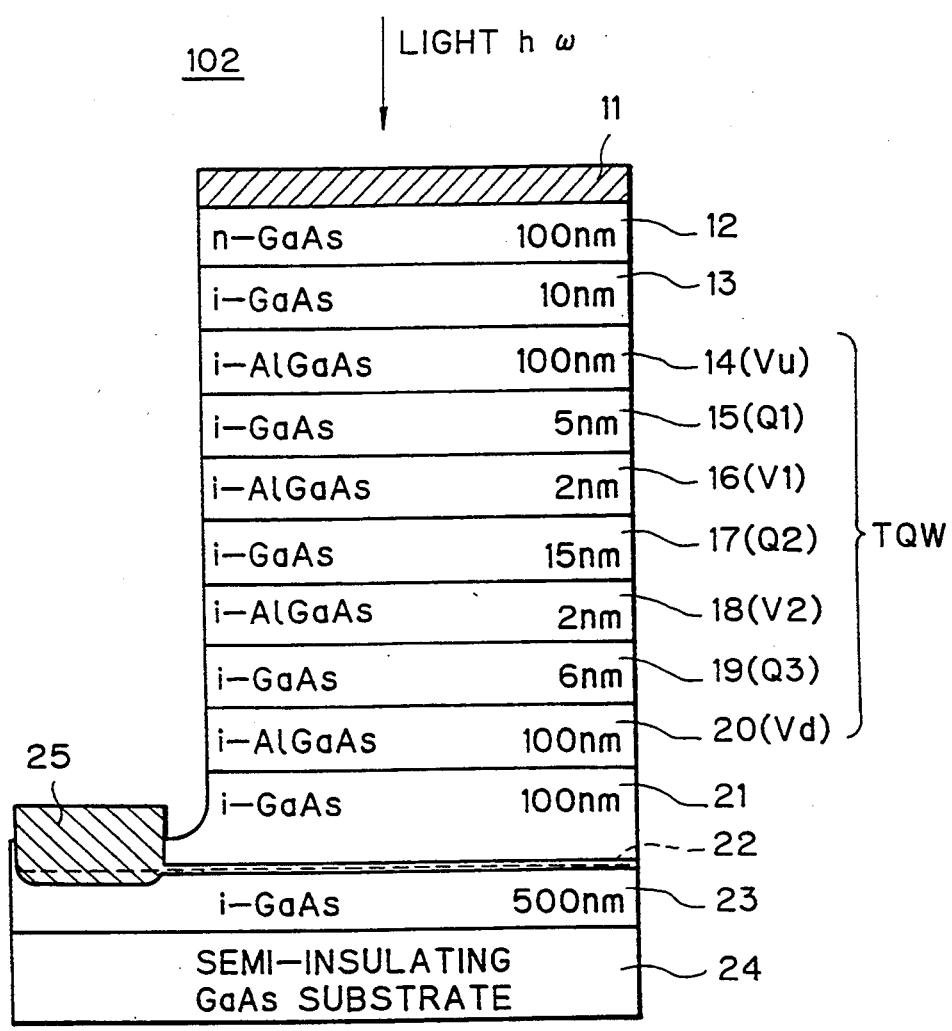
FIG. 12 is a diagram showing the structure of a light absorption control semiconductor device pertaining to a fourth embodiment showing a specific example of a second mode of the invention.

In this embodiment showing the second mode of the invention, a δ doped layer is applied to a light absorption control semiconductor device in which a functional semiconductor layer is used as an asymmetric triple quantum well. FIG. 12 is a sectional view showing the construction of this semiconductor device.

Specifically, the semiconductor device 102 in this specific example is characterized in that a unit semiconductor layer formed in contact with a substrate 24 incudes a first semi-insulating layer 23 formed by growing undoped semi-insulating compound semiconductor on the substrate 24 through the epitaxy method, a conductive δ doped layer 22 formed by sparsely doping impurity atoms on one main surface of the first semi-insulating layer 23 in the thickness of about one atom, and a second semi-insulating layer 21 formed by growing undoped semi-insulating compound semiconductor on one main surface of the δ doped layer 22 through the epitaxy method. The δ doped layer 22 is used as the second electrode 25.

Hereinafter, there will be described an exemplary method of fabricating the semiconductor device 102 in the above specific example.

First of all, GaAs in which no impurity is doped (hereinafter referred to as "i-GaAs") is grown to 500 nm on the semi-insulating GaAs substrate 24 through the epitaxy method using an MBE method to thereby form an i-GaAs layer (first semi-insulating layer) 23. Thereafter, the crystal growth is interrupted by closing a shutter for a Ga supply source while pressurizing As, and a shutter for a supply source of Si which is n-type dopant is opened and Si is doped sparsely on the surface to a thickness of about one atom at a surface density of $1 \times 10^{12}$ cm$^{-2}$ to thereby form the δ doped layer 22 constituting the second electrode layer. Then, the shutter for the Si supply source is closed while that for the Ga supply source is opened so as to grow the i-GaAs to a thickness of 100 nm to form an i-GaAs layer (second semi-insulating layer) 21. Thereafter, the i-AlGaAs (Al composition ratio=0.3) is grown to a thickness of 100 nm to thereby form an i-AlGaAs layer 20.

In the above example, it may be deemed that the first semi-insulating layer 23, the 6 doped layer 22, and the second semi-insulating layer 21 form a single unit semiconductor layer.

Thereafter, unit semiconductor layers 21 to 12 are formed in accordance with the procedure similar to the one described in the first embodiment. Next, in a region of the epitaxial film, the unit semiconductor layers 12 to 20 and a portion of the unit semiconductor layer 21 up to some depth are removed by etching to expose the i-GaAs layer 21 on the δ doped layer 22. In the exposed area is formed a double layer structure of AuGe alloy and Au (50 nm, 200 nm respectively) by vacuum deposition. An alloying process is applied to the thus formed structure in a hydrogen and nitrogen atmosphere at a temperature 400 degrees for 2 minutes to obtain an ohmic electrode 25 serving a second electrode in contact with the δ doped layer 22 by diffusing Ge. Further, on the n-GaAs layer 12, namely, the uppermost unit semiconductor layer, is formed an Au layer at a thickness of 20 nm to obtain a semi-transparent electrode 11 which is a first electrode. By holding this first semi-transparent electrode 11 at a positive potential relative to the second electrode 25, an electric field can be applied in a direction perpendicular to the junction of the triple quantum well TQW.

The δ doped layer 22 is formed by sparsely accumulating about a layer of silicon atoms on the i-GaAs layer 23. Thus, the δ doped layer 22 acts as an electrode for applying an electric field uniformly to the surfaces of the three quantum wells (TQW). In addition, since the δ doped layer 22 does not disorder the lattice of the lower i-GaAs layer 23, the layers 21 to 12 formed thereon are allowed to have high crystallinity since they succeeding grow the good crystallinity of the i-GaAs layer 23.

In the semiconductor device 102 in this specific example, the light is incident upon the first electrode 11 perpendicularly to the triple quantum well TQW to which a bias voltage is applied between the first semi-transparent electrode 11 and the second electrode 25, and the absorption of the incident light in the triple quantum well TQW is changed by changing the bias voltage.

In the case where the sheet carrier density of the δ doped layer 22 lies in the range of $1 \times 10^{11}$ to $3 \times 10^{13}$ cm$^{-2}$, a layer of Si may be doped sparsely.

A photoluminescence spectrum of the triple quantum well was measured. A spectrum having a half value width was obtained which is sufficiently narrower than that of the spectrum of the triple quantum well formed on the high concentration n+-layer of the thickness of 1 μm as in the prior art.

Figure 10:
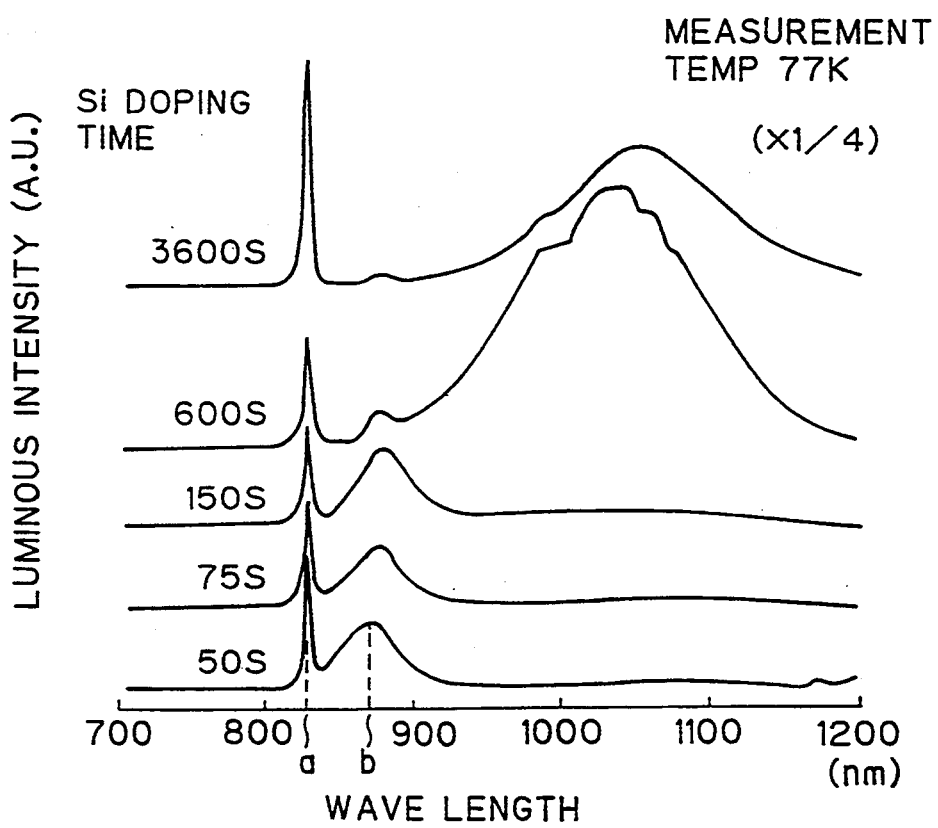
FIG. 10 is a graph showing measured photoluminescence spectra of an i-GaAs layer including a δ doped layer.
Figure 11:
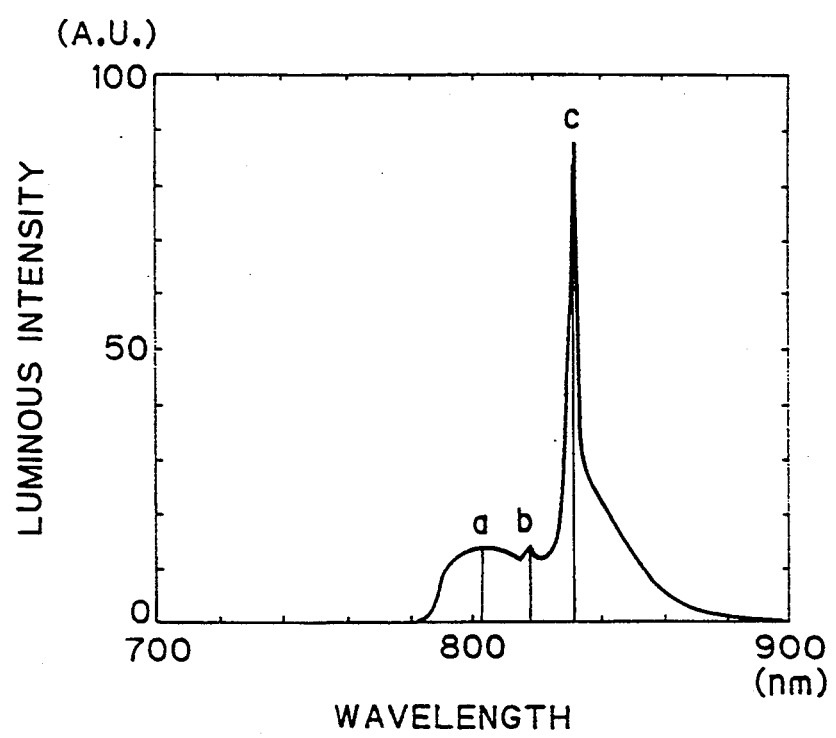
FIG. 11 is a graph showing measured photoluminescence spectra of an n+-GaAs layer used as a lower electrode layer in a semiconductor device of the prior art.

The inventors measured the photoluminescence spectrum in 77K of the δ doped layer 22 at the stage where the respective unit semiconductor layers, namely the i-GaAs layer 23, δ doped layer 22, and i-GaAs layer 21, are formed. At this time, the doping time for the silicon atoms forming the δ doped layer 22 is changed. The measurement results are shown in FIG. 10. Peaks are found in the vicinity of about 825 nm (indicated at a) and about 870 nm (indicated at b). The illustrated peak a is an absorption peak caused by the carrier transition between the bottom of the conduction band and the top of the valance band. No peak is found at the wavelength shorter than the wavelength at the absorption peak. This is significant since the light absorption control semiconductor device in this embodiment controls the light absorption coefficient in a narrower wavelength range than the wavelength at the peak a as is clear from the description made later.

Although the δ doping is applied to the devices in which a relatively small amount of current flows in the foregoing first to fourth embodiments, a multitude of i-GaAs layers and δ doped layers may be formed at intervals of about 1 nm to several tens of nm in the case of devices requiring a large amount of current such as laser diodes. In this case, it is possible to increase the current density without deteriorating the crystallinity.

There will be described a third mode of a semiconductor device according to the invention. As described above, the semiconductor device 100 according to the invention includes a semiconductor layer P having a light absorption controlling function. A resonance state changes according to the voltage level when the voltage is applied in a direction perpendicular to junction surfaces of a plurality of unit semiconductor layers constituting the semiconductor layer P. It has been pointed out that the semiconductor device can be used as a light modulator since the absorptivity changes as the resonance state changes.

Incidentally, there has been known a light modulator for use in an optical integrated circuit in which a waveguide path is formed on a LiNbO$_3$ substrate. There has been also proposed a light modulator taking advantage of an electric field effect in an exciton absorption in a structure wherein eight 8 nm GaAs layers and eight 5 nm AlGaAs layer are accumulated alternately (JJAP, Vol. 24, No. 6, 1985, pp. L442 to L444).

However, the light modulator having the waveguide path formed on the LiNbO$_3$ substrate suffers from the problem in that the size of the device becomes large since the modulator includes the device based on the geometric optical principle. Further, in the modulator taking advantage of the electric field effect in the exciton absorption, the suddenness is merely changed in the transition absorption characteristic between a donor level and an acceptor level. Accordingly, the modulation efficiency cannot be increased since the suddenness is not satisfactory. The modulator also suffers from the problem in that a working wavelength range is restricted to the vicinity of an absorption end.

In view of this, an object of the third mode of the invention is to realize a light absorption control semiconductor device which has a high efficiency and a sudden absorption characteristic by taking advantage of the light absorption based on a quite novel principle, i.e., a light absorption control semiconductor device having a high wavelength selectivity.

In order to solve the above problems, a semiconductor device according to the third mode of the invention is constructed so that a waveguide layer 112 for guiding the light is joined with a light absorption control semiconductor region A capable of changing a light absorption spectrum characteristic, and so that the light propagating in the waveguide layer 112 leaks into the light absorption control semiconductor region A. The region A is constructed similarly to the multiple quantum well in the first mode, and is formed by joining different types of semiconductors having different band gaps. The region A includes at least three quantum wells Q1, Q2, Q3 each having a quantized energy level enclosed by energy barriers. The width of the respective quantum wells and barriers are set such that wave functions of electrons in the respective quantum wells interact in a resonance state where the quantized energy levels of either one of conduction and valence bands are matched. In addition, the width and material of the respective quantum wells are set so that one of the bands is brought into the resonance state where the quantized energy levels in the respective quantum wells are matched in a state where no electric field is applied or a state where a suitable electric field is applied in a direction perpendicular to the junction. The semiconductor device 103 changes the light absorption by controlling components of the electric field perpendicular to the junction.

The semiconductor device 103 according to the third mode of the invention is constructed such that the waveguide layer 112 is joined with the light absorption control semiconductor region A and that the light beam propagating in the waveguide layer leaks to the light absorption control semiconductor region. The leaked light is absorbed by a specified absorption spectrum characteristic in the light absorption control semiconductor region. Thus, the light is subjected to a variety of modulations while propagating in the waveguide layer.

The light absorption control semiconductor region A acts similar to the one described in the semiconductor device according to the first mode. Accordingly, in the third mode of the invention, the semiconductor device is allowed to have a light absorption characteristic having a certain absorption peak by controlling the electric field acting in the direction perpendicular to the junction. Thus, the spectrum of the light beam changes since the light beam is subjected to the light absorption by the light absorption spectrum characteristic in the light absorption control semiconductor region while propagating in the waveguide layer. In other words, a variety of modulations and filterings can be realized by changing the spectrum of the light beam.

The third mode of the invention pertains to a semiconductor device including at least three quantum wells whose width is determined together with the width of barriers such that wave functions of electrons in the respective quantum wells interact in a resonance state, a light absorption control semiconductor region for generating a resonance state where quantized energy levels at the respective quantum wells are continuous and having a non-resonance state in only one of the bands by controlling components of an electric field acting in a direction perpendicular to a junction so as to control the light absorption, and a waveguide layer for guiding a light, the light absorption control semiconductor region being joined with the waveguide layer so that the light propagating in the waveguide layer leaks to the light absorption control semiconductor region.

Accordingly, the light absorption spectrum changes greatly in the light absorption control semiconductor region according to the change in the electric field. Thus, the spectrum of light can be changed by controlling the electric field. This change in the spectrum of the light permits realization of devices for carrying out the frequency modulation (wavelength modulation), intensity modulation, on-off switches, binary modulation of "0" and "1" FSK modulation, filtering, and the like. The modulation efficiency is high since almost no current flows in the quantum wells.

Fifth Embodiment

Figure 13:
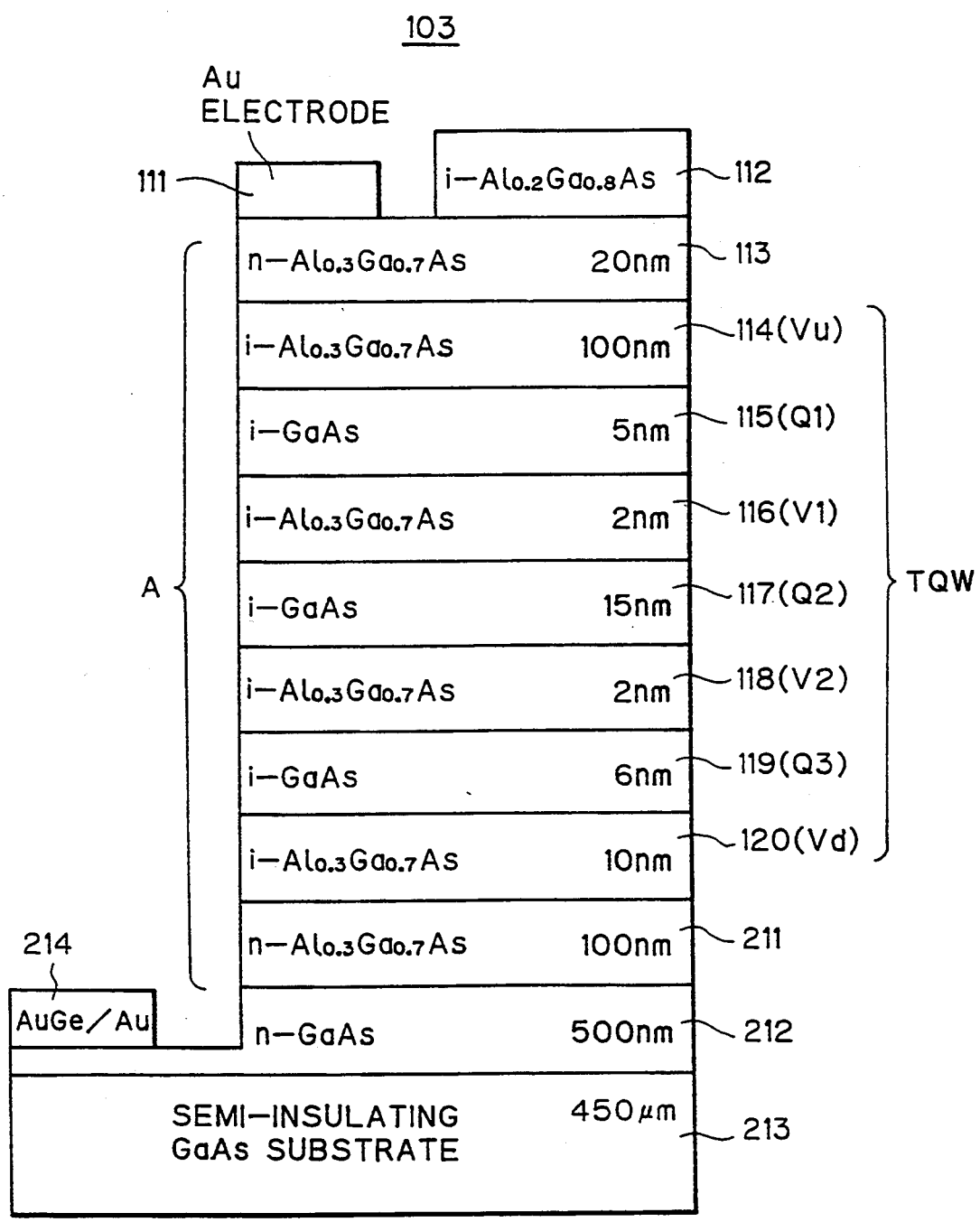
FIG. 13 is a diagram showing the structure of a light absorption control semiconductor device pertaining to a fifth embodiment showing a specific example of a third mode of the invention.
Figure 14:
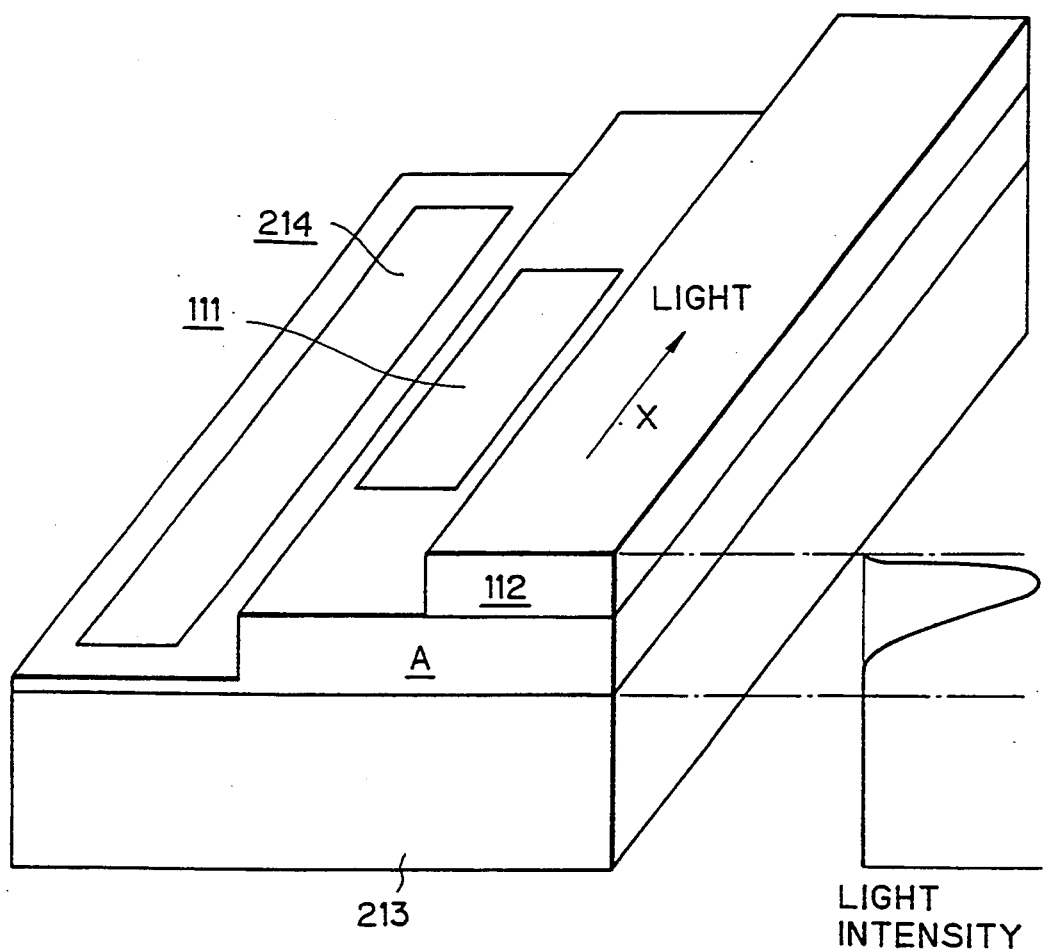
FIG. 14 is a perspective view showing a distribution of cross-sectional intensity of a light beam together with the light absorption control semiconductor device.

FIG. 13 is a sectional view showing the construction of the semiconductor device 103 pertaining to a fifth embodiment showing the third mode of the invention, and FIG. 14 is a perspective view of the device shown in FIG. 13.

On a 450 μm semi-insulating GaAs substrate 213 is formed a 500 nm n-GaAs layer 212 as an electrode layer through epitaxy using the MBE method. Thereafter, n-Al$_x$Ga$_{1-x}$As (x=0.3), i-Al$_x$Ga$_{1-x}$As, i-GaAs, i-Al$_x$Ga$_{1-x}$As, i-GaAs, i-Al$_x$Ga$_{1-x}$As, i-GaAs, i-Al$_x$Ga$_{1-x}$As, and n-Al$_x$Ga$_{1-x}$As are grown by 100 nm, 10 nm, 6 nm, 2 nm, 15 nm, 2 nm, 5 nm, 100 nm, 20 nm to thereby form an n-AlGaAs layer 211, an i-AlGaAs layer 120, an i-GaAs layer 119, an i-AlGaAs layer 118, an i-GaAs layer 117, an i-AlGaAs layer 116, an i-GaAs layer 115, an i-AlGaAs layer 114, and an n-AlGaAs layer 113 which are unit semiconductor layers respectively.

The light absorption control semiconductor region A including the plurality of unit semiconductor layers 120 to 113 constitutes a triple quantum well structure TQW. The i-GaAs layer 115 is a first quantum well Q1; the i-GaAs layer 117 is a second quantum well Q2; and the i-GaAs layer 119 is a third quantum well Q3. The i-

AlGaAs layers 114, 120 are potential barriers Vu, Vd at opposite ends. The i-AlGaAs layers 116, 118 are intermediate potential barriers V1, V2 for separating the respective quantum wells.

Thereafter, on the i-AlGaAs layer 113 are grown i-Al$_y$Ga$_{1-y}$As (y=0.2) to a thickness of 1 μm to thereby form an i-AlGaAs layer 112. This i-AlGaAs layer 112 functions as a waveguide layer. In this way, an epitaxial film structure is completed in which a light absorption control semiconductor region A (layers 213 to 113) is joined with the waveguide layer 112.

Then, the waveguide layer 112 is etched to expose a part of the n-AlGaAs layer 113 in the form of a strip, so that the width of the waveguide layer 112 is narrower than that of the light absorption control semiconductor region A. Further, the layers 113 to 212 are etched in the form of a strip so as to expose the n-GaAs layer 212. An Au layer and a double layer structure of AuGe alloy and Au (50 nm, 200 nm respectively) are formed on the exposed n-AlGaAs layer 113 and the exposed n-GaAs layer 212 by vacuum deposition. The alloying process is applied to the thus formed layers in a hydrogen and nitrogen atmosphere at a temperature of 400 degrees for 2 minutes to thereby obtain a first electrode 111 having an ohmic contact and a second electrode 214.

The light beam propagates in an X-axis direction in FIG. 14 in the waveguide layer 112. At this time, a distribution of cross-sectional intensity of the light beam is as shown in FIG. 14, and the light is leaked to the lower light absorption control semiconductor region A. The leaked light is absorbed in the light absorption control semiconductor region A, and is completely subjected to a desired modulation while the light beam is propagating in the waveguide layer 112 of the specified length.

Figure 15:
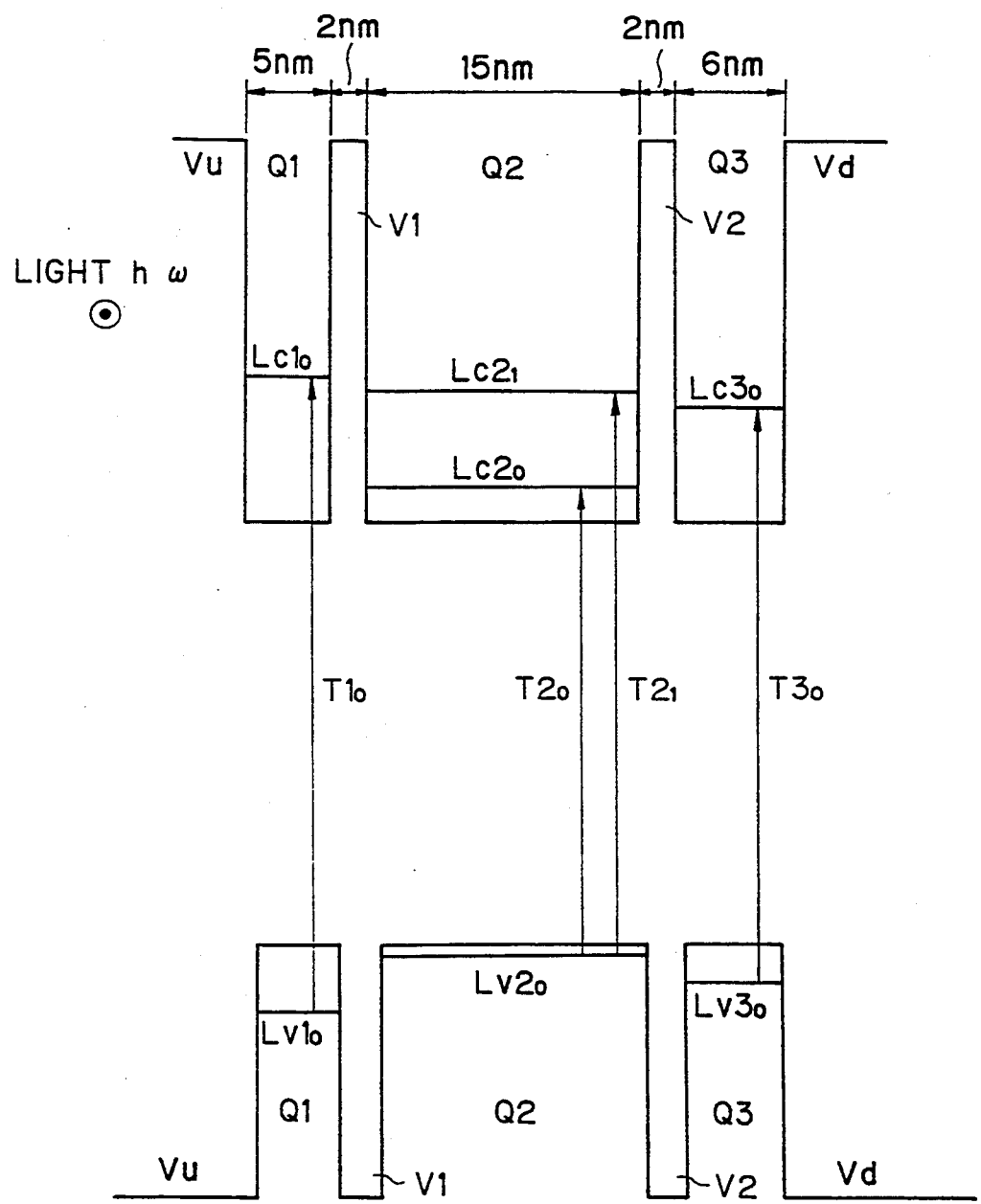
FIG. 15 is a diagram showing the structure of energy bands in a light absorption control semiconductor region of the device when no electric field is applied.

An operation of a light absorbing mechanism in the light absorption control semiconductor region A is shown in FIG. 15, but it is specifically identical to the contents described with reference to FIG. 2.

The operation of the semiconductor device 103 shown in FIG. 13 differs from that of the semiconductor device shown in FIG. 2 in that, upon the application of such a voltage as to hold the electrode 111 at a positive potential relative to the electrode 214, the n-GaAs layer 212 and the n-AlGaAs layer 113 function as electrode layers and an electric field is applied uniformly in a direction perpendicular to the junction surfaces of the triple quantum well TQW. Then, effects similar to the ones shown in FIGS. 4A and 4B are demonstrated.

Figure 16:
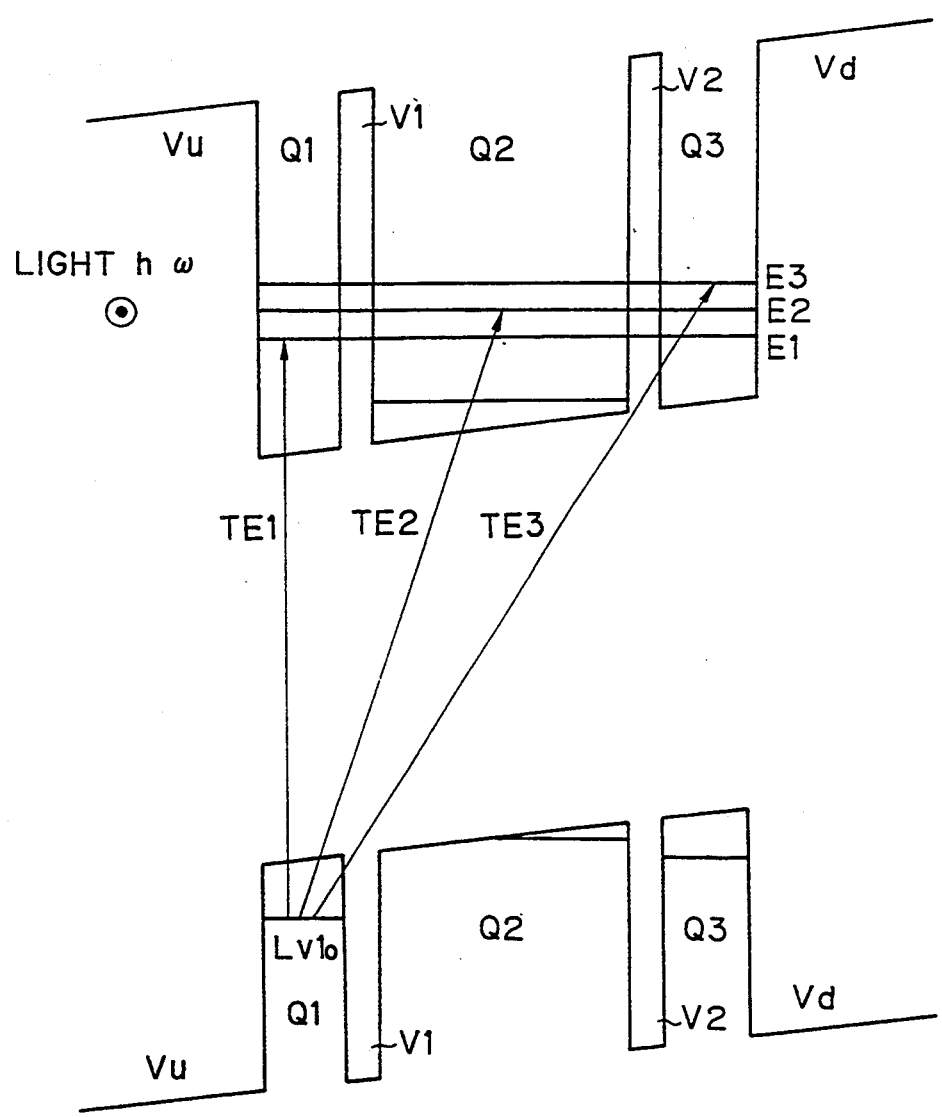
FIG. 16 is a diagram showing the structure of the energy bands in the light absorption control semiconductor region of the device when an electric field is applied.

The light absorption and the change in the resonance state in the third specific example according to the invention are shown in FIG. 16, but an operation thereof is similar to the one described with reference to FIG. 3.

FIG. 5 is a graph showing a characteristic of the photoconductivity based on the electrons excited by making the light incident upon the light absorption control semiconductor region A in the fifth embodiment showing the third mode, which characteristic is measured by changing the applied voltage and the wavelength of the incident light. Specifically, this graph shows a light absorption spectrum in the light absorption control semiconductor region A. The bias voltage is changed from 2.5 V to 2.9 V. At 2.5 V, a photoconductivity peak P1 appears at 760 nm. At 2.9 V, the peak P1 disappears and a photoconductivity peak P2 appears at 765 nm. At an intermediate voltage of 2.7 V, both the peaks P1 and P2 are observed weakly. In this way, such an excellent characteristic can be observed so that the wavelength at the photoconductivity peak, i.e., the wavelength at the peak of the light absorption, can be controlled by changing the bias voltage by only 0.4 V. When the wavelength at a particular peak is to be controlled, the light absorption coefficient can be controlled.

On the other hand, as will be understood from the distribution of the cross-sectional intensity of the propagating light shown in FIG. 14, a part of the propagating light leaks to the quantum wells Q3, Q2, Q1 in the light absorption control semiconductor region A having this light absorption characteristic. Accordingly, taking advantage of this light absorption characteristic, the wavelength components shown by the peak in FIG. 5 can be removed from the spectrum of the propagating light. The spectrum of the light transmitting through this filter region changes according to the voltage. This enables the modulation of changing the spectrum of the propagating light (filtering, frequency modulation, intensity modulation when a certain wavelength is taken note of). Particularly by suitably selecting the wavelength of the incident light, the semiconductor device is permitted to function as an optical switch device for switching between a transmitting state and a state where the light is completely absorbed and is not propagating.

In the case where the light absorption control semiconductor region is used as an optical switch device, the light can be modulated into binary states of "0" and "1". Further, the FSK modulation is enabled since the absorption peak wavelength shifts when the voltage is changed minutely.

Sixth Embodiment

Figure 17:
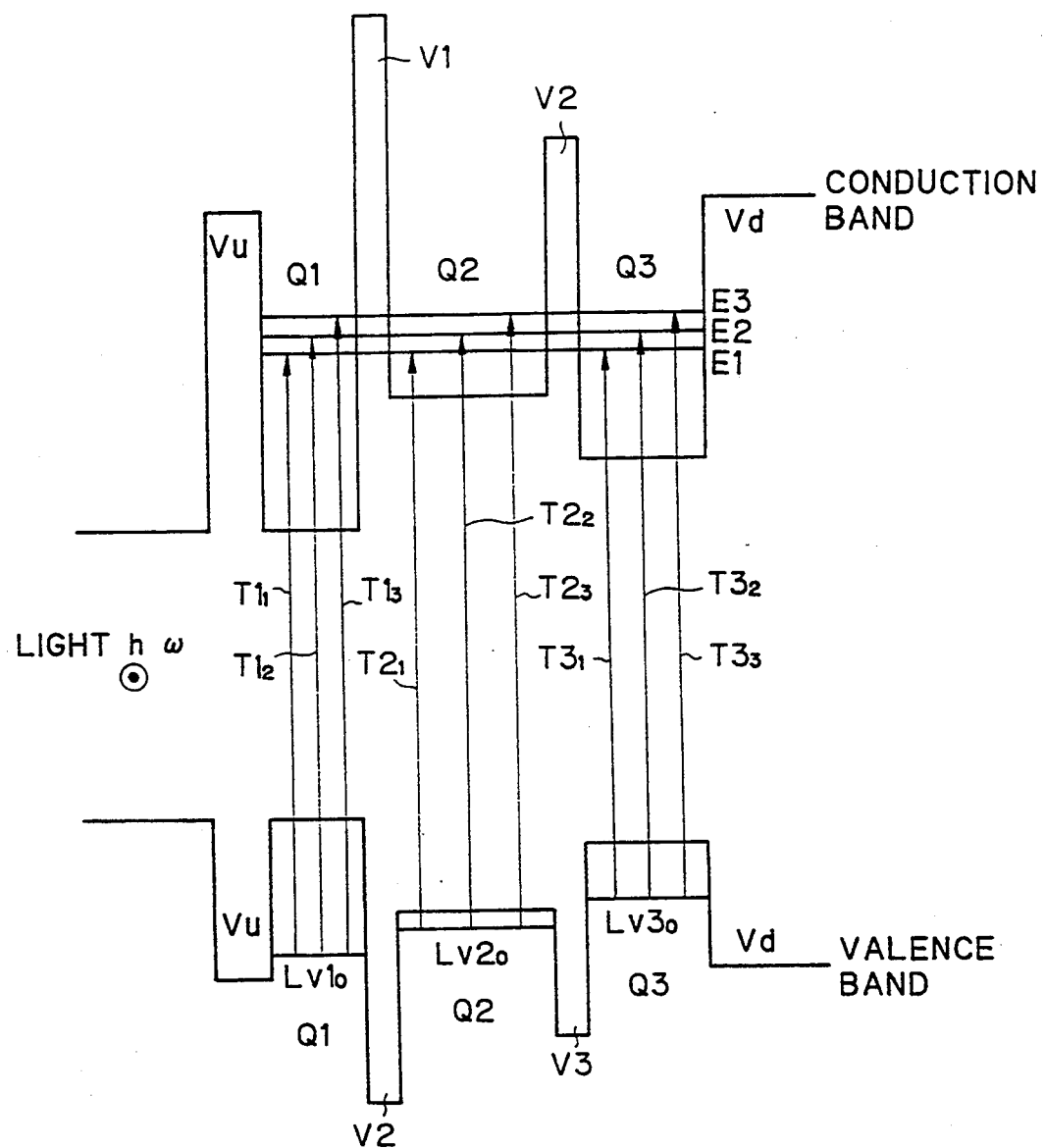
FIG. 17 is a diagram showing the structure of energy bands in a light absorption control semiconductor region of a device pertaining to a sixth embodiment showing another specific example of the third mode of the invention.

In a sixth embodiment showing the third mode of the invention, the construction of the light absorption control semiconductor region A is modified. FIG. 17 is a diagram showing the structure of energy bands in the light absorption control semiconductor region A pertaining to the sixth embodiment. In the sixth embodiment, semiconductors formed of different materials are used for first, second, and third quantum wells Q1, Q2, Q3. the first quantum well Q1 is formed of InGaAs; the second quantum well Q2 is formed of AlGaAs; the third quantum well Q3 is formed of GaAs; and barriers Vu, V1, V2, Vd are formed of AlGaAs having a large Al composition ratio. By regulating the width of the respective quantum wells Q1, Q2, Q3, ground state quantized energy levels coincide (match) only in a conduction band at the respective quantum wells in the absence of an electric field. The quantized energy levels do not coincide in valence bands. In this structure, the conduction band at the three quantum wells can be brought into a resonance state only where no electric field is applied. In the resonance state in the conduction band, the matched quantized energy levels are separated into three quantized energy levels E1, E2, E3 which differ by a minute energy, thereby releasing the degeneracy.

The action and effects of this structure are identical to the contents described with reference to FIG. 6, thus no description will be given thereon.

Seventh Embodiment

Figure 18:
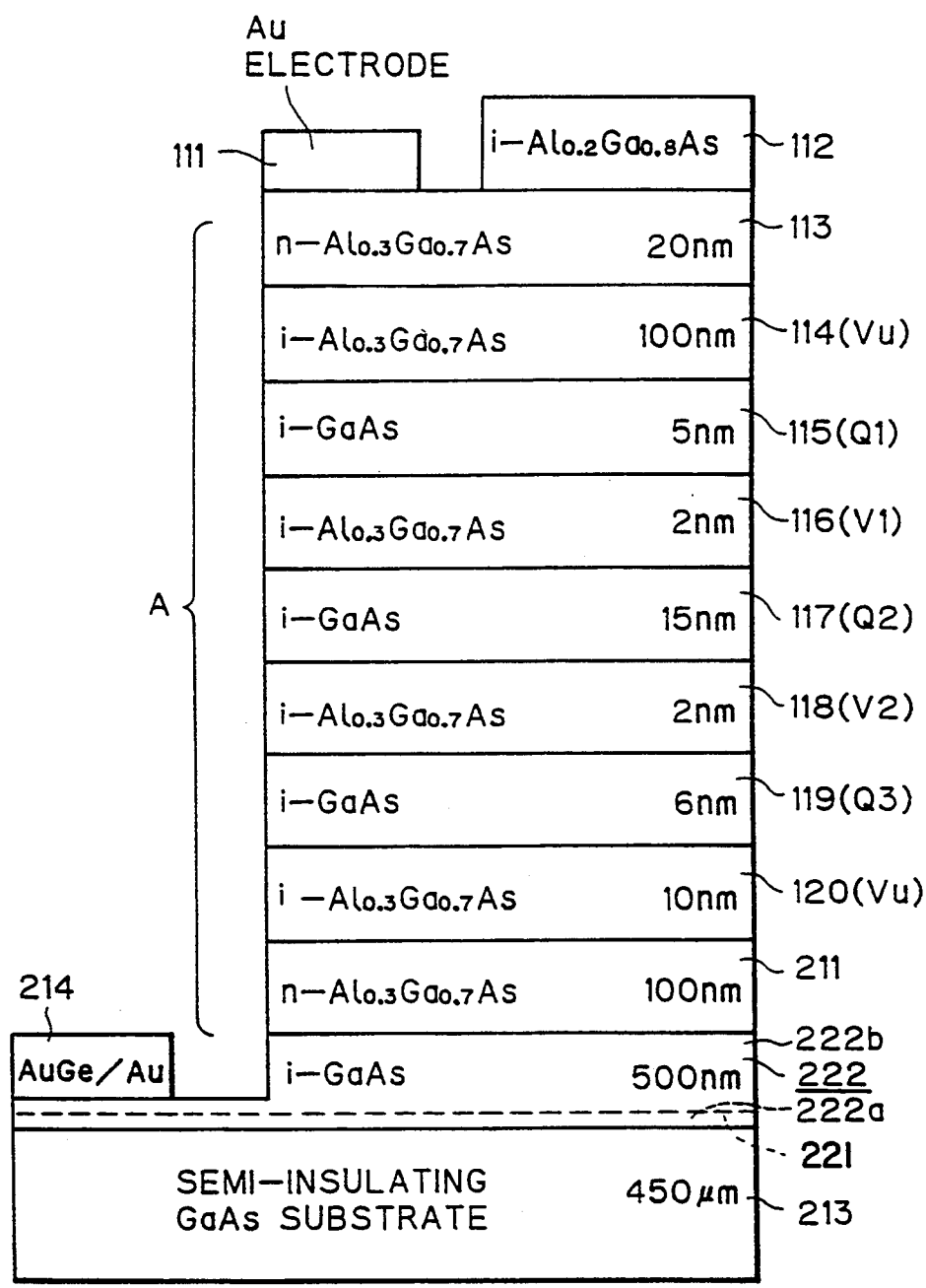
FIG. 18 is a sectional view showing the construction of a light absorption control semiconductor device pertaining to a seventh embodiment showing still another specific example of the third mode of the invention.

FIG. 18 is a sectional view showing the structure of a light absorption control semiconductor device 104 pertaining to a seventh embodiment showing another specific example to the third embodiment of the invention. In this embodiment, an i-GaAs layer 222 is formed in place of the n-GaAs layer 212 in FIG. 13 showing the fifth embodiment, and a δ doped layer 221 in which silicon atoms are sparsely doped on a surface in the thickness of one atom is formed halfway in the layer 222. The δ doped layer 221 acts as an electrode for applying an electric field uniformly to the surfaces of the three quantum wells. In addition, since the δ doped layer 221 does not disorder the lattice of the lower located i-GaAs layer 222a, an i-GaAs layer 222b grown on the layer 222a and layers 221, 120 to 113 grown on the layer 222b are allowed to have high crystallinity since they succeedingly grow the good crystallinity of the i-GaAs layer 222a.

In the case where the sheet carrier density of the δ doped layer 221 lies in the range of $1 \times 10^{11}$ to $3 \times 10^{13} cm^{-2}$, a layer of Si may be doped sparsely.

It may be appropriate to form a plurality of δ doped layers in the i-GaAs layer at specified intervals.

Eighth Embodiment

Figure 19:
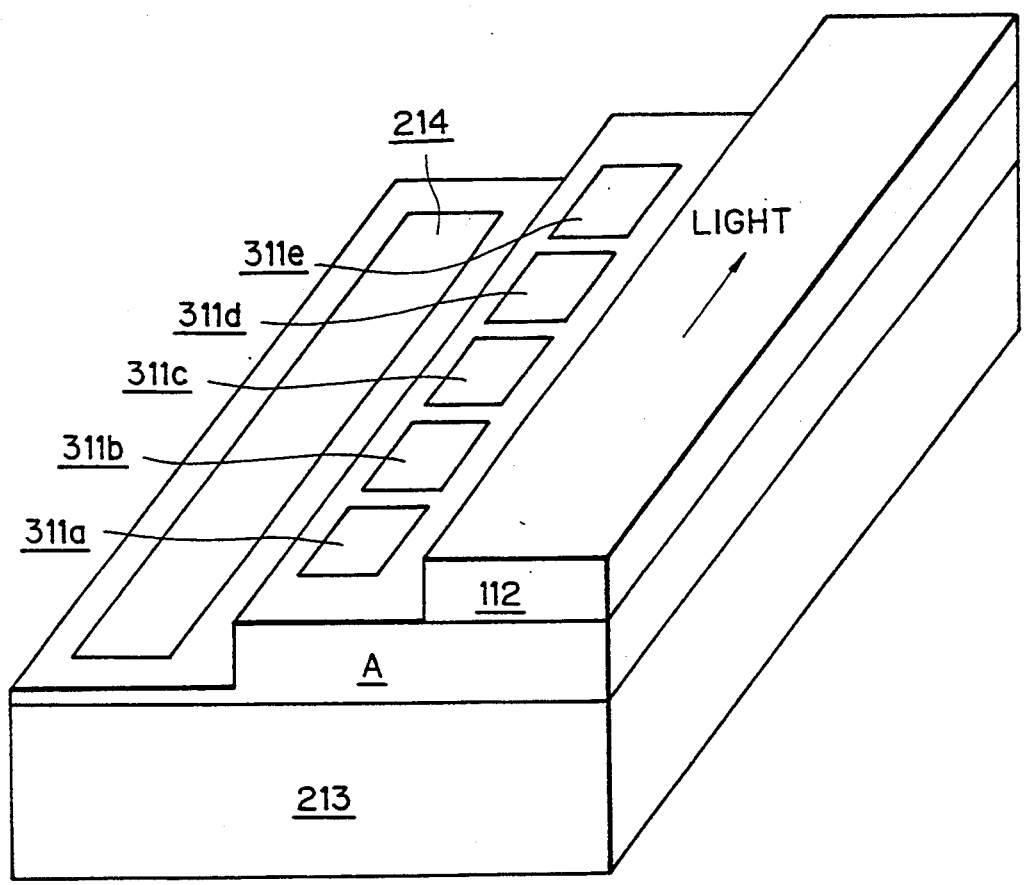
FIG. 19 is a perspective view showing the construction of a light absorption control semiconductor device pertaining to an eighth embodiment showing the third mode of the invention.
Figure 20:
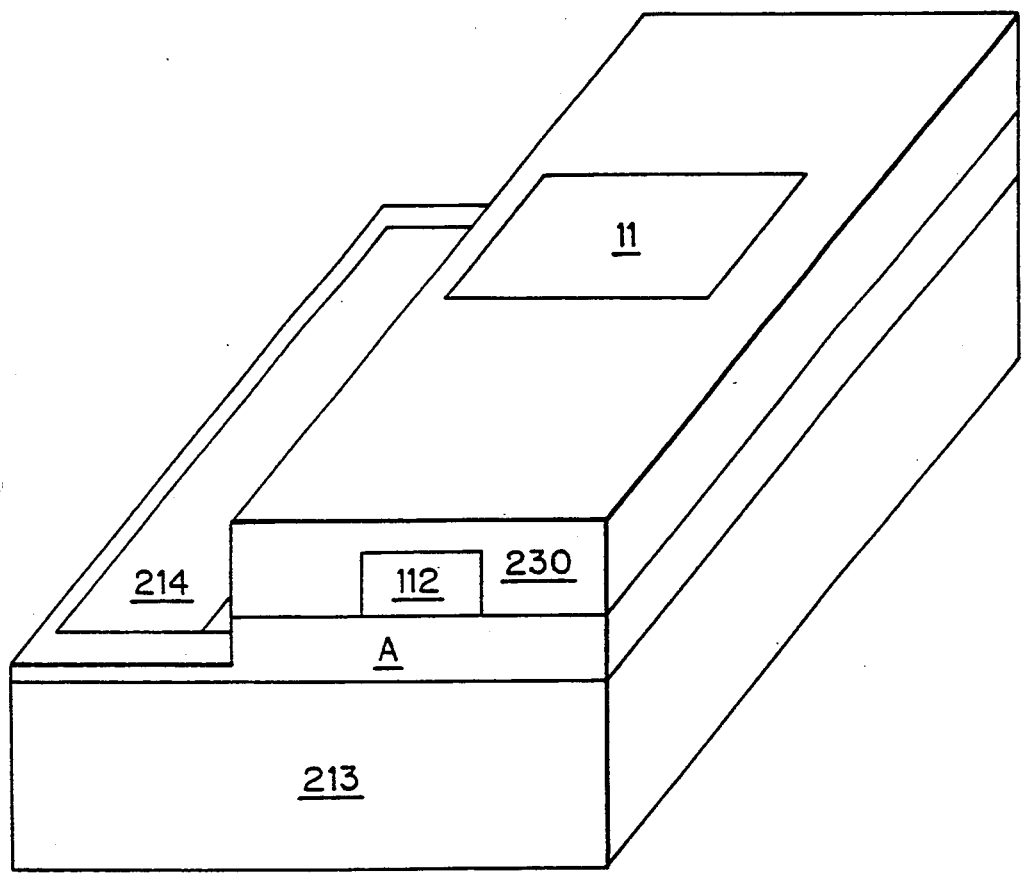
FIG. 20 is a perspective view showing the construction of a light absorption control semiconductor device pertaining to a ninth embodiment showing the third mode of the invention.

An eighth embodiment showing still another specific example of the third mode of the invention pertains to a semiconductor device constructed similar to the light absorption control semiconductor device 103 in the fifth embodiment. In this embodiment, electrodes 311a, 311b, 311c, 311d, 311e are formed sufficiently long to obtain a desired absorption characteristic and are provided as shown in FIG. 19 in place of the electrode 111. If a voltage is applied between the five electrodes 311a to 311e and the electrode 214, the light absorption spectra in a light absorption control semiconductor region under the five electrodes differ from one another. Accordingly, light propagating in a waveguide layer 112 is subjected to modulation by a composite spectrum of the light absorption spectra in the respective regions, thereby enabling the modulation or filtering to be more complicated than those obtained by the spectrum of the light.

Ninth Embodiment

In a ninth embodiment showing another specific example of the third mode of the invention, the waveguide layer 112 in the fifth embodiment is embedded in a clad layer 230 formed of $Al_zGa_{1-z}As$ (where z>y for y in $Al_yGa_{1-y}As$ forming the waveguide layer 112). A refractive index of the waveguide layer 112 is larger than that of the clad layer 230, and accordingly the light is confined in the waveguide layer 112 excluding the lower located light absorption control semiconductor region A. Although the waveguide layer 112 is formed on the light absorption control semiconductor region A in the foregoing embodiment, it may be appropriate to form the waveguide layer 112 on the substrate 213 and to form the light absorption control semiconductor region A on the layer 112.

Further, while the waveguide layer 112 is formed of AlGaAs compound semiconductor, it may be formed of other compound semiconductor, for instance $LiNbO_3$, or of optical fiber.

There will next be described a light absorption control semiconductor device which is highly efficient in modulating a light spectrum as a fourth mode of the invention. Specifically, a first basic feature in the construction of the semiconductor device for realizing the fourth mode of the invention is a light absorption control semiconductor region capable of changing a light absorption spectrum characteristic, and a photovoltaic semiconductor layer which is joined with a semiconductor layer on at least one end face of the light absorption control semiconductor region through energy barriers for separating pairs of electrons and holes to be excited, and which applies an electric field perpendicularly to the respective layers of the light absorption control semiconductor region by the excited electrons and holes.

The light absorption control semiconductor region includes at least three quantum wells formed by a junction of different types of semiconductor materials having different band gaps and having quantized energy levels enclosed by energy barriers. The width of the respective quantum wells and barriers are set such that wave functions of electrons in the respective quantum wells interact in a resonance state where the quantized energy levels of either one of the conduction and valence bands are matched. In addition, the width and material of the respective quantum wells are set so that one of the bands is brought into the resonance state where the quantized energy levels in the respective quantum wells are matched where no electric field is applied or where a suitable electric field is applied in a direction perpendicular to the junction.

The electric field to be applied to the light absorption control semiconductor region is controlled by a voltage generated by a control beam incident upon the photovoltaic semiconductor layer to thereby modulate a carrier beam incident upon the light absorption control semiconductor region.

The second feature in the fourth mode of the invention is that the semiconductor device includes at least three quantum wells formed by a junction of different types of semiconductor materials having different band gaps and having quantized energy levels enclosed by energy barriers in an energy diagram, the width of the respective quantum wells and barriers are set such that wave functions of electrons in the respective quantum wells interact in a resonance state where the quantized energy levels of either one of the conduction and valence bands are matched, the width and material of the respective quantum wells are set so that one of the bands is brought into the resonance state where the quantized energy levels in the respective quantum wells are matched where no electric field is applied or where a suitable electric field is applied in a direction perpendicular to the junction and no control beam exists.

The control beam is made incident upon the quantum wells to generate pairs of electrons and holes. The absorption spectrum is changed by the electric field generated by an unbalanced distribution of the electrons and holes, thereby modulating the carrier beam present in the quantum wells.

The third feature in this mode is, in addition to the aforementioned first feature, that a waveguide layer is provided which is joined with the semiconductor layer on at least one end face of the light absorption control semiconductor region or the photovoltaic semiconductor layer. The waveguide layer is constructed such that the carrier beam propagating therein leaks to the light absorption control semiconductor region, so as to modulate the carrier beam with the control beam.

The fourth feature in this mode is, in addition to the aforementioned second feature, that a waveguide layer is provided which is joined with the semiconductor layer at one end of the quantum well. The waveguide layer is constructed such that the carrier beam propagating therein leaks to the quantum well, so as to modulate the carrier beam with the control beam.

A light absorption control semiconductor region pertaining to the first feature of the fourth mode of the invention can demonstrate effects identical to those described with respect to the first mode of the invention. By controlling the electric field acting in the direction perpendicular to the junction, the light absorption control semiconductor region is allowed to have a light absorption characteristic having a certain absorption peak. The electric field is changed by the control beam incident upon the photovoltaic semiconductor layer joined with the light absorption control semiconductor region. More specifically, the photovoltaic semiconductor layer is formed of the same compound semiconductor as is the semiconductor layer, for example, at one end of the light absorption control semiconductor region, and constitutes PI, NI, PIN, PN, NP junctions. Accordingly, upon the incidence of the control beam, the electric field generated by the photoelectromotive force is applied to the light absorption control semiconductor region, thereby generating in the light absorption control semiconductor region the photovoltaic electric field or an electric field which is a sum of a bias electric field applied from an external power supply and the photovoltaic electric field. Thus, the electric field is changed by the control beam and the resonance and non-resonance states are changed by this changed electric field, with the result being that the absorption spectrum is changed. Therefore, the carrier beam incident upon the light absorption control semiconductor region has the spectrum thereof modulated with the control beam.

According to the second feature in the fourth mode of the invention, the photovoltaic semiconductor layer does not exist unlike the first feature. The structure and material of the triple quantum well are designed such that only one of the bands is brought into the resonance state where a specified electric field (including an electric field of zero) is applied when no control beam exists. Upon the incidence of the control beam of a specified wavelength in this resonance state, pairs of electrons and holes are generated. At this time, carriers (e.g., electrons) which have been transited to one band (e.g., conduction band) in the resonance state are permitted to tunnel into other quantum wells since the quantized energy levels are continuous. However, carriers (e.g., holes) in the other band (e.g., valence band) are confined in the one quantum well since the quantized energy levels are not continuous. Accordingly, there is generated a difference in the distribution of the electrons and holes, thereby generating an internal electric field. This internal electric field releases the resonance state. In other words, the resonance and non-resonance states can be controlled with the control beam.

When the carrier beam is incident upon the light absorption control semiconductor region in a state where the resonance and non-resonance states are controlled, it is subjected to the light absorption based on the light absorption spectra in the respective states. In other words, the spectrum of the carrier beam is modulated with the control beam. The meaning of the modulation differs according to the use of the device. For example, it is possible to transmit or shield the carrier beam with the control beam.

According to the third feature in the fourth mode of the invention, the waveguide layer for guiding the carrier beam is joined with the light absorption control semiconductor region of the first feature or the photovoltaic semiconductor layer, and the carrier beam propagating in the waveguide layer leaks to the light absorption control semiconductor region. This leaked carrier beam is modulated with the control beam. All the carrier beams are modulated while propagating in the waveguide layer for only a specified distance.

According to the fourth feature in the fourth mode of the invention, the waveguide layer for guiding the carrier beam is joined with the semiconductor layer at one end of the quantum well, and the carrier beam propagating in the waveguide layer leaks to the light absorption control semiconductor region. The leaked carrier beam is modulated with the control beam. All the carrier beams are modulated while propagating in the waveguide layer for only a specified distance.

According to the first feature in the fourth mode of the invention, the control beam is made incident upon the photovoltaic semiconductor layer to generate a photoelectromotive force, which is applied to the light absorption control semiconductor region of an asymmetric triple quantum well. Accordingly, a light-light modulator capable of modulating the carrier beam is realized with the control beam. Further, the modulation efficiency is high since the resonance and non-resonance states can be controlled by a minute electric field.

According to the second feature in the fourth mode of the invention, only one band of the asymmetric triple quantum well is brought into the resonance state in the state where no control beam exists. The pairs of electrons and holes are generated by the control beam which is incident in the resonance state, so that the electrons and holes are distributed asymmetrically due to the fact that only the one band is brought into the resonance state. This distribution generates the internal electric field, which in turn changes the resonance state into the non-resonance state. Accordingly, a light-light modulator capable of modulating the carrier beam with the control beam is realized. Further, the time required to generate the internal electric field is exceedingly short since it is determined by a time during which the carriers excited by the band in the resonance state move to the other quantum wells through the tunnel effect by the control beam, thereby enabling the exceedingly high speed modulation of the carrier beam.

This modulation enables frequency modulation (wavelength modulation), intensity modulation, on-off switches, binary modulation of "0" and "1" FSK modulation, filtering, and the like.

Next, the fourth mode of the invention with respect to specific examples thereof will be described.

Tenth Embodiment

Figure 21:
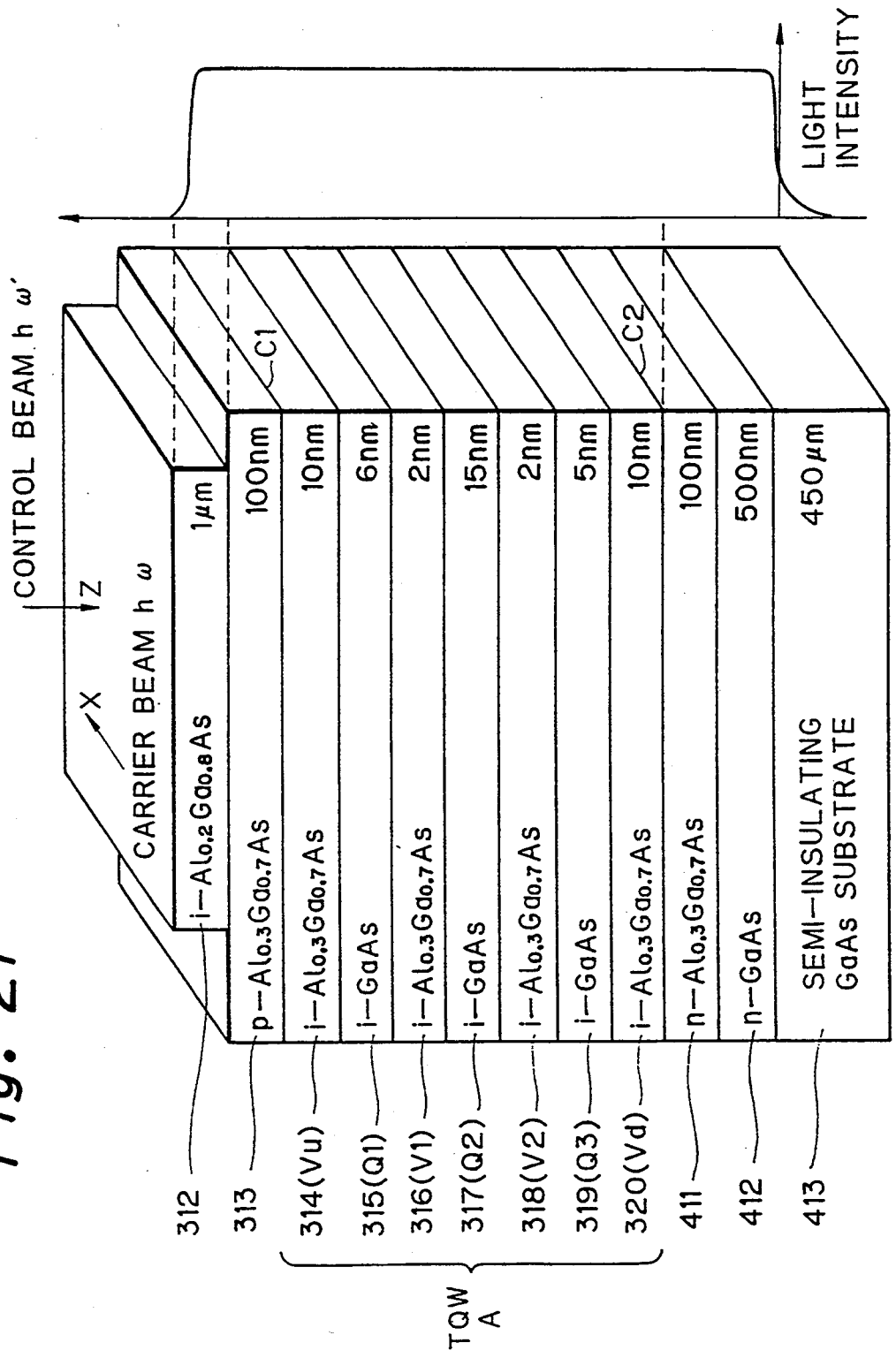
FIG. 21 is a diagram showing the structure of a light absorption control semiconductor device pertaining to a tenth embodiment showing a specific example of a fourth mode of the invention.

FIG. 21 is a perspective view showing the construction of a semiconductor device 105 as a specific example of the fourth mode of the invention.

On a 450 $\mu$m semi-insulating GaAs substrate 413 is formed a 500 nm n-GaAs layer 412 by epitaxy using the MBE method. Thereafter, a plurality of unit semiconductor layers are formed one after another. Specifically, n-Al$_x$Ga$_{1-x}$As (x=0.3), i-Al$_x$Ga$_{1-x}$As, i-GaAs, i-Al$_x$Ga$_{1-x}$As, i-GaAs, i-Al$_x$Ga$_{1-x}$As, i-GaAs, i-Al$_x$Ga$_{1-x}$As, and p-Al$_x$Ga$_{1-x}$As are grown by 100 nm, 10 nm, 5 nm, 2 nm, 15 nm, 2 nm, 6 nm, 10 nm, 100 nm to thereby form an n-AlGaAs layer (photovoltaic semiconductor layer) 411, an i-AlGaAs layer 320, an i-Ga As layer 319, an i-AlGaAs layer 318, an i-GaAs layer 317, an i-AlGaAs layer 316, an I-GaAs layer 315, an i-AlGaAs layer 314, and a p-AlGaAs layer (photovoltaic semiconductor layer) 313 respectively.

A multitude of layers 320 to 314 form a triple quantum well TQW. The i-GaAs layer 315 is a first quantum well Q1; the i-GaAs layer 317 is a second quantum well Q2; and the i-GaAs layer 319 is a third quantum well Q3. The i-AlGaAs layers 314, 320 are potential barriers Vu, Vd at opposite ends. The i-AlGaAs layers 316, 318 are intermediate potential barriers V1, V2 for separating the respective quantum wells.

Thereafter, on the p-AlGaAs layer 313 are grown i-Al$_y$Ga$_{1-y}$As (y=0.2) by 1 to 3 μm to thereby form an i-AlGaAs layer 312. This i-AlGaAs layer 312 functions as a waveguide layer. In this way, an epitaxial film structure is completed in which the photovoltaic semiconductor layer 411 (n-layer), the light absorption control semiconductor region A (layers 314 to 320), the photovoltaic semiconductor layer 313 (p-layer), and the waveguide layer 312 are joined one after another. The epitaxial film structure forms a pin photovoltaic device if the triple quantum well TQW is assumed as an i-layer.

The control beam is incident upon the waveguide layer 312 perpendicularly, and reaches a junction surface C1 between the photovoltaic semiconductor layer 313 and the i-AlGaAs layer 314 and a junction surface C2 between the i-AlGaAs layer 320 and the photovoltaic semiconductor layer 411. The wavelength of this control beam is selected at a value where the light absorption occurs under the influence of the direct transition from the valence band to the conduction band only on the above junction surfaces. In other words, the wavelength of the control beam is set such that it is not absorbed in the waveguide layer 312 and the triple quantum well TQW.

On the other hand, the carrier beam propagates in an x-axis direction in the waveguide layer 312 while repeating the multiple reflection in a z-axis direction in FIG. 21. At this time, the carrier beam leaks to the lower located light absorption control semiconductor region A since the thickness of the light absorption control semiconductor region A is exceedingly smaller than that of the waveguide layer 312. A distribution of cross-sectional intensity of the carrier beam is as shown in FIG. 21. This leaked carrier beam is absorbed in the light absorption control semiconductor region A, and all the carrier beams are subjected to a desired modulation while propagating in the waveguide layer 312 of a specified length in the X-axis direction.

There will be next described a light absorbing mechanism in the light absorption control semiconductor region A.

Figure 22:
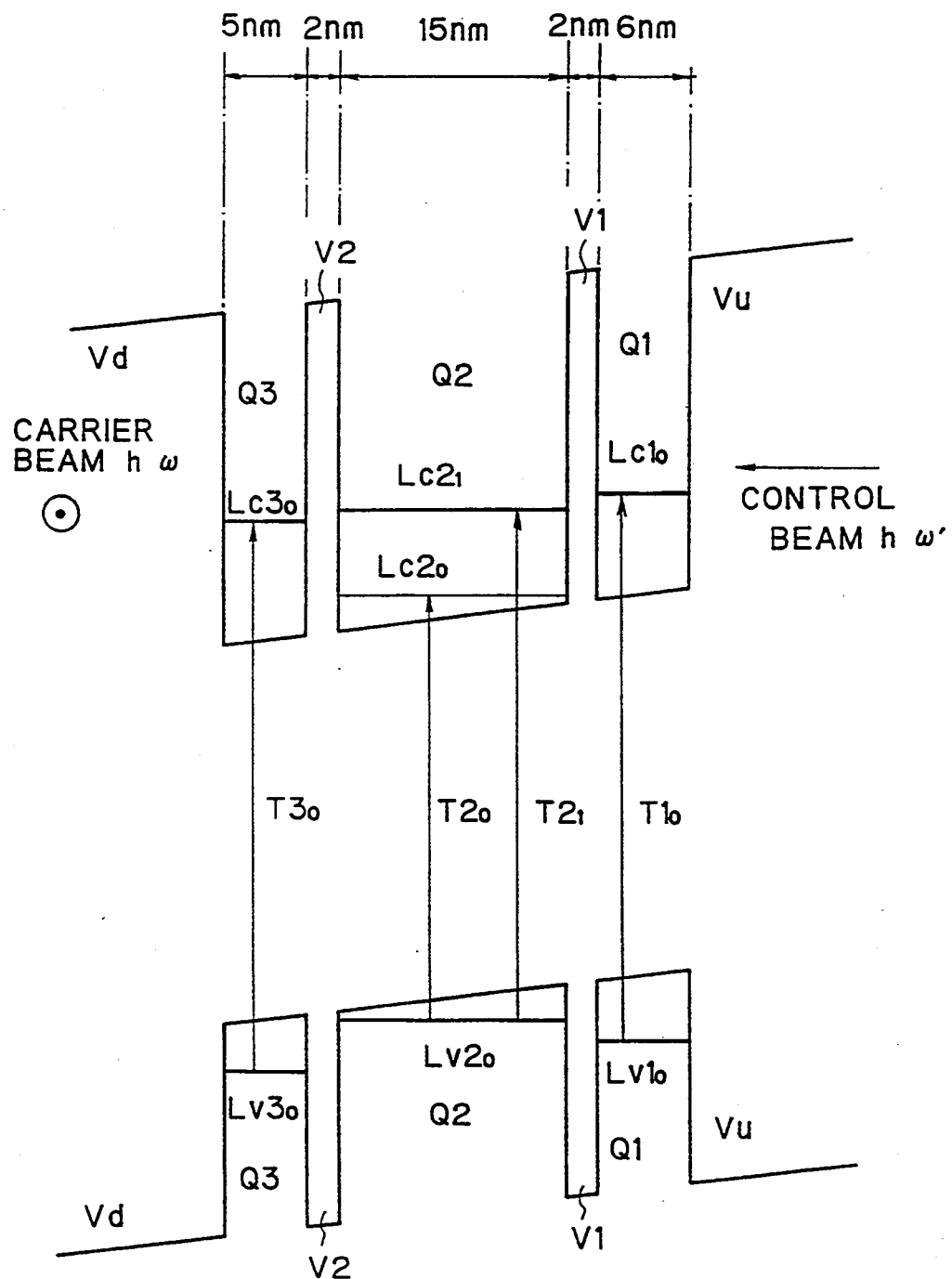
FIG. 22 is a diagram showing a light absorbing mechanism when the device of the tenth embodiment is in a non-resonance state.
Figure 24:
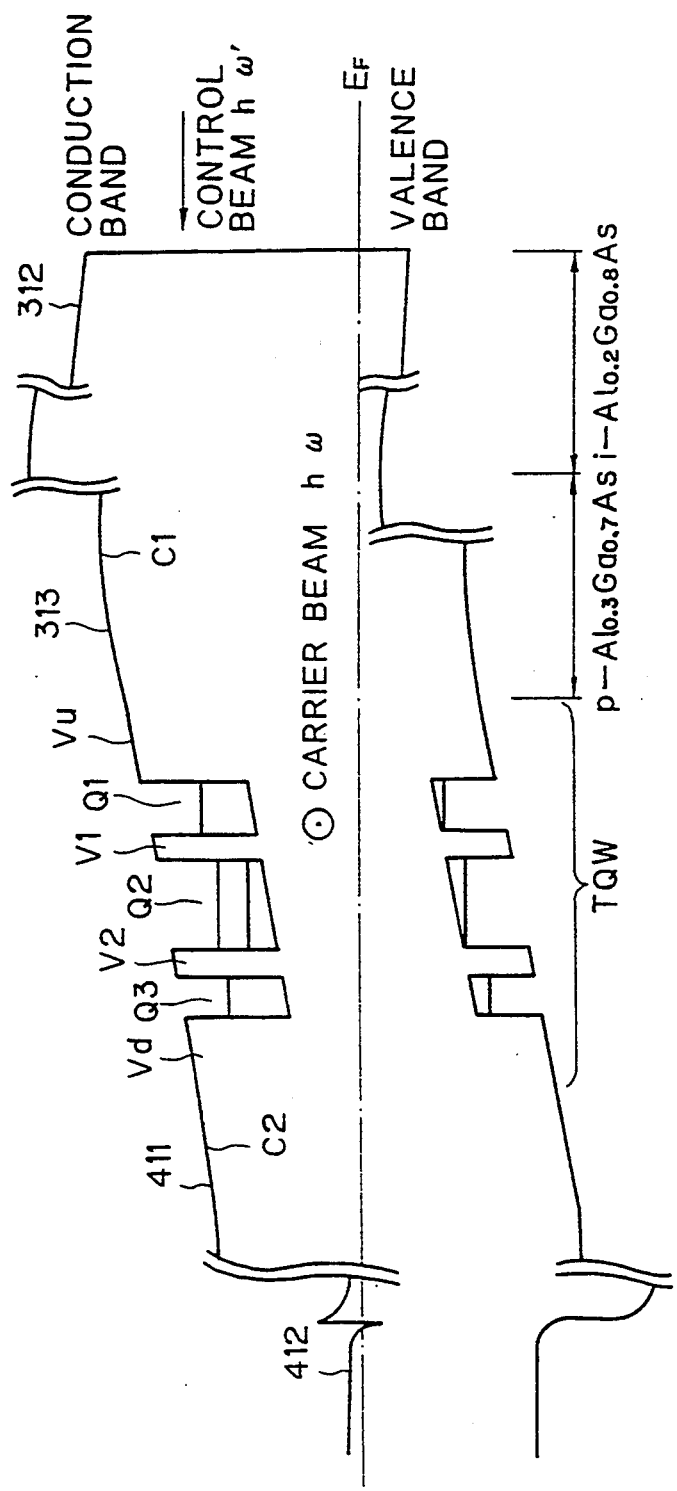
FIG. 24 is a diagram showing the structure of energy bands of the device of the tenth embodiment when a control light is not incident.

FIG. 22 is a diagram showing energy bands in a state where no electric field is applied to the triple quantum well (the band is inclined because of the pin structure), and FIG. 24 is a diagram showing energy bands in an entire device including the photovoltaic semiconductor layers 313, 411.

An operation of the light absorbing mechanism shown in FIG. 22 is similar to the one described with reference to FIG. 2 showing the first mode, and accordingly no description will be given thereof.

Since the pin structure is adopted in this specific example, the conduction and valence bands are inclined in the light absorption control semiconductor region A corresponding to the i-layer as illustrated.

Figure 25:
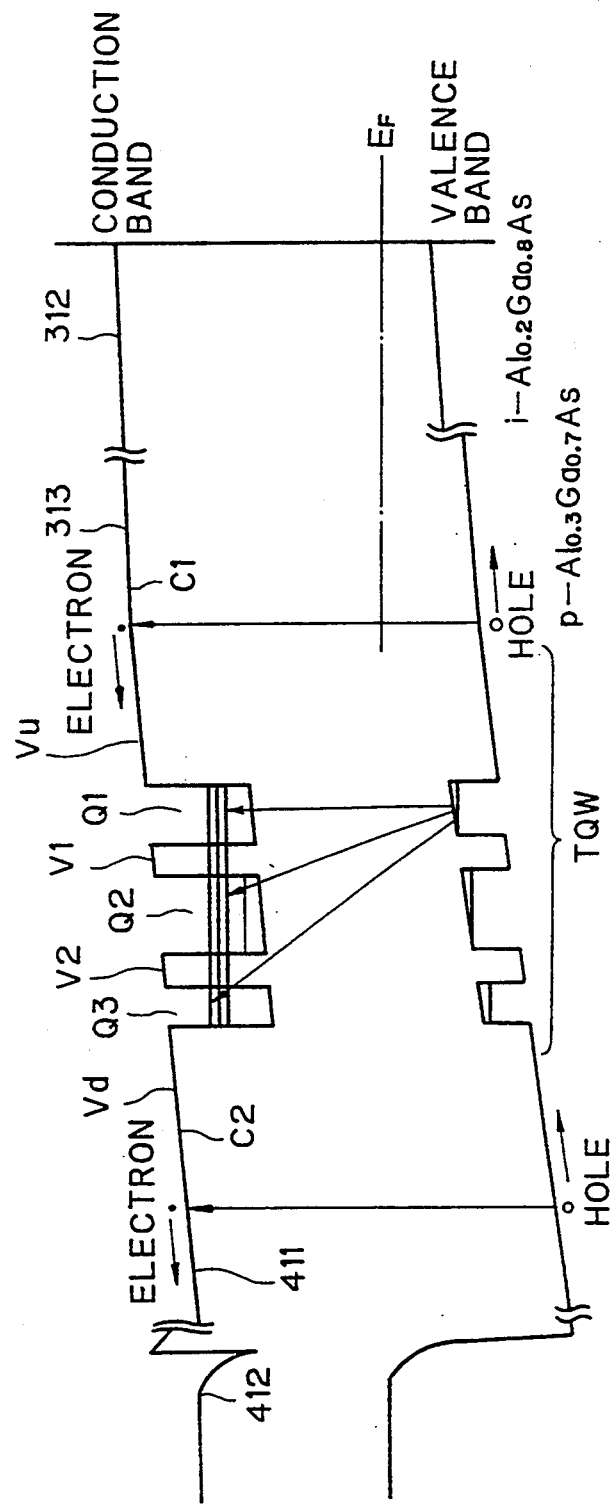
FIG. 25 is a diagram showing the structure of the energy bands of the device of the tenth embodiment when the control light is incident.

However, as shown in FIG. 25, when the control beam is incident perpendicularly upon the junction surfaces C1 and C2 through the waveguide layer 312, an electric field is generated in such a direction as to hold the p-AlGaAs layer 313 at a positive potential relative to the n-AlGaAs layer 411 by the distribution of electrons and holes excited on the pi junction surface C1 between the p-AlGaAs layer (p-type photovoltaic layer) 313 and the i-AlGaAs layer (and barrier layer vu of the light absorption control semiconductor region) 314 and the ni junction surface C2 between the n-AlGaAs layer (n-type photovoltaic layer) 411 and the i-AlGaAs layer (and barrier layer of the light absorption control semiconductor region) 320. This electric field is applied to the light absorption control semiconductor region A making the inclination of the conduction and valence bands gentle. As a result, the quantized energy levels in the conduction band become continuous thereby bringing the conduction band into the resonance state.

Figure 23:
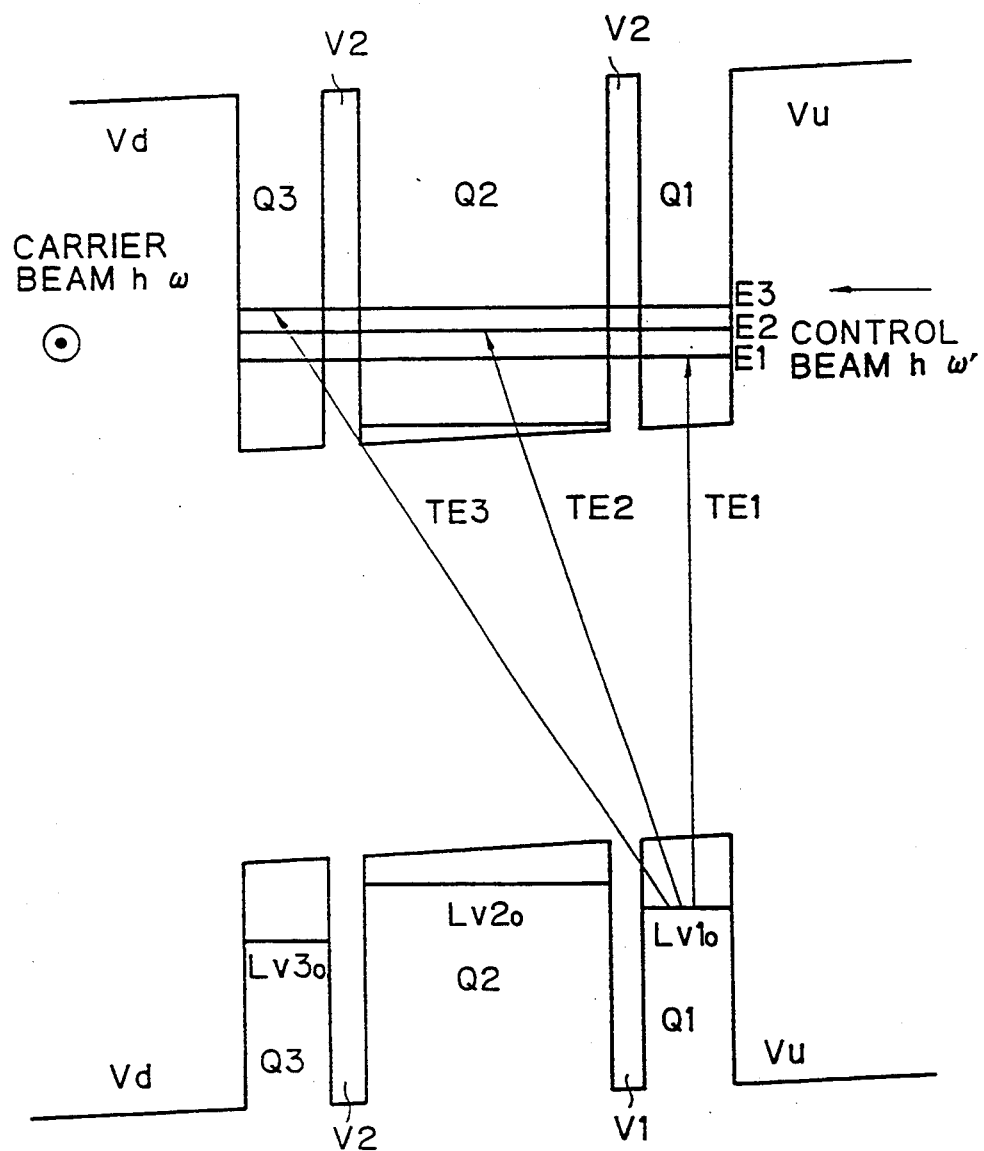
FIG. 23 is a diagram showing the light absorbing mechanism when the device of the tenth embodiment is in the resonance state.

By changing the electric field acting perpendicular to the junction surface of the triple quantum well TQW, the action and effects similar to those shown in FIGS. 4A and 4B are obtainable. In this specific example, the wavelength of the carrier beam is set such that the electrons are permitted to transit between the quantized energy levels in the valence band and the quantized energy levels in the conduction band in this resonance state. The light absorption of the carrier beam occurs under the influence of direct transitions TE1, TE2, TE3 between a ground state energy level Lv1$_0$ in the valence band at the first quantum well Q1 and quantized energy levels E1, E2, E3 commonly spread in the conduction band at the three quantum wells as shown in FIG. 23. Accordingly, the electrons are permitted to transit from the valence band to the quantized energy levels at any quantum well in the conduction band by the light absorption. This state is referred to as a resonance state. In the resonance state, the light absorption coefficient becomes exceedingly large.

According to the observation of the inventors, the light absorption coefficient is improved about 100 times compared to the semiconductor device including two quantum wells formed of the same material and having the same width.

To be more precise, it is difficult to observe three absorption spectra simultaneously since the resonance conditions of the three quantized energy levels E1, E2, E3 differ slightly, and the wavelengths at the absorption peaks of the absorption spectra change according to the intensity of the electric field. In other words, the electron transition which is the major controlling factor in the light absorption can be selected to be a desired one of the transitions TE1, TE2, TE3 by changing the intensity of the applied electric field slightly.

FIG. 5 is a graph showing a characteristic of the photoconductivity based on the electrons excited by making the light incident upon the light absorption control semiconductor region A in this specific example, which characteristic is measured by changing the applied voltage and the wavelength of the incident light. This graph shows the light absorption spectrum in the light absorption control semiconductor region A. The voltage applied to the opposite ends of the light absorption control semiconductor region A is changed from 2.5 V to 2.9 V. At 2.5 V, a photoconductivity peak P1 appears at 760 nm. At 2.9 V, the peak P1 disappears and a photoconductivity peak P2 appears at 765 nm. At an intermediate voltage of 2.7 V, both the peaks P1 and P2 are observed weakly. In this way, an excellent characteristic was observed in that the wavelength at the photoconductivity peak, i.e., the wavelength at the light absorption peak, could be controlled by changing the voltage by 0.4 V. When the wavelength at a particular peak is to be controlled, the light absorption coefficient can be controlled.

As will be understood from the distribution of cross-sectional intensity of the carrier beam shown in FIG. 21, a part of a laser beam leaks to the quantum wells Q3, Q2, Q1 in the light absorption control semiconductor region A having this light absorption characteristic. Accordingly, taking advantage of this light absorption characteristic, the wavelength components shown by the peak in FIG. 5 can be removed from the spectrum of the carrier beam. The spectrum of the carrier beam changes according to the electric field of the light absorption control semiconductor region A, i.e., the intensity of the control beam. This enables the modulation of changing the spectrum of the carrier beam (filtering,, frequency modulation, wavelength modulation, intensity modulation when a certain wavelength is taken note of). Particularly by suitably selecting the wavelength of the carrier beam, the semiconductor region is permitted to function as an optical switch device for switching between a transmitting state and a state where the beam is not propagating while being completely absorbed.

In the case where the light absorption control semiconductor region is used as an optical switch device, the beam can be modulated into binary states of "0" and "1". Further, the FSK modulation is enabled since the absorption peak Wavelength shifts when the voltage is changed minutely.

Although a bias voltage is not applied in this embodiment, a suitable bias voltage may be applied between the p-AlGaAs layer 313 and the n-AlGaAs layer 411. The intensity and polarity of the bias voltage differ depending upon the thickness of the respective layers of the light absorption control semiconductor region A and whether the resonance or non-resonance state is set when the bias voltage is applied. If the construction is such that the resonance state is set when the bias voltage is applied, the resonance state is changed to the non-resonance state upon the incidence of the control beam. On the contrary, if the non-resonance state is set close to the resonance state when the bias voltage is applied, the non-resonance state is changed to the resonance state upon the incidence of the control beam.

Eleventh Embodiment

Figure 26:
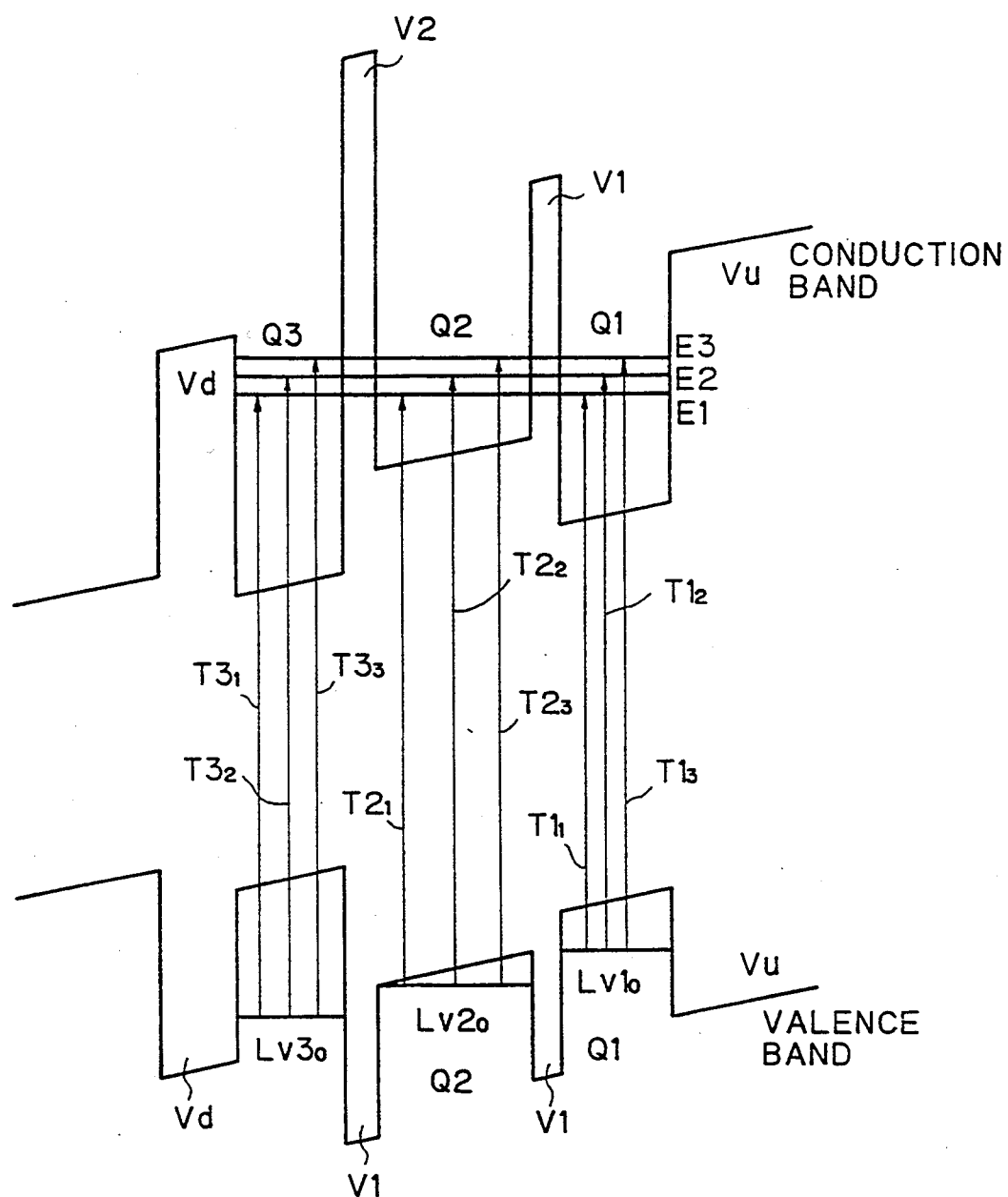
FIG. 26 is a diagram showing the structure of energy bands in a light absorption control semiconductor region of a device pertaining to an eleventh embodiment.

This embodiment is another specific example of the fourth mode of the invention. In this example, the construction of the light absorption control semiconductor region A is modified. FIG. 26 is a diagram showing the structure of energy bands in the light absorption control semiconductor region A pertaining to the eleventh embodiment. In this embodiment, semiconductors formed of different materials are used for first, second, and third quantum wells Q1, Q2, Q3. The first quantum well Q1 is formed of GaAs; the second quantum well Q2 is formed of AlGaAs; the third quantum well Q3 is formed of InGaAs; and barriers Vu, V1, V2, Vd are formed of AlGaAs having a large Al composition ratio. By regulating the width of the respective quantum wells Q1, Q2, Q3, grounds state energy levels coincide (match) only in a conduction band at the respective quantum wells in the absence of an electric field (the bands are inclined because of the PIN structure). The quantized energy levels do not coincide in a valence band. In this structure, only the conduction band at the three quantum wells can be brought into a resonance state in the state where no electric field generated by the photoelectromotive force exists. In the resonance state in the conduction band, the matched quantized energy levels are separated into three quantized energy levels E1, E2, E3 which differ by a minute energy, thereby releasing the degeneracy. In this structure, the direct transitions of electrons by the light absorption include: transitions $T1_1$, $T1_2$, $T1_3$ between a ground state energy level $Lv1_0$ in the valence band of the first quantum well Q1 and three quantized energy levels E1, E2, E3 commonly spread in the conduction band at the respective quantum wells; transitions $T2_1$, $T2_2$, $T2_3$ between a ground state energy level $Lv2_0$ in the valence band at the second quantum well Q2 and the three quantized energy levels E1, E2 E3 commonly spread in the conduction band at the respective quantum wells; and transitions $T3_1$, $T3_2$, $T3_3$ between a ground state energy level $Lv3_0$ in the valence band at the third quantum well Q3 and the three quantized energy levels E1, E2, E3 commonly spread in the conduction band at the respective quantum wells.

Accordingly, the light absorption occurs at three wavelengths corresponding to the transitions T1, T2, T3 from the different quantized energy levels in the valence band at the three quantum wells Q1, Q2, Q3. Thus, the peak wavelength and the absorption coefficient at the peak wavelength in the absorption characteristic having a single light absorption peak at a different wavelength for each quantum well can be changed according to the intensity of the control beam. In other words, this device is allowed to have three absorption lines simultaneously in a single structure and to switch electrically the three absorption lines which differ slightly from one another.

This structure can be used in quantum dots or quantum wires. In these structures, the light absorption coefficient is improved. Furthermore, by choosing appropriate sizes of well thickness, wire width, and dot diameter, the resonant condition can be achieved with no bias voltage. In this structure, signal light can be modulated by a modulation light beam and thus the bias voltage electrode is not necessary.

Twelfth Embodiment

Figure 27:
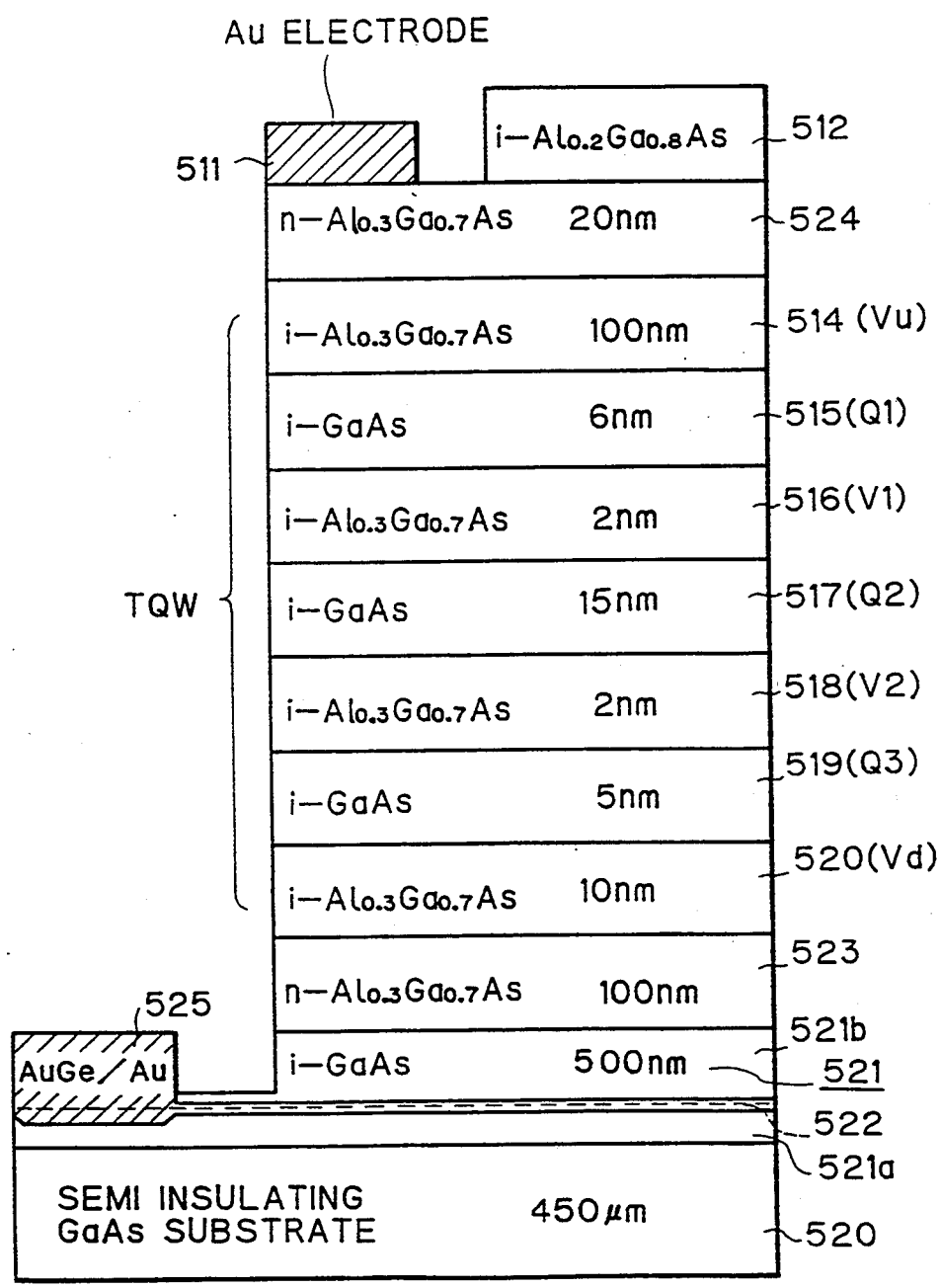
FIG. 27 is a sectional view showing the construction of a light absorption control semiconductor device pertaining to a twelfth embodiment.

FIG. 27 is a sectional view showing the structure of a light absorption control semiconductor device 106 pertaining to a twelfth embodiment which is still another example of the fourth mode of the invention. In this embodiment, the photovoltaic semiconductor layers 313, 411 in the tenth embodiment are not formed. On a semi-insulating substrate 520 is formed a 500 nm i-GaAs layer 521. On this layer 521 is formed a 100 nm n-AlGaAs layer 523 as an electrode layer. On the layer 523 is formed an asymmetric triple quantum well TQW structured similar to the one in the tenth embodiment. On the triple quantum well TQW is formed a 20 nm n-AlGaAs layer 524 as an electrode layer. On the layer 524 is formed an i-AlGaAs layer 512 (waveguide layer).

A δ doped layer 522 in which silicon atoms are sparsely doped on a surface in the thickness of one atom is formed halfway in the i-GaAs layer 521. The δ doped layer 522 acts as an electrode for applying an electric field uniformly to the surfaces of the three quantum wells. In addition, since the δ doped layer 522 does not disorder the lattice of the lower located i-GaAs layer 521a, an i-GaAs layer 521b grown on the layer 521a and layers 523, 520 to 514 grown on the layer 521b are allowed to have the high crystallinity since they succeedingly grow the good crystallinity of the i-GaAs layer 521a.

In the case where the sheet carrier density of the δ doped layer 221 lies in the range $1 \times 10^{11}$ to $3 \times 10^{13} cm^{-2}$ about a layer of Si may be doped sparsely.

It may be appropriate to form a plurality of δ doped layers in the i-GaAs layer 521 at specified intervals. Then, the waveguide layer 512 is etched to expose a part of the n-AlGaAs layer 524 in the form of a strip, so that the width of the waveguide layer 512 is narrower than that of the triple quantum well TQW. Further, the layers 514 to 521 are etched in the form of a strip so as to expose the i-GaAs layer 521. An Au layer and a double layer structure of AuGe alloy and Au (50 nm, 200 nm respectively) are formed on the exposed n-AlGaAs layer 524 and the exposed i-GaAs layer 521 by vacuum deposition. The alloying process is applied to the thus formed layers in a hydrogen and nitrogen atmosphere at a temperature of 400 degrees for 2 minutes to thereby obtain first and second electrodes 511, 525 having an ohmic contact.

Figure 28:
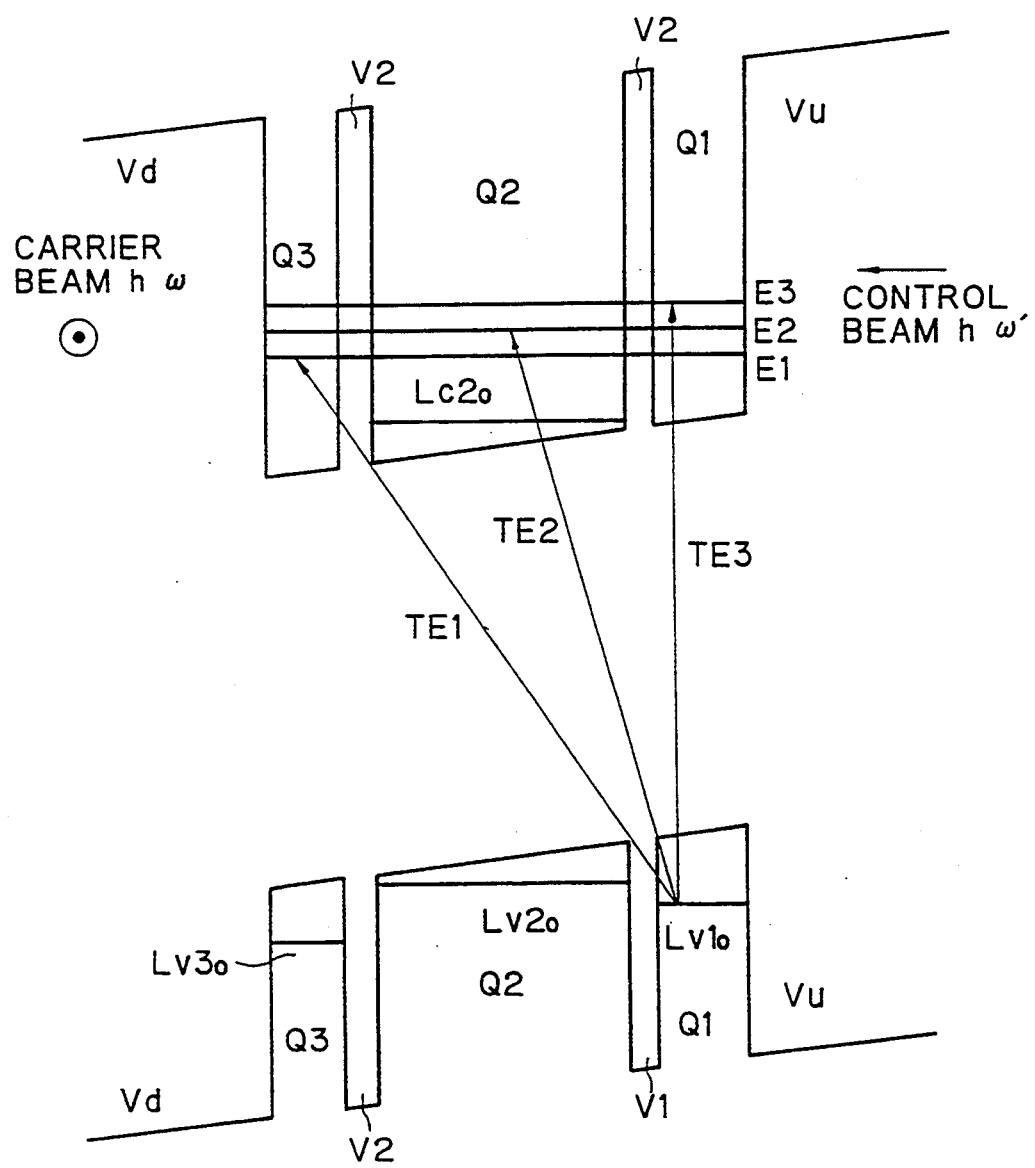
FIG. 28 is a diagram showing a carrier light absorbing mechanism of the device of the twelfth embodiment when a control light is not incident.

The carrier beam leaks to the triple quantum well TQW similarly as in the tenth embodiment. An advancing direction of the carrier beam and an incident direction of the control beam are the same as in the tenth embodiment. Further in this embodiment, a bias voltage is applied between the electrodes 511 and 525. Only the conduction band is in the resonance state as shown in FIG. 28 in a state where the voltage is applied.

In this embodiment, the wavelength of the control beam is selected to be a value corresponding to an energy difference between the ground state level $Lv2_0$ in the valence band at the second quantum well Q2 and the quantized energy level E2 in the conduction band. Only the conduction band is in the resonance state while no control beam is incident, thereby increasing the light absorption by the absorption characteristic of a specified spectrum. Accordingly, the carrier beam is modulated greatly. The carrier beam is shielded in the case of the modulation in the binary states of "0" and "1".

Figure 29:
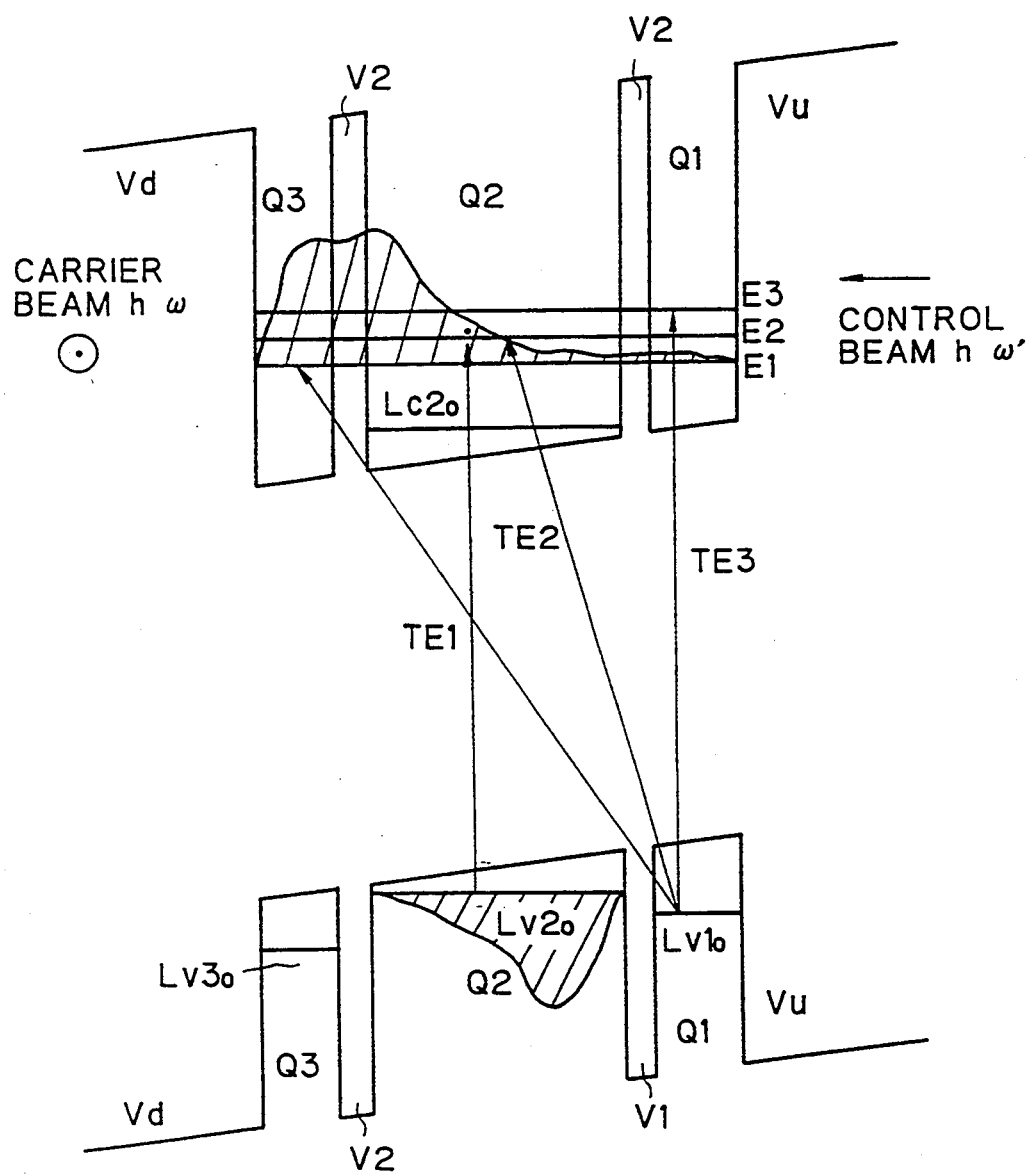
FIG. 29 is a diagram showing the carrier light absorbing mechanism of the device of the twelfth embodiment when the control light is incident.

On the other hand, in the state where the control beam is incident upon the triple quantum well TQW, pairs of electrons and holes are generated by the control beam in the second quantum well as shown in FIG. 29. At this time, the holes cannot move to other wells since the valance band is not in the resonance state and accordingly localize in the second quantum well Q2. On the contrary, the electrons are permitted to move to the other wells since the conduction band is in the resonance state. In other words, the electrons drift under the influence of the bias voltage. Since the holes are distributed only in the second quantum well Q2, an internal electric field is generated in the triple quantum well TQW. Thereby, the conduction band is brought out of the resonance state and the carrier beam is no longer absorbed. In other words, the carrier beam is brought into a transmitting state. In this way, the carrier beam can be modulated according to the intensity of the control beam.

In this embodiment, the responsiveness determined only by a moving velocity due to a tunnel effect of the electrons excited by the control beam and is not influenced by an electrostatic capacity unlike the existing transistors, thereby enabling an exceedingly high speed modulation. Further, the wavelength of the control beam is selected to a value corresponding to the one between $Lv2_o$ and E1, E2, between $Lc2_o$ and E1, E2, E3, or between $Lv2_o$ and $Lc2_o$.

Thirteenth Embodiment

This embodiment pertains to an optical integrated circuit (IC) 107 constructed by integrating the devices of the tenth, eleventh, or twelfth embodiment showing the fourth mode of the invention.

Figure 30:
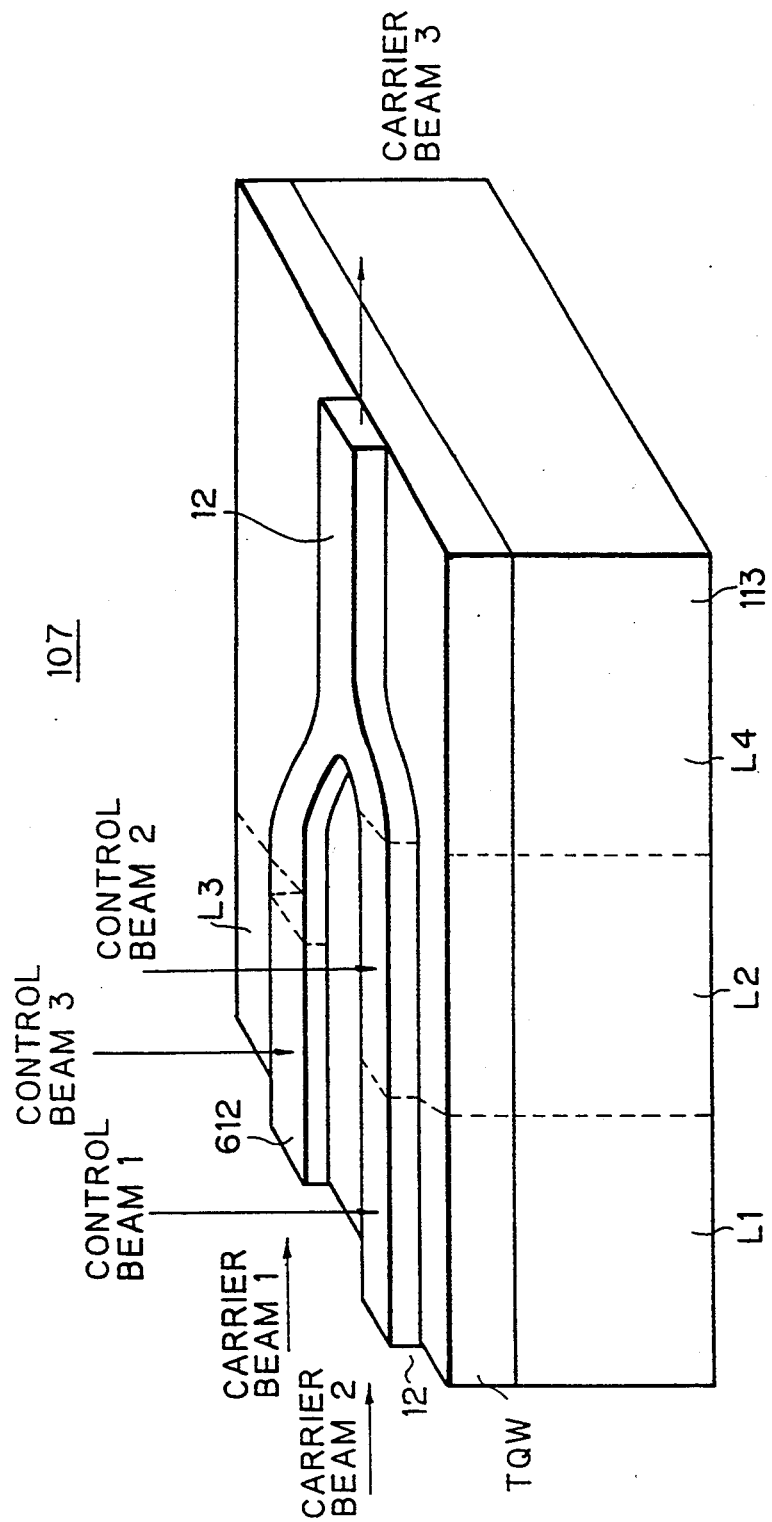
FIG. 30 is a perspective view showing the construction of a light absorption control semiconductor device pertaining to a thirteenth embodiment.
Figure 31:
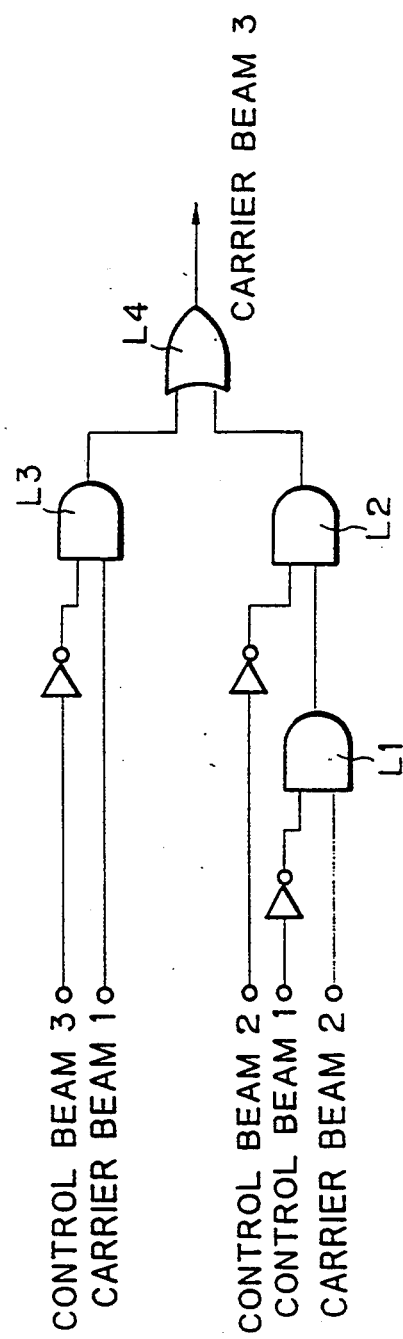
FIG. 31 is a circuit diagram showing an equivalent circuit of the semiconductor device shown in FIG. 30.

A waveguide layer 612 is formed as shown in FIG. 30. Portions L1, L2, L3, L4 of the waveguide layer 612 having a specified length are device portions corresponding to the devices of the foregoing embodiments. The carrier beam is modulated in the respective portions by projecting control beams onto the respective portions. Each portion functions as a gate to the control beam, thus this IC functions as an optical logic IC having functions of an equivalent circuit shown in FIG. 31.

In this way, this embodiment demonstrates the effects of modulating the carrier beam directly with the control beam.

There will next be described a fifth mode of the invention.

The fifth mode of the invention pertains to realization of a high performance semiconductor laser utilizing the aforementioned light absorption control semiconductor according to the invention.

Specifically, this mode pertains to a semiconductor laser in which an oscillating wavelength is made variable by controlling electrically a light absorption coefficient using quantum wells.

Conventionally, a method of making the oscillating wavelength of the semiconductor laser variable is known, according to which a refractive index in a resonator is changed by injecting a current into the resonator to thereby change an optical resonant period thereof.

However, the current injection method suffers from the defect of a large current consumption.

An object of this mode of the present invention is to provide a variable wavelength semiconductor laser taking advantage of a light absorption characteristic based on quite a novel power-saving principle.

In order to solve the above problem, a semiconductor laser according to the fifth mode of the invention includes a light absorption control semiconductor region joined therewith and is formed such that a partial cross-section of a laser beam normal to an optical path thereof leaks and exists in the light absorption control semiconductor region.

The light absorption control semiconductor region includes at least three quantum wells formed by a junction of different types of semiconductor materials having different band gaps and having quantized energy levels enclosed by energy barriers. The width of the respective quantum wells and barriers is set such that wave functions of electrons in the respective quantum wells interact in a resonance state where the quantized energy levels of either one of conduction and valence bands are matched. In addition, the width and material of the respective quantum wells are set so that one of the bands is brought into the resonance state where the quantized energy levels at the respective quantum wells are matched where no electric field is applied or where a suitable electric field is applied in a direction perpendicular to the junction. The light absorption is changed by controlling components of the electric field acting in the direction perpendicular to the junction.

The constructed semiconductor laser oscillates under the influence of the induced radiation resulting from the multiple reflection of a laser beam between opposite end faces. A partial cross-section of this laser beam normal to an optical path thereof leaks and exists in the light absorption control semiconductor region joined with the semiconductor laser. This light absorption control semiconductor region includes at least three quantum wells as described above.

The light absorption control semiconductor region used in the fifth mode of the invention includes the aforementioned light absorption control semiconductor. The action thereof is substantially identical to that of the light absorption control semiconductor used in the first to fourth modes of the invention, and accordingly no description will be given thereof.

In this mode as well, the light absorption control semiconductor is allowed to have a light absorption characteristic including a certain absorption peak by controlling the electric field acting in the direction perpendicular to the junction. Accordingly, the laser beam is subjected to the light absorption by the light absorption spectrum characteristic in the light absorption control semiconductor region while reflecting a multitude of times between resonators, with the result being that the spectrum of an oscillating wavelength changes. In other words, the wavelength of the laser beam can be made variable.

The fifth mode of the invention pertains to a semiconductor device including at least three quantum wells whose width is determined together with the width of barriers such that the wave functions of electrons in the respective quantum wells interact in a resonance state, and a light absorption control semiconductor region for generating a resonance state where quantized energy levels at the respective quantum wells are continuous and a non-resonance state only in one band by controlling components of an electric field acting in a direction perpendicular to a junction so as to control the light absorption, the light absorption control semiconductor region being joined with a semiconductor laser so that a partial cross-section of a laser beam leaks into the light absorption control semiconductor region. carolyn The light absorption spectrum changes greatly in the light absorption control semiconductor region according to a change in the electric field, thus the wavelength of the laser beam can be made variable by controlling the electric field. Since almost no current flows in the quantum wells, a power loss for making the wavelength variable is small.

Hereafter, specific examples of the fifth mode of the invention will be described with reference to the drawings.

Fourteenth Embodiment

Figure 32:
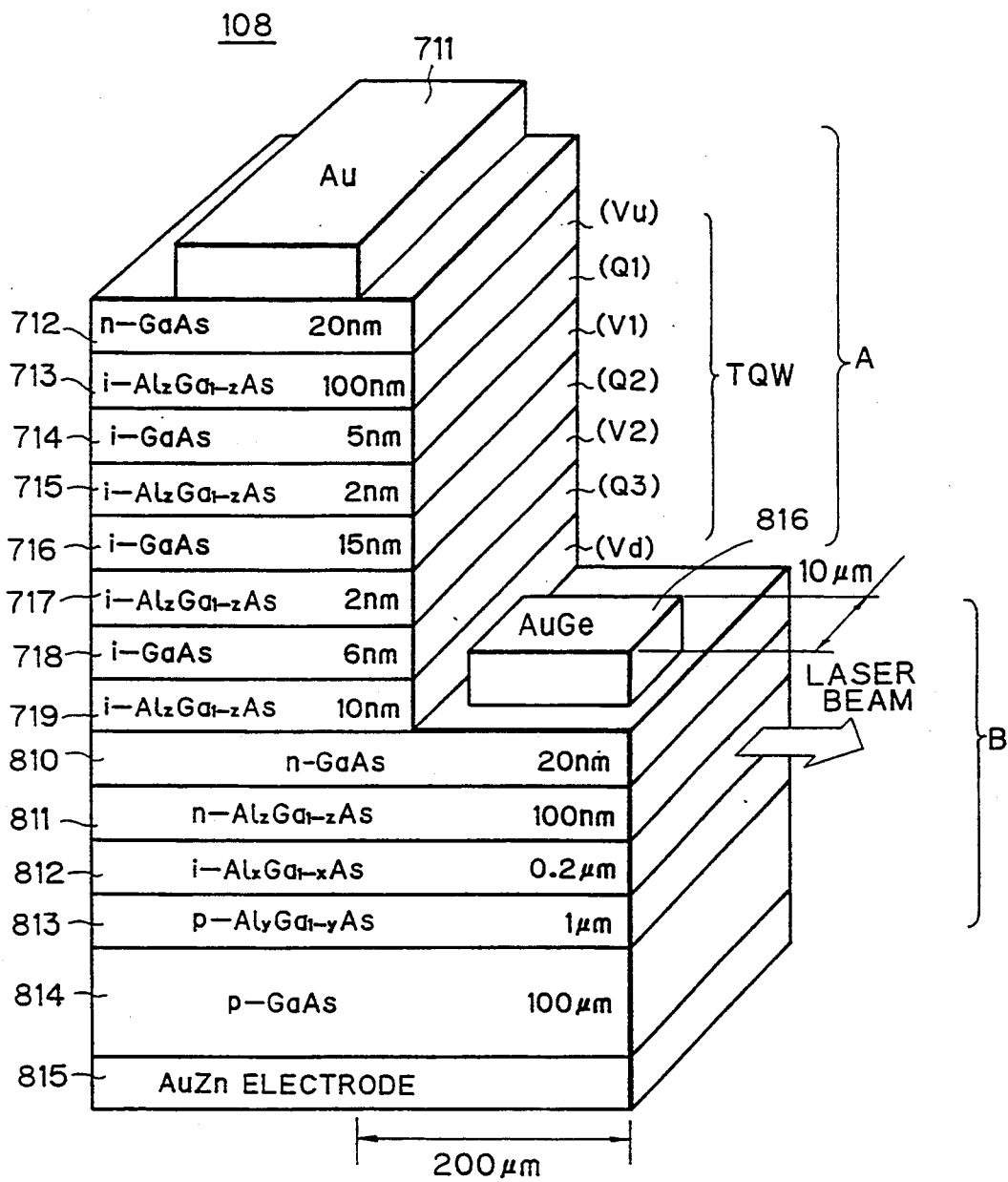
FIG. 32 is a diagram showing the structure of a semiconductor laser pertaining to a fourteenth embodiment showing a specific example of a fifth mode of the invention.

FIG. 32 is a perspective view showing the construction of a semiconductor device 108 as an embodiment in the fifth mode of the invention.

On a 100 $\mu$m p-GaAs substrate 814 are formed a 1 $\mu$m p-$Al_yGa_{1-y}$As layer 813, a 0.2 $\mu$m i-$Al_xGa_{1-x}$As layer 812 ($x \neq y$), a 100 $\mu$m n-$Al_yGa_{1-y}$As layer 811, and a 20 $\mu$m n-GaAs layer (an uppermost semiconductor layer of a semiconductor laser) 810 one after another. The layers 811 to 813 constitute a semiconductor laser B of a double heterojunction structure, the layer 812 is an active layer; and the layers 813, 811 are clad layers. The layer 810 is an electrode layer. The clad layer 811 is made exceedingly thin to lessen a confinement effect of the laser beam by the clad layer 811.

Thereafter, respective layers of the light absorption control semiconductor region A are accumulated one after another on the uppermost semiconductor layer 810 of the semiconductor laser B as follows. On the uppermost semiconductor layer 810 are grown i-$Al_2Ga_{1-z}$As (z=0.3), i-GaAs, i-$Al_2Ga_{1-z}$AS, i-GaAs, i-$Al_2Ga_{1-z}$As, i-GaAs, and i-$Al_2Ga_{1-z}$As by 10 nm, 6 nm, 2 nm, 15 nm, 2 nm, 5 nm, 100 nm to thereby form an i-AlGaAs layer 719, an i-GaAs layer 718, an i-AlGaAs layer 717, an i-GaAs layer 716, an i-AlGaAs layer 715, an i-GaAs layer 714, and an i-AlGaAs layer 713 which are unit semiconductor layers respectively.

The layers 719 to 712 form a triple quantum well TQW. The i-GaAs layer 714 is a first quantum well Q1; the i-GaAs layer 716 is a second quantum well Q2; and the i-GaAs layer 718 is a third quantum well Q3. The i-AlGaAs layers 713, 719 are potential barriers Vu, Vd at opposite ends. The i-AlGaAs layers 715, 717 are intermediate potential barriers V1, V2 for separating the respective quantum wells.

Thereafter, on the i-AlGaAs layer 713 are grown n-GaAs to 20 $\mu$m to thereby form an n-GaAs layer 712. In this way, an epitaxial film structure is completed. A portion of the layers 712 to 719 of the light absorption control semiconductor region A corresponding to an electrode forming portion of the semiconductor laser B is removed by means of etching to expose a part of the n-GaAs layer 810. A double layer structure of AuGe alloy and Au (50 nm, 200 nm respectively) and an Au layer are formed on the exposed region of the layer 810 and the n-GaAs layer 712 by vacuum deposition. The alloying process is applied to the thus formed layers in a hydrogen and nitrogen atmosphere at a temperature of 400 degrees for 2 minutes to thereby obtain electrodes 816, 711 having an ohmic contact. Further, on a rear surface of the p-GaAs substrate 814 is formed an electrode 815 made of AuZn alloy.

Figure 33:
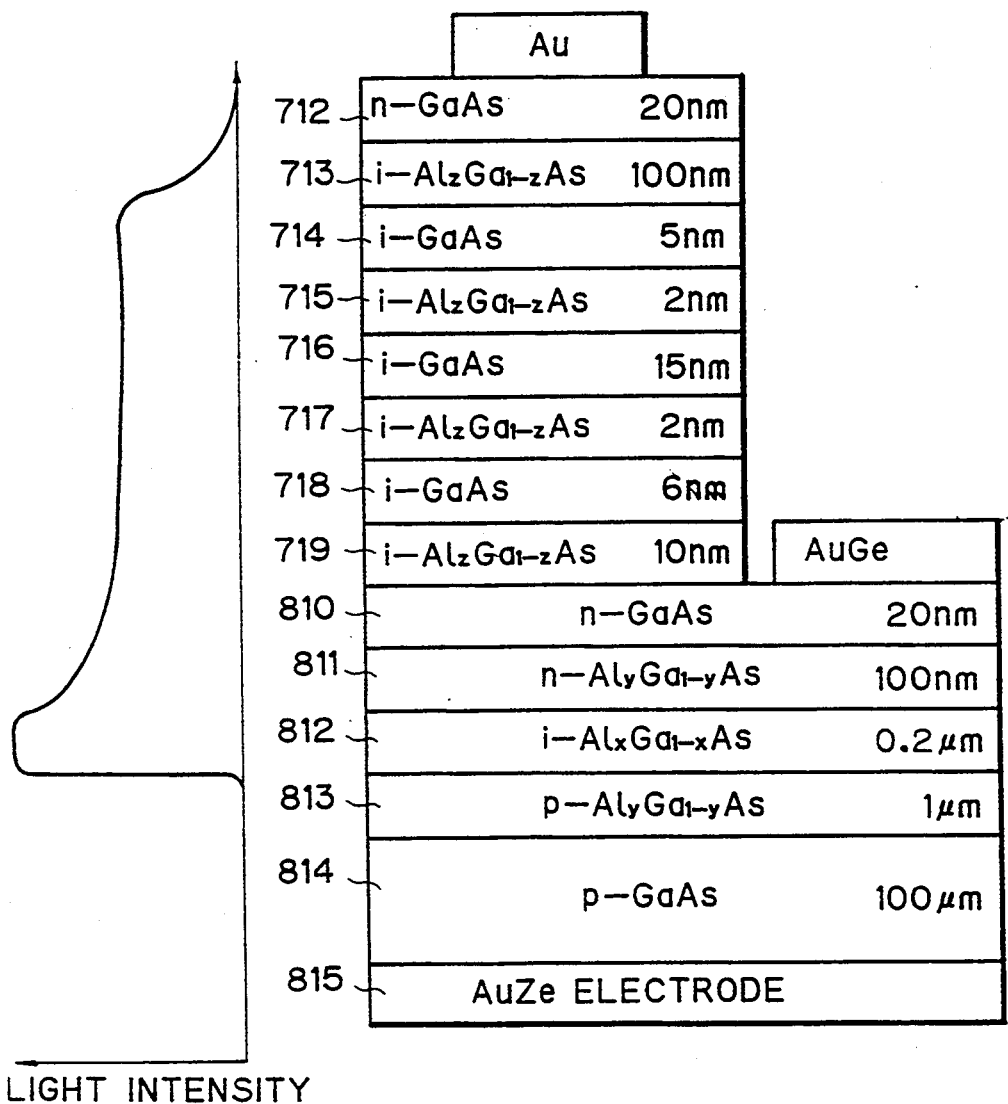
FIG. 33 is a diagram showing a distribution of the cross-sectional intensity of a laser beam in the semiconductor laser.

The width and length of the electrode 816 are 10 $\mu$m and 200 $\mu$m, respectively. In the semiconductor layer B, a voltage is applied so that the electrode 815 is held at a positive potential relative to the electrode 816. The n-GaAs layer 810 functions as a common electrode for the semiconductor laser B and the light absorption control semiconductor region A. Upon the application of this voltage, the electrons are injected from the clad layer 811 to the active layer 812 while the holes are injected from the clad layer 813 to the active layer 812. As a result, a laser beam is radiated from the active layer 812. A distribution of cross-sectional intensity of this laser beam is as shown in FIG. 33. It is found from FIG. 33 that no beam leakage exists on the side of the p-GaAs substrate 814, but a partial cross-section of the laser beam leaks greatly to the triple quantum well TQW on the side of the light absorption control semiconductor region A since the clad layer 811 is thin.

Figure 34:
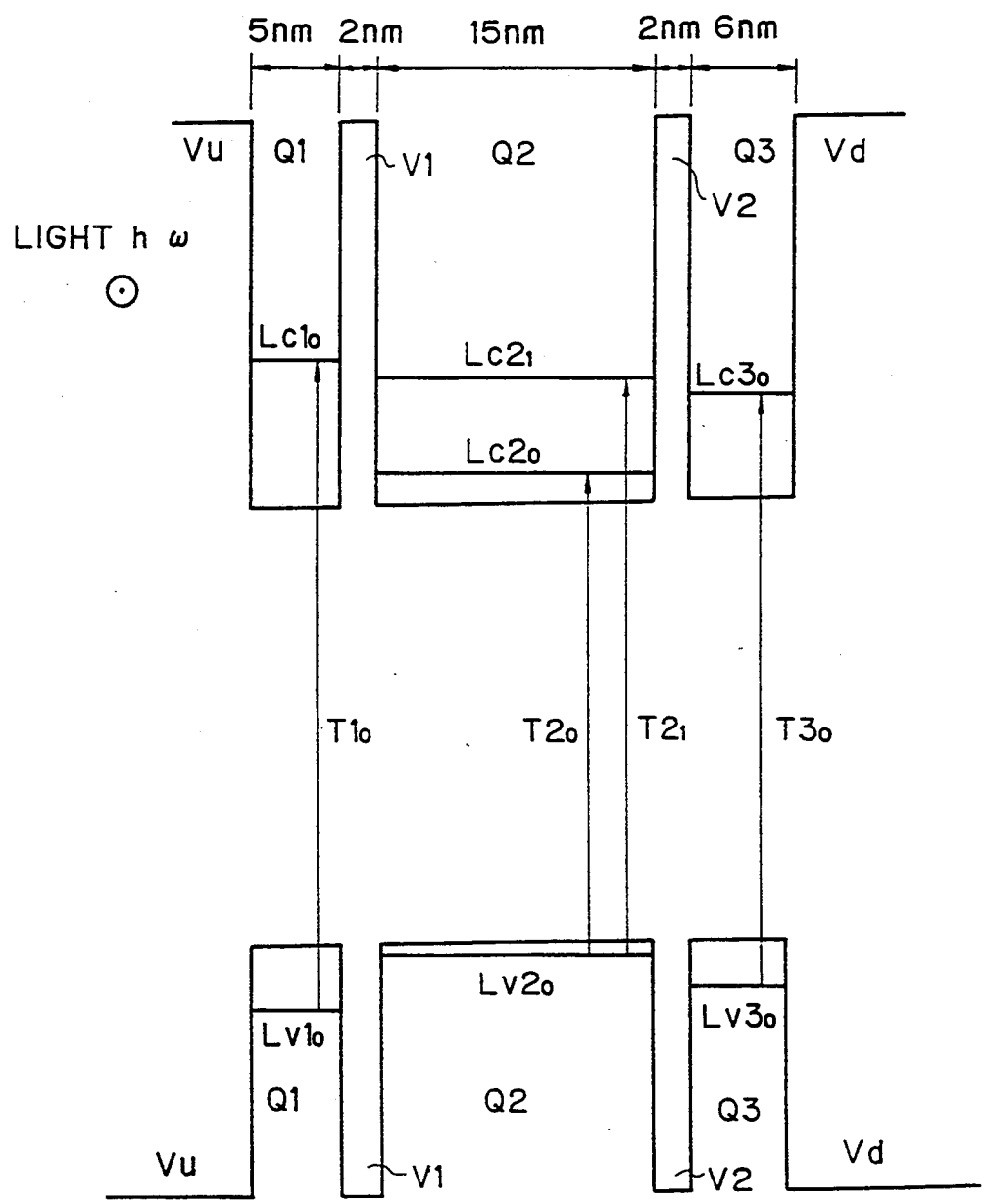
FIG. 34 is a diagram showing the structure of energy bands in a light absorption control semiconductor region of the semiconductor laser when no electric field is applied.

FIG. 34 is a diagram showing energy bands of a light absorbing mechanism in the light absorption control semiconductor region A in this embodiment in a state where no electric field is applied to the triple quantum well.

In each of the conduction and valence bands, there are formed potential barriers Vu, V1, V2, Vd including AlGaAs layers 713,715, 717, 719, and first, second, and third quantum wells Q1, Q2, Q3 including GaAs layers 714, 716, 718.

The light absorbing mechanism of the light absorption control semiconductor structure in FIG. 34 is identical to that of the light absorption control semiconductor used in the foregoing first to fourth modes of the invention, and accordingly no description will be given thereof.

When a voltage is applied so that the electrode 711 is held at the positive potential relative to the electrode 816, the n-GaAs layer 810 functions as an electrode layer, with the result being that the electric field is applied uniformly and perpendicularly to the junction surfaces of the triple quantum well TQW. Then, there occurs the phenomenon as shown in FIGS. 4A and 4B. Under these circumstances, the light absorption occurs under the influence of direct transitions TE1, TE2, TE3 between a ground state energy level $Lv1_0$ in the valence band at the first quantum well Q1 and quantized energy levels E1, E2, E3 commonly spread in the conduction band at three quantum wells as shown in FIG. 16. Accordingly, the electrons are permitted to transit from the valence band to the quantized energy level at any quantum well in the conduction band by the light absorption. This state is referred to as a resonance state. In the resonance state, the light absorption coefficient becomes exceedingly large.

FIG. 5 is a graph showing a characteristic suited to a case wherein the photoconductivity based on the electrons excited by the beam made incident upon the light absorption control semiconductor region A of this embodiment is measured by changing the applied voltage and the wavelength of the incident beam.

Figure 35:
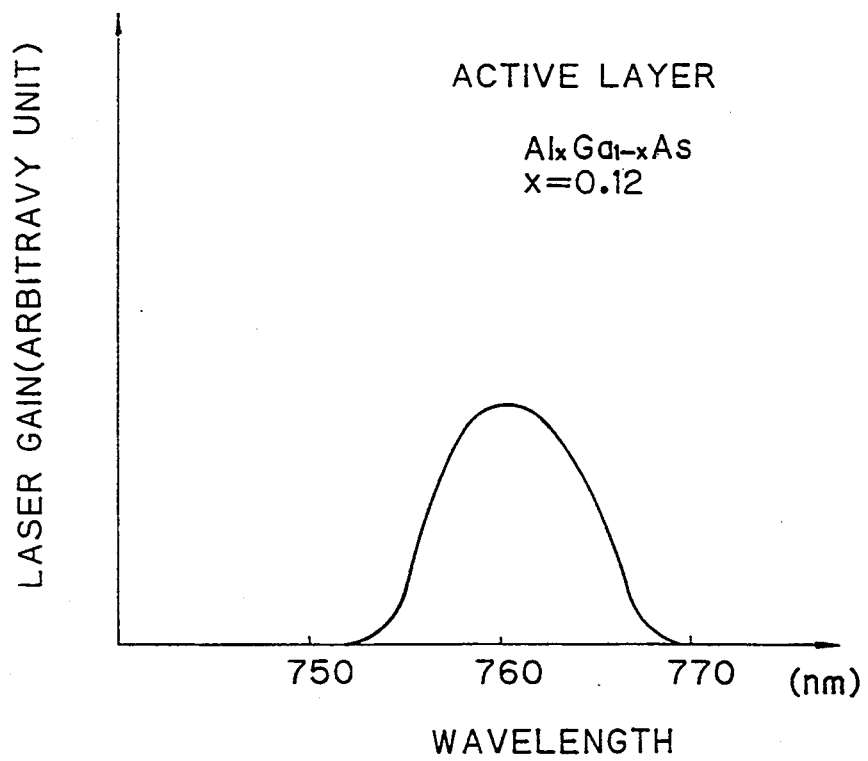
FIG. 35 is a graph showing a wavelength-gain characteristic in a state where no light absorption occurs in the light absorption control semiconductor region of the semiconductor laser.

As will be understood from the distribution of cross-sectional intensity of the laser beam shown in FIG. 33, a part of the laser beam leaks to the quantum wells Q1, Q2, Q3 of the light absorption control semiconductor region A having this light absorption characteristic. The spectrum of this laser beam is as shown in FIG. 35. Taking advantage of this light absorption characteristic, the wavelength components shown by the peak in FIG. 5 can be removed from the spectrum of the carrier beam. Thereby, the spectrum of the laser beam changes according to the voltage. Thus, the wavelength of the laser beam can be changed according to the voltage.

Although the triple quantum well is arranged in the order Q3 (6 nm), V2 Q2 (15 nm), V1 Q1 (5 nm) from the closest to the laser region in this example, this order may be reversed to thereby invert the polarity of the bias voltage. In this case, since the layer for absorbing the beam is closer to the laser waveguide layer, a stronger absorption can be obtained, providing a more desirable construction.

The semiconductor laser B may adopt an index waveguide type structure instead of the gain waveguide type structure as in this embodiment. In the case where the laser beam is mode-locked at a signal spectrum by an increased current injection caused by the index waveguide type structure, a frequency to be mode-locked can be changed by the light absorption characteristic of the light absorption control semiconductor region A.

Fifteenth Embodiment

Figure 36:
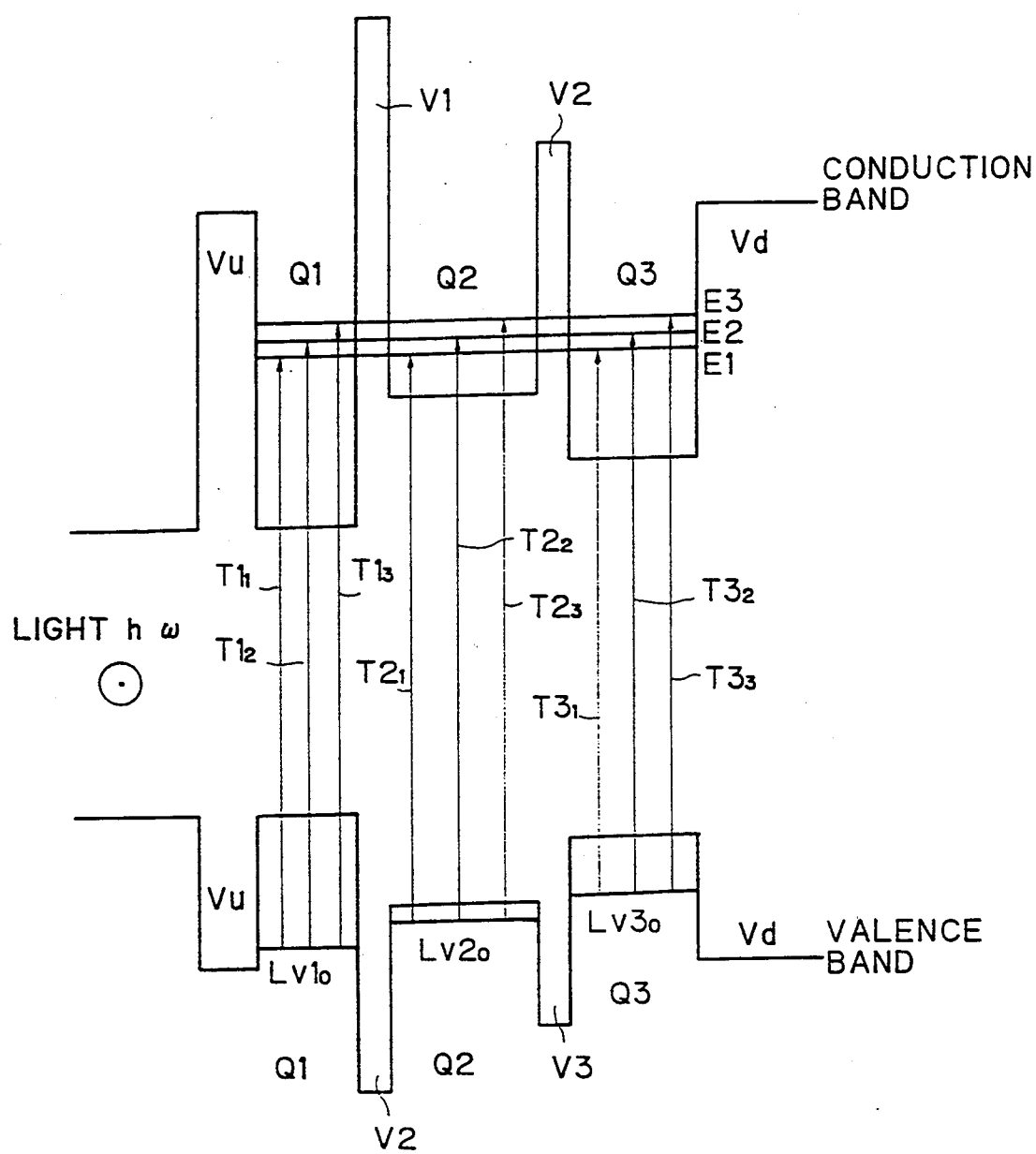
FIG. 36 is a diagram showing the structure of energy bands in a light absorption control semiconductor region of a semiconductor laser pertaining to a fifteenth embodiment showing a specific example of a fifth mode of the invention.

This embodiment pertains to a modification of the construction of the light absorption control semiconductor region A of the fourteenth embodiment. FIG. 36 is a diagram showing energy bands in a light absorption control semiconductor region A of the fifteenth embodiment. In this embodiment, semiconductors formed of different materials are used for the first, second and third quantum wells Q1, Q2, Q3. The first quantum well Q1 is formed of InGaAs; the second quantum well Q2 is formed of AlGaAs; the third quantum well Q3 is formed of GaAs; and barriers Vu, V1, V2, Vd are formed of AlGaAs having a large Al composition ratio. By regulating the width of the respective quantum wells Q1, Q2, Q3, ground state energy levels coincide (match) only in conduction band at the respective quantum wells in the absence of an electric field. The quantized energy levels do not coincide in valence bands. In this structure, only the conduction band at the three quantum wells can be brought into a resonance state in the state where no electric field is applied. In the resonance state in the conduction band, the matched quantized energy levels are separated into three quantized energy levels E1, E2, E3 which differ by a minute energy width, thereby releasing the degeneracy.

This device is allowed to have three absorption lines simultaneously in a single structure and to switch electrically the three absorption lines which differ slightly from one another. Thus, the shape of an envelope of the spectrum of the laser beam and a set of frequencies of the spectrum to be mode-locked can be changed delicately.

Sixteenth Embodiment

Figure 37:
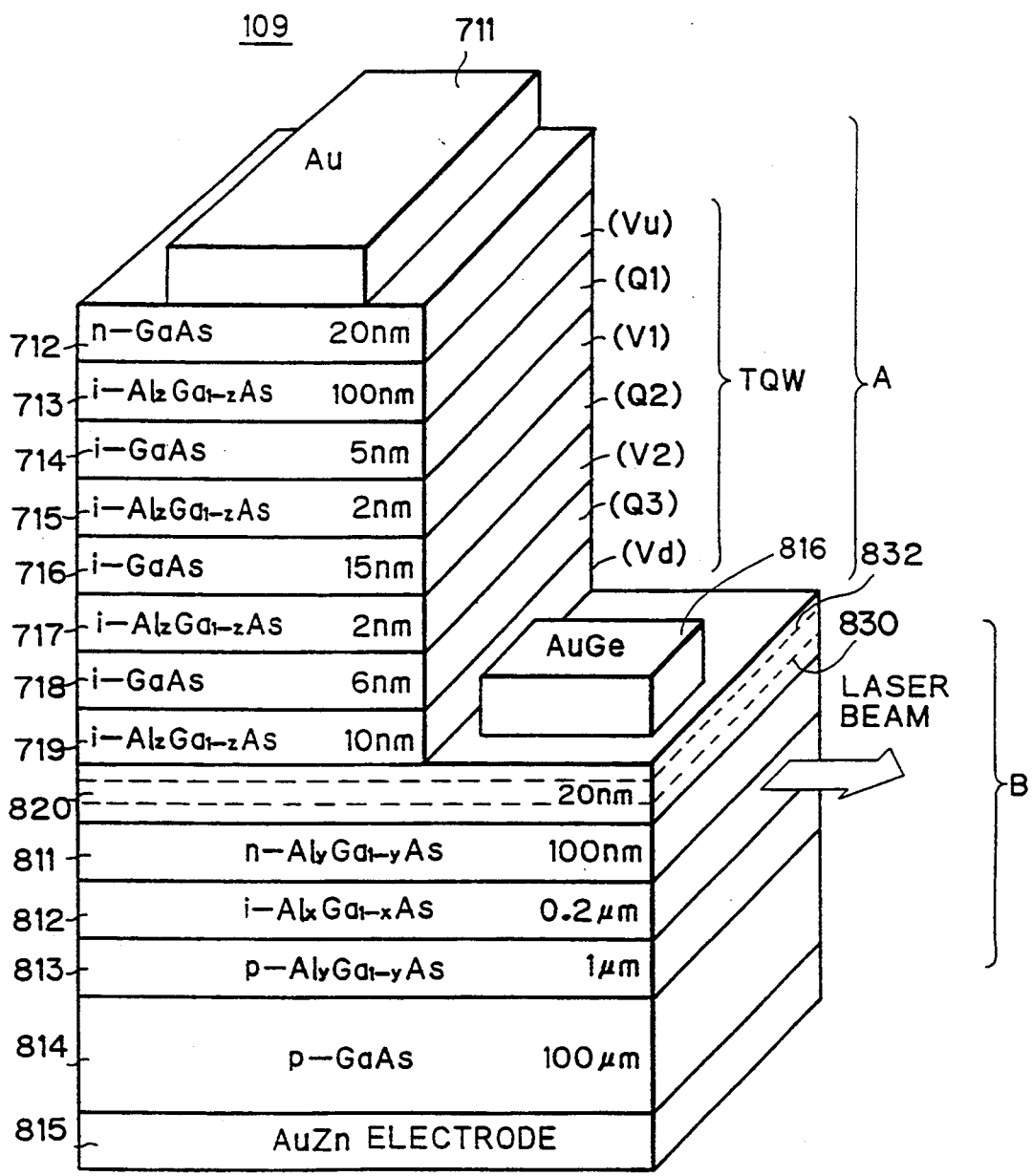
FIG. 37 is a diagram showing the structure of a semiconductor laser pertaining to a sixteenth embodiment showing a specific example of the fifth mode of the invention.

FIG. 37 is a sectional view showing the structure of a semiconductor laser 109 pertaining to a sixteenth embodiment. In this embodiment, an i-GaAs layer 820 is formed in place of the n-GaAs layer 810 which is uppermost semiconductor layer in the fifteenth embodiment. Halfway in the layer 820 are formed δ doped layers 830, 831 obtained by doping silicon atoms sparsely on the surface in the thickness of one atom. The δ doped layers 830, 831 function as electrodes for applying an electric field uniformly onto the surfaces of the three quantum wells. In addition, since the δ doped layers 830, 831 do not disorder the lattice of the lower located i-GaAs layer 820, layers 719, 712 grown on the layer 820 are allowed to have the high crystallinity since they succeedingly grow the good crystallinity of the i-GaAs layer 820.

In the case where the sheet carrier density of the δ doped layers 830, 831 lies in the range of $1 \times 10^{11}$ to $3 \times 10^{13} cm^{-2}$, a layer of Si may be doped sparsely.

Although the light absorption control semiconductor region is formed on the semiconductor laser in the embodiment, it may be appropriate to form the light absorption control semiconductor region on the substrate and to grow the respective layers of the semiconductor laser thereon. In this case, it may be suitable to grow i-GaAs on the substrate, to form the δ doped layer, to grow i-GaAs, and to form the light absorption control semiconductor region on these layers.

There will next be described a sixth mode of the invention. The sixth mode of the invention pertains to a realization of a high performance semiconductor light emitting diode utilizing the aforementioned light absorption control semiconductor according to the invention.

Specifically, this mode pertains to a semiconductor light emitting diode capable of changing a visible color of a light emitted therefrom by controlling electrically a light absorption spectrum using quantum wells.

Conventionally, there is a method using a resin filter mixed with pigments as a method of changing a luminescent color of the light emitting diode. There is also a method of combining a plurality of light emitting diodes having different luminescent colors.

However, with the former method, a light whose color is different from the luminescent color of a luminous source can be obtained, but the luminescent color cannot be changed. The latter method is disadvantageous in integration since respective luminous source chips are integrated. This method changes the visible color of the mixed light by changing the luminous intensity of the respective light emitting diode chips, and accordingly is only capable of changing the luminescent color to a limited extent. Since the spectrum of the light emitted from the light emitting diode is normally broad, the peak wavelength of the light can be changed by changing the absorption spectrum. An object of the sixth mode of the invention is to realize a variable wavelength semiconductor light emitting diode capable of easily changing an emission spectrum by a voltage taking advantage of the light absorption characteristic based on a quite novel power-saving principle.

In order to solve the above problems, a light emitting diode according to the invention for radiating a light from a junction surface of semiconductor layers includes a light emitting diode region having a junction surface of the semiconductor layers for radiating the light and a light absorption control semiconductor region upon which the light emitted in the light emitting diode region is incident. The light absorption control semiconductor region includes at least three quantum wells formed by a junction of different types of semiconductor materials having different band gaps and having quantized energy levels enclosed by energy barriers in an energy diagram. The width of the respective quantum wells and barriers is set such that wave functions of electrons in the respective quantum wells interact in a resonance state where the quantized energy levels of either one of conduction and valence bands are matched at the respective quantum wells. In addition, the width and material of the respective quantum wells are set so that one of the bands is brought into the resonance state where the quantized energy levels at the respective quantum wells are matched in a state where no electric filed is applied or a state where a suitable electric field is applied in a direction perpendicular to the junction. The light absorption is changed by controlling components of the electric field acting in the direction perpendicular to the junction.

In the light emitting diode of this mode, the light emitting diode region and the light absorption control semiconductor region are joined with each other. The light emitted from the light emitting diode region is incident upon the light absorption control semiconductor region where the light has a spectrum thereof modulated. The light absorption control semiconductor region is capable of changing the absorption spectrum by the electric field. Thereby, the peak wavelength of the light transmitted through the light absorption control semiconductor region is controllably changed by the voltage. This light absorption control semiconductor region includes at least three quantum wells as described above.

The light absorption control semiconductor region used in the sixth mode of the invention includes the aforementioned light absorption control semiconductor. The action thereof is substantially identical to that of the light absorption control semiconductor region used in the first to fifth modes of the invention, and accordingly no description will be given thereof.

In this mode as well, the light absorption control semiconductor is allowed to have a light absorption characteristic having a certain absorption peak by controlling the electric field acting in the direction perpendicular to the junction. Thus, the light emitted from the light emitting diode region has the spectrum thereof modulated while transmitting through the light absorption control semiconductor region, with the result being that the peak wavelength of the light transmitted through the light absorption control semiconductor region is controllably changed by the voltage.

The sixth mode of the invention pertains to a light emitting diode that includes a light absorption control semiconductor region consisting essentially of at least three quantum wells whose width is determined together with the widths of barriers such that wave functions of electrons in the respective quantum wells interact in a resonance state, and generating the resonance state where quantized energy levels at the respective quantum wells are continuous and a non-resonance state in only one of the bands by controlling components of an electric field acting in a direction perpendicular to a junction to control the light absorption, in conjunction with a light emitting diode region, a light emitted from the light emitting diode region being caused to transmit through the light absorption control semiconductor region.

Thus, the light absorption spectrum is changed greatly according to the electric field in the light absorption control semiconductor region, and the spectrum of the light transmitting through the light absorption control semiconductor region, i.e., the peak wavelength of the light, can be made variable by controlling the electric field. Since a small amount of current flows through the quantum wells, a power loss for making the wavelength variable is small.

Hereafter, specific examples of the sixth mode of the invention will be described with reference to the drawings.

Seventeenth Embodiment

Figure 38:
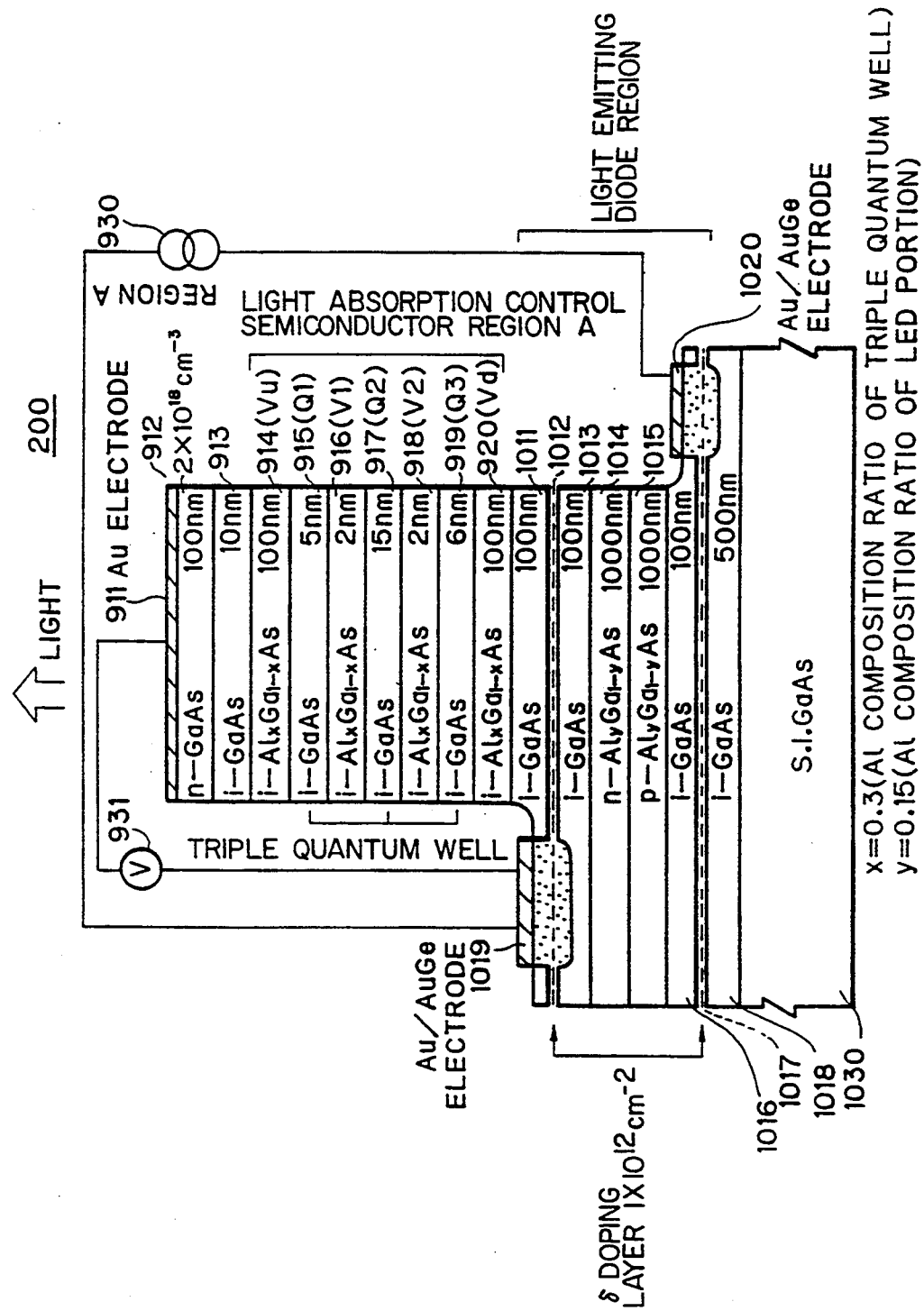
FIG. 38 is a diagram showing the structure of a light emitting diode pertaining to a seventeenth embodiment showing a specific example of a sixth mode of the invention.

FIG. 38 is a sectional view showing the construction of a semiconductor device pertaining to this embodiment.

On a 450 μm semi-insulating GaAs substrate 1030 is formed a 500 nm i-GaAs layer 1018 through the epitaxy method using the MBE method. On the layer 1018 is formed a δ doped layer 1017 obtained by doping silicon atoms sparsely on the surface in the thickness of one atom and having a surface density of $1 \times 10^{12} cm^{-2}$. On the layer 1017 is formed a 100 nm i-GaAs layer 1016. The layers 1018, 1017 and 1016 function as electrode layers. The δ doped layer 1017 functions to apply an electric field uniformly to a light emitting diode region B. Since the layer 1016 is exceedingly thin, a current flows perpendicularly through the layer 1016.

Thereafter, p-$Al_yGa_{1-y}As$ (y=0.15) and n-$Al_yGa_{1-y}As$ are grown to 1000 nm, 1000 nm on the layer 1016 to thereby form a p-AlGaAs layer 1015 and an n-AlGaAs layer 1014. The layers 1015, 1016 form a light emitting diode by a pn junction. When the current is injected, the light is radiated from this pn junction surface. On the layer 1014 is formed a 100 nm i-GaAs layer 1013. On the layer 1013 is formed a δ doped layer 1012 obtained by doping silicon atoms sparsely on the surface at a thickness of one atom and having a surface density of $1 \times 10^{12} cm^{-2}$. On the layer 1012 is formed a 100 nm i-GaAs layer 1011. The layers 1013, 1012, 1011 function as electrode layers. The δ doped layer 1012 functions to apply an electric field uniformly to the light emitting diode region B and a light absorption control semiconductor region A. Since the layers 1013, 1011 are exceedingly thin, a current flows perpendicularly through the layer 1016.

In this way, the layers 1011 to 1018 form the light emitting diode region B.

Then, the light absorption control semiconductor region A is formed as follows.

On the i-GaAs layer 1011 are grown i-$Al_xGa_{1-x}As$, (x=0.3), i-GaAs, i-$Al_xGa_{1-x}As$, i-GaAs, i-$Al_xGa_{1-x}As$, i-GaAs, i-$Al_xGa_{1-x}As$ to 100 nm, 6 nm, 2 nm, 15 nm, 2 nm, 5 nm, 100 nm to thereby form an i-AlGaAs layer 920, and i-GaAs layer 919, an i-AlGaAs layer 918, and i-GaAs layer 917, an i-AlGaAs layer 916, an i-GaAs layer 915, and in i-AlGaAs layer 914.

A multitude of layers 920 to 914 form a triple quantum well TQW. The i-GaAs layer 915 is a first quantum well Q1; the i-GaAs layer 917 is a second quantum well Q2; and the i-GaAs layer 919 is a third quantum well Q3. The i-AlGaAs layers 914, 920 are potential barriers Vu, Vd at opposite ends. The i-AlGaAs layers 916, 918 are intermediate potential barriers V1, V2 for separating the respective quantum wells.

Then, on the i-AlGaAs layer 914 is grown i-GaAs to a thickness of 10 nm to form an i-GaAs layer 913. On the layer 913 is grown n-GaAs to a thickness of 100 nm to form an n-GaAs layer 912. The layers 913, 912 function as electrode layers for the light absorption control semiconductor region A. In this way, an epitaxial film structure is completed.

Thereafter, the layers 912 to 920 form the light absorption control semiconductor region A corresponding to a common electrode between the light emitting diode region B and the light absorption control semiconductor region A. The layers 912 to 920 of the light absorption control semiconductor region A corresponding to an electrode forming portion for the light emitting diode region B, and the layers 1011 to 1015 of the light emitting diode region B are etched to expose the i-GaAs layer 1011 and the i-GaAs layer 1016. Double layer structures of AuGe alloy and Au (50 nm, 200 nm respectively) are formed on those exposed regions, and an Au layer is formed on the n-GaAs layer 912 by vacuum deposition. The alloying process is applied to the thus formed layers in a hydrogen and nitrogen atmosphere at a temperature of 400 degrees for 2 minutes to thereby obtain a common electrode 1019 having an ohmic contact, an electrode 1020 for the light emitting diode region, and an electrode 911 for the light absorption control semiconductor region. Since the electrode 911 is 20 nm in thickness, the light is allowed to transmit through the electrode 911.

A voltage is applied from a power supply 930 so that the electrode 1020 is held at a positive potential relative to the common electrode 1019 to inject a current to the pn junction, and thereby the light is radiated from the pn junction surface. This light transmits perpendicularly through the respective layers of the light absorption control semiconductor region A.

FIG. 38 is a diagram showing energy bands of a light absorbing mechanism in the light absorption control semiconductor region A in this embodiment in a state where no electric field is applied to the triple quantum well.

In each of the conduction and valence bands, there are formed potential barriers Vu, V1, V2, Vd including AlGaAs layers 913, 915, 917, 919, and first, second, and third quantum wells Q1, Q2, Q3 including GaAs layers 914, 916, 918.

Figure 39:
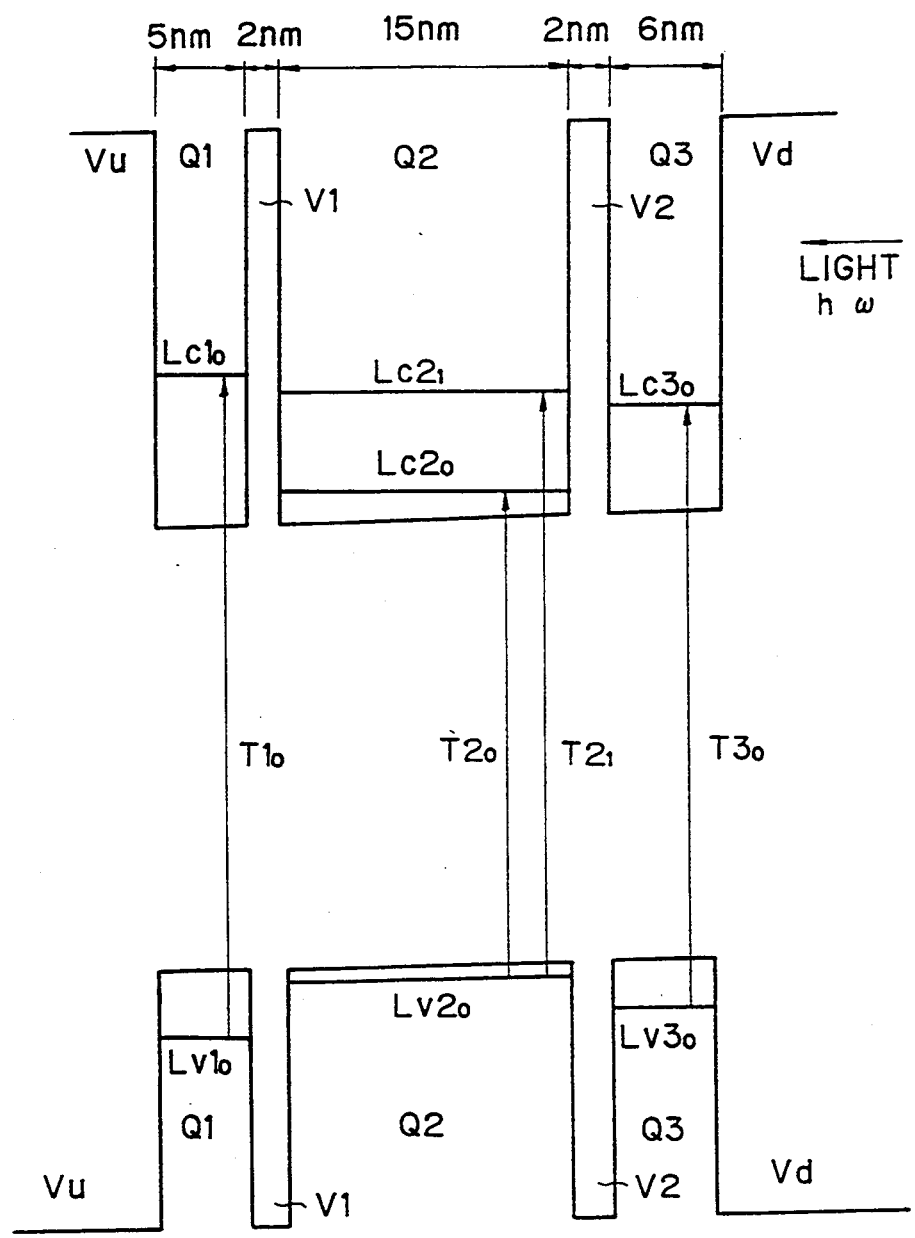
FIG. 39 is a diagram showing the structure of energy bands in a light absorption control semiconductor region of the light emitting diode when no electric field is applied.

The light absorbing mechanism of the light absorption control semiconductor structure in FIG. 39 is identical to that of the light absorption control semiconductor used in the foregoing first to fourth modes of the invention, and accordingly no description will be given thereof.

When the voltage is applied from the power supply 931 so that the electrode 911 is held at the positive potential relative to the common electrode 1019, the n-GaAs layer 912 and the δ doped layer 1012 function as electrode layers, with the result being that the electric field is applied uniformly and perpendicularly to the junction surfaces of the triple quantum well TQW. Then, there occurs the phenomenon as shown in FIGS. 4A and 4B.

Figure 40:
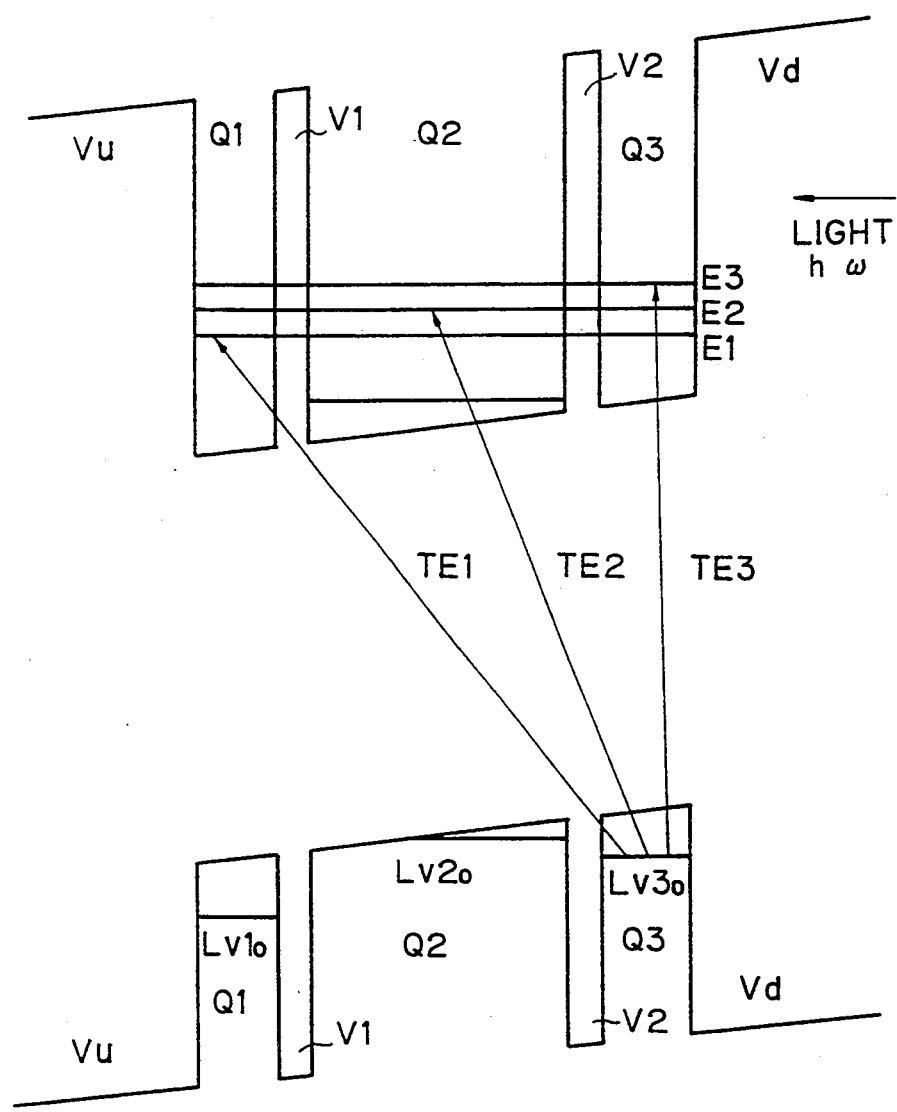
FIG. 40 is a diagram showing the structure of energy bands in the light absorption control semiconductor region when an electric field is applied.

Under these circumstances, the light absorption occurs under the influence of direct transitions TE1, TE2, TE3 between a ground state energy level $Lv3_0$ in the valence band at the third quantum well Q2 and the quantized energy levels E1, E2, E3 commonly spread in the conduction band at the three quantum wells as shown in FIG. 40. Accordingly, the electrons are permitted to transit from the valence band to the quantized energy level at any quantum well in the conduction band by the light absorption. This state is referred to as a resonance state. In the resonance state, the light absorption coefficient becomes exceedingly large.

FIG. 5 is a graph showing a characteristic suited to a case wherein the photoconductivity based on the electrons excited by the beam made incident upon the light absorption control semiconductor region A of this embodiment is measured by changing the applied voltage and the wavelength of the incident beam. This graph shows the light absorption spectrum in the light absorption control semiconductor region A. The bias voltage is changed from 2.5 V to 2.9 V. At 2.5 V, a photoconductivity peak P1 appears at 760 nm. At 2.9 V, the peak P1 disappears and a photoconductivity peak P2 appears at 765 nm. At an intermediate voltage of 2.7 V, both the peaks P1 and P2 are observed weakly. In this way, such an excellent characteristic was observed that the wavelength at the photoconductivity peak, i.e., the wavelength at the light absorption peak, could be controlled by changing the voltage by only 0.4 V. When the wavelength at a particular peak is taken note of, the light absorption coefficient can be controlled.

As seen from above, when the light transmits through the quantum wells Q1, Q2, Q3 of the light absorption control semiconductor region A having this light absorption characteristic, the spectrum of the transmitting light is the spectrum of the light emitted in the light emitting diode region B minus the spectrum shown in FIG. 5. Taking advantage of the light absorption characteristic variable according to the voltage, the spectrum of the transmitting light can be changed according to the intensity of the voltage applied to the light absorption control semiconductor region A.

Eighteenth Embodiment

Figure 41:
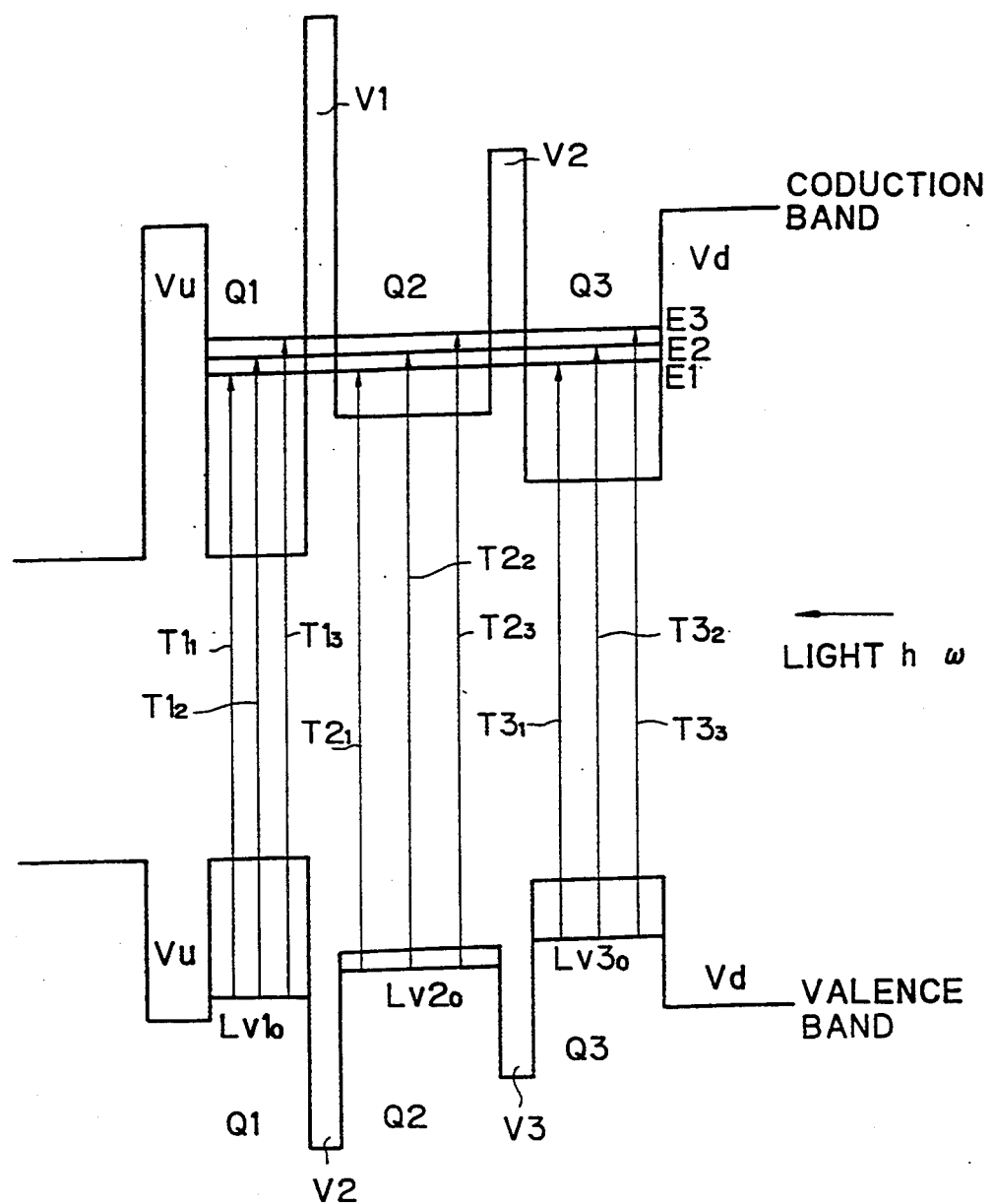
FIG. 41 is a diagram showing the structure of energy bands in a light absorption control semiconductor region of a light emitting diode pertaining to an eighteenth embodiment showing another specific example of the sixth mode of the invention.

This embodiment pertains to a modification of the construction of the light absorption control semiconductor region A of the seventeenth embodiment. FIG. 41 is a diagram showing energy bands in a light absorption control semiconductor region A of the eighteenth embodiment. In this embodiment, semiconductors formed of different materials are used for first, second, and third quantum wells Q1, Q2, Q3. The first quantum well Q1 is formed of InGaAs; the second quantum well Q2 is formed of AlGaAs; the third quantum well Q3 is formed of GaAs; and barriers Vu, V1, V2, Vd are formed of AlGaAs having a large Al composition ratio. By regulating the width of the respective quantum wells Q1, Q2, Q3, ground state energy levels coincide (match) only in the conduction bands at the respective quantum wells in the absence of an electric field. The quantized energy levels do not coincide in valence bands. In this structure, only the conduction band at the three quantum wells can be brought into a resonance state in the state where no electric field is applied. In the resonance state in the conduction band, the matched quantized energy levels are separated into three quantized energy levels El, E2, E3 which differ by a minute energy, thereby releasing the degeneracy.

This device has three absorption lines simultaneously in a single structure and switches electrically the three absorption lines which differ slightly from one another. Thus, the spectrum of the light transmitted through the light absorption control semiconductor region A can be controlled by changing the voltage minutely. Therefore, the spectrum of the light can be changed delicately according to the minute change in the voltage.

Nineteenth Embodiment

Figure 42:
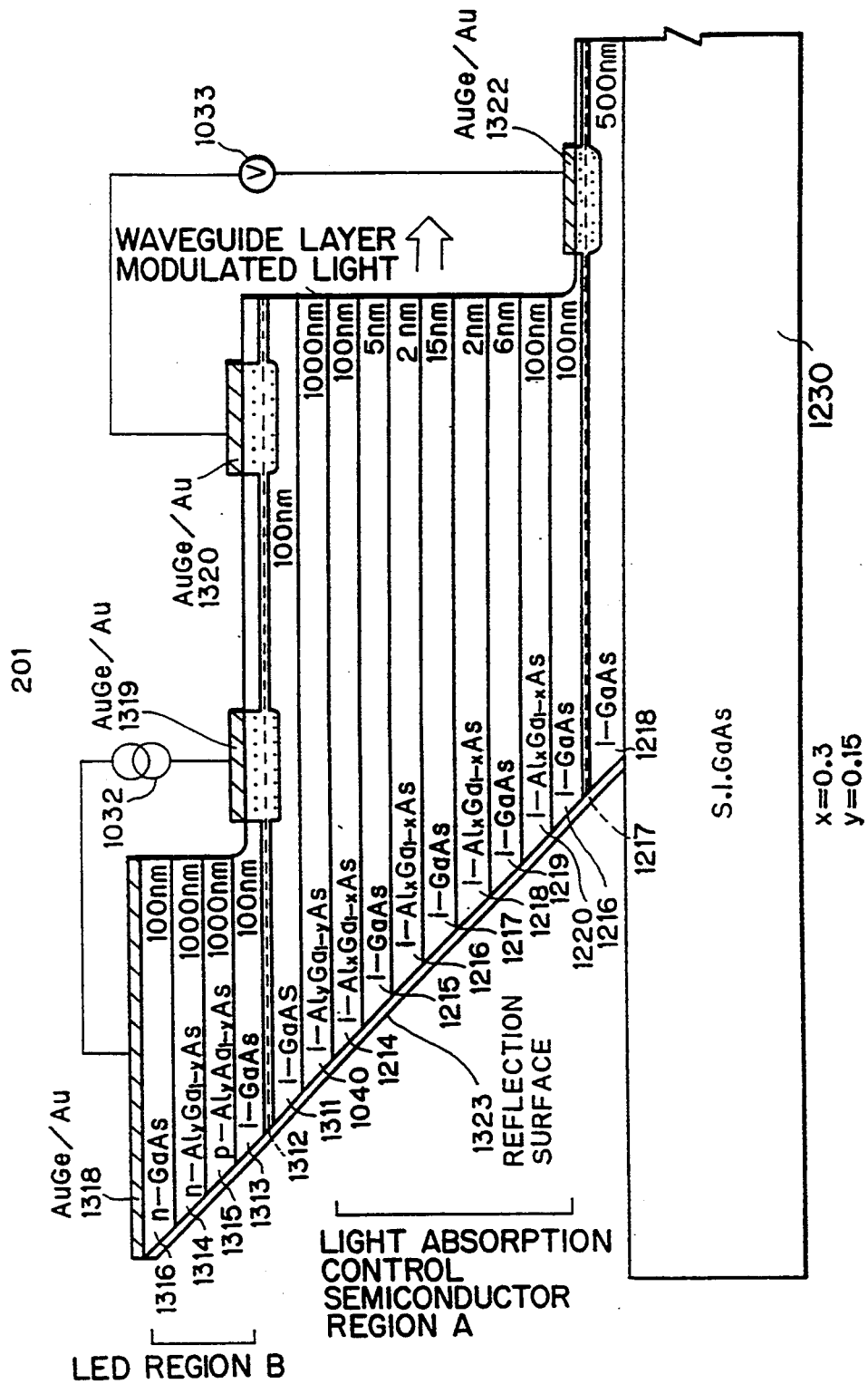
FIG. 42 is a sectional view showing the structure of a light emitting diode pertaining to a nineteenth embodiment showing still another specific example of the sixth mode of the invention.

FIG. 42 is a sectional view showing the construction of a light emitting diode 201 pertaining to this embodiment. In this embodiment, on a semi-insulating GaAs substrate 1230 is formed a 500 nm i-GaAs layers 1218, a δ doped layer 1217, and a 100 nm i-GaAs layer 1216. The δ doped layer 1217 functions as an electrode layer for a light absorption control semiconductor region A. On the i-GaAs layer 1216 is formed the light absorption control semiconductor region A (layers 1220 to 1214 corresponding to the layers 920 to 914 of the eighteenth embodiment including the potential barrier Vd, third quantum well Q3, potential barrier V2, second quantum well Q2, potential barrier V1, first quantum sell Q1, and potential barrier Vu) constructed identically to that of the first embodiment.

Thereafter, on the i-AlGaAs layer 1214 is formed a 1000 nm i-Al$_y$Ga$_{1-y}$As (y=0.15) layer 1040. The layer 1040 functions as a waveguide layer. On the layer 1040 are formed a 100 nm i-GaAs layer 1311, a δ doped layer 1312, and a 100 nm i-GaAs layer 1313. These layers correspond to the layers 1111, 1112, 1113 in the eighteenth embodiment, and function as common electrode layers for the light absorption control semiconductor region A and the light emitting diode region B.

Thereafter, on the i-GaAs layer 1311 are formed a 1000 nm p-AlGaAs layer 1315, and a 1000 nm n-AlGaAs layer 1314. These layers correspond to the layers 1115, 1114 in the eighteenth embodiment. On the layer 1314 is formed a 100 nm n-GaAs layer 1316 (corresponding to the layer 912 in the eighteenth amendment). Then, the above layers are etched into a shape as illustrated. Double layer structures of AuGe and Au are formed on the n-GaAs layer 1316 and the exposed i-GaAs layers 1313 to obtain electrodes 1318, 1319 for the light emitting diode region. Likewise, electrodes 1320, 1322 for the light absorption control semiconductor region are formed on the exposed i-GaAs layer 1313 and the expose i-GaAs layer 1216. Then, a reverse mesa etching is carried out by which the lower the layers are positioned, the wider they are etched. A reflection film 1323 is formed by depositing an oxide film, nitride, or aluminum on lateral end faces of the layers.

In a thus constructed light emitting diode, when a voltage is applied from a power supply 1032 so that the electrode 1319 is held at a positive potential relative to the electrode 1318, a current is injected into the pn junction and a light is radiated therefrom. This light advances perpendicular to the junction surface, is reflected by the reflection film 1323, and advances in a direction parallel with the substrate 1230. At this time, the light propagates in the waveguide layer 1040 in parallel with the layer surfaces. However, since the light absorption control semiconductor region A joined with the waveguide layer 1040 is exceedingly thin, some light leaks to the light absorption control semiconductor region A. More specifically, the light advances while being reflected a multitude of times between upper and lower surfaces of the waveguide layer 1040. The light transmitted through the lower surface leaks to the light absorption control semiconductor region A, is reflected by the respective layers, and returns to the waveguide layer 1040 again. Accordingly, the light is absorbed according to a specified absorption spectrum in the light absorption control semiconductor region A while propagating in the waveguide layer 1040. Thus, similar to the eighteenth embodiment, the spectrum of the light propagating in the waveguide layer 1040 can be modulated according to the intensity of the voltage applied between the electrodes 1320 and 1322. In other words, the spectrum of the light propagating in the waveguide layer 1040 can be changed by the voltage.

While the foregoing embodiment is described with respect to the device of changing the emission spectrum, the invention may be applicable to a light receiving apparatus for measuring the intensity of the light having a specific wavelength by measuring a current flowing through the light absorption control semiconductor region A between the electrodes 911 and 1019 and between the electrodes 1322 and 1320 in the resonance state.

We claim:

1. A semiconductor device including a quantum well layer structure formed by a junction of different types of semiconductors having different band gaps and enclosed by energy barriers, said quantum well layer structure comprising:

a first and a third quantum well layer arranged to opposite sides of a second quantum well layer and each quantum well layer being separated by a respective barrier;

wherein a width of said respective quantum well layers and barriers are set such that wave functions of electrons at said respective quantum well layers interact in a resonance state where a base energy level of said first quantum well layer, a base energy level of said third quantum well layer, and a first-excited-state energy level of said second quantum well layer are matched to each other;

wherein said width and a material of said respective quantum well layers are set so that either one of conduction and valence bands of each of said first, second and third quantum well layers are brought into said resonance state where said first-excited-state energy level of a said second quantum well layer and said base energy levels of said first and third are matched in at least one state selected from a state where no electric field is applied and a state where a suitable electric field is applied in a direction perpendicular to said junction; and a light absorption property of said quantum well layer structure being changed by controlling components of said applied electric field perpendicular to said junction.

2. A semiconductor device according to claim 1, further comprising:
a substrate;
wherein said at least three quantum well layers are epitaxially formed and located on said substrate.

3. A semiconductor device according to claim 2, further comprising:
a first electrode formed in contact with a first surface of said quantum well layer structure; and
a second electrode formed at least partially in contact with a second surface of said quantum well layer structure;

wherein said electric field is appliable between said first and second electrodes in said perpendicular direction.

4. A semiconductor device according to claim 3, wherein said second electrode is formed entirely between said quantum well layer structure and a substrate.

5. A semiconductor device according to claim 4, further comprising:
 a first semi-insulating layer formed by an epitaxial growth of undoped semi-insulating compound semiconductor on said substrate;
 a conductive δ doped layer formed by coarsely doping impurity atoms to form a film having a thickness of an atomic order on said first semi-insulating layer; and
 a second semi-insulating layer formed by an epitaxial growth of undoped semi-insulating compound semiconductor on said δ doped layer;
 wherein said δ doped layer is used as said second electrode.

6. A light absorption control semiconductor device controlling light transmitted along a waveguide path according to a predetermined absorption spectrum characteristic of said device to change a characteristic of said transmitted light, said device comprising:
 a waveguide layer for guiding light;
 a photovoltaic semiconductor layer;
 a light absorption control semiconductor region located adjacent said waveguide layer and said photovoltaic semiconductor layer capable of changing a characteristic of light propagating through said light absorption control semiconductor region so that light transmitted in said waveguide layer leaks to said light absorption control semiconductor region, said light absorption control semiconductor region including:
  at least three quantum well layers formed by junctions of different types of semiconductors having different band gaps and having quantized energy levels enclosed by respective energy barriers,
  a width of said respective quantum well layers and barriers being set such that wave functions of electrons in said respective quantum well layers interact in a resonance state where base energy level of said first quantum well layer and a base energy level said third quantum well layer are matched to a first-excited-state energy level of said second quantum well layer,
  said width and a material of said respective quantum well layers being set so that one of said conduction and valence bands of each of said first, second and third quantum well layers are brought into said resonance state where an electric field is applied in a direction perpendicular to said junctions of different types of semiconductors,
  said electric field applied to said light absorption control semiconductor region being controlled by a voltage generated by a control beam incident upon said photovoltaic semiconductor layer so as to modulate a carrier beam incident upon said light absorption control semiconductor region.

7. A light absorption control semiconductor device including a quantum well layer structure formed by a junction of different types of semiconductors having different band gaps and having a quantized energy level enclosed by energy barriers, said device comprising:
 a light absorption control semiconductor region capable of changing a characteristic of light propagating through said light absorption control semiconductor region; and
 a photovoltaic semiconductor layer joined with at least one end surface of said light absorption control semiconductor region, said photovoltaic semiconductor layer applying an electric field perpendicularly to said light absorption control semiconductor region;
 said light absorption control semiconductor region including:
  at least three quantum layers formed by junctions of different types of semiconductors having different band gaps and having quantized energy levels enclosed by respective energy barriers,
  a width of said respective quantum well layers and barriers being set such that wave functions of electrons in said respective quantum well layers interact in a resonance state where a base energy level of said first quantum well layer and a base energy level of said third quantum well layer are matched to a first-excited-state energy level of said second quantum well layer, and
  said width and a material of said respective quantum wells being set so that one of said conduction and valence bands of each of said first, second and third quantum well layers are brought into said resonance state where said quantized energy levels at said respective quantum wells are matched in a state selected from a state where no electric field is applied or a state where a suitable electric field is applied in a direction perpendicular to said junctions of different types of semiconductors,
  said electric field applied to said light absorption control semiconductor region being controlled by a voltage generated by a control beam incident upon said photovoltaic semiconductor layer so as to modulate a carrier beam incident upon said the light absorption control semiconductor region.

8. A light absorption control semiconductor device including a quantum well layer structure formed by a junction of different types of semiconductors having different band gaps and having a quantized energy level enclosed by energy barriers, said device comprising:
 at least three quantum well layers formed by junctions of different types of semiconductors having different band gaps and having quantized energy levels enclosed by respective energy barriers;
 a width of said respective quantum wells and barriers being set such that wave functions of electrons in said respective quantum well layers interact in a resonance state where a base energy level of said first quantum well layer and a base energy level of said third quantum well layer are matched to a first-excited-state energy level of said second quantum well layer; and
 said width and a material of said respective quantum well layers being set so that one of said conduction and valence bands of each of said first, second and third quantum well layers are brought into said resonance state where said quantized energy levels at said respective quantum well layers are matched in a state selected from a state where no electric field is applied or a state where a suitable electric field is applied in a direction perpendicular to said junctions of different types of semiconductors;

wherein a control beam is made incident upon said quantum well layer structure to generate pairs of electrons and holes, and an absorption spectrum of said quantum well layer structure is changed under an influence of an electric field generated by an unbalanced distribution of said electrons and holes so as to modulate a carrier beam present in said quantum layers.

9. A light absorption control semiconductor device according to claim 7, further comprising:

a waveguide layer located on said device and constructed such that a carrier beam transmitted therein leaks to said light absorption control semiconductor region so as to modulate said carrier beam with said control beam.

10. A light absorption control semiconductor device according to claim 8, further comprising a waveguide layer joined with one end of one of said at least three quantum well layers, said waveguide layer being constructed such that said carrier beam transmitted therein leaks to said light absorption control semiconductor region so as to modulate said carrier beam with said control beam.

11. A variable wavelength semiconductor laser device having semiconductor layers accumulated on a substrate and an optical emission path formed by a resonator in a direction parallel to a substrate, said device comprising:

a light absorption control semiconductor region joined with said semiconductor laser;

said semiconductor laser having a portion of a laser beam emitting therefrom being leaked to said light absorption control semiconductor region;

said light absorption control semiconductor region comprising:

at least three quantum wells formed by junctions of different types of semiconductors having different band gaps and having quantized energy levels enclosed by respective energy barriers, a width of said respective quantum well layers and barriers being set such that wave functions of electrons in said respective quantum well layers interact in a resonance state where a base energy level of said first quantum well layer and a base energy level of said third quantum well layer are matched to a first-excited-state energy level of said second quantum well layer, said width and a material of said respective quantum well layers being set so that one of said conduction and valence bands of each of said first, second and third quantum well layers are brought into said resonance state where said quantized energy levels at said respective quantum well layers are matched in a state selected from a state where no electric field is applied and a state where a suitable electric field is applied in a direction perpendicular to said junctions of different types of semiconductors, and a light absorption property of said light absorption control semiconductor region being changed by controlling components of said electric field perpendicular to said junctions of different types of semiconductors.

12. A variable wavelength light emitting diode comprising:

a light emitting diode region including a junction surface of a semiconductor layer for emitting a light; and a light absorption control semiconductor region upon which light emitted from said light emitting diode region is incident, said light absorption control semiconductor region including:

at least three quantum well layers formed by junctions of different types of semiconductors having different band gaps and having quantized energy levels enclosed by respective energy barriers, a width of said respective quantum well layers and barriers being set such that wave functions of electrons in said respective quantum well layers interact in a resonance state where a base energy level of said first quantum well layer and a base energy level of said third quantum well layer are matched to a first-excited-state energy level of said second quantum well layer, said width and a material of said respective quantum well layers being set so that one of said conduction and valence bands of each of said first, second and third quantum well layers are brought into said resonance state where said quantized energy levels at said respective quantum well layers are matched in a state selected from a state where no electric field is applied and a state where a suitable electric field is applied in a direction perpendicular to said junction surface of said light emitting diode, and a light absorption property of said light absorption control semiconductor region being changed by controlling components of said electric field perpendicular to said junction surface of said light emitting diode.

13. A light absorption control semiconductor device comprising:

a semiconductor substrate; and a multi-layered semiconductor quantum well structure located on said substrate and including a first, second and third quantum well layer separated from each other by a respective semiconductor barrier layer;

wherein a base energy level of said first quantum well layer and a base energy level of said third quantum well layer are matched to a first-excited-state energy level of said second quantum well layer such that wave functions of electrons at each of said first, second and third quantum well layers interact in a resonant state.

14. A light absorption control semiconductor device according to claim 13, wherein said resonant state occurs when said first, second and third quantum well layers are under an influence of a state selected from a group consisting of: no electrical field and a suitable electrical field applied in a direction perpendicular to a junction between said substrate and said multi-layered semiconductor quantum well structure.

15. A light absorption control semiconductor device according to claim 14, wherein:

said first, second and third quantum well layers are under an influence of said suitable electrical field; and a light absorption characteristic of said device is changed by controlling components of said suitable electrical field.

16. A semiconductor device according to claim 13, wherein said first, second and third quantum well layers are formed by an epitaxial-growth method.

17. A semiconductor device according to claim 14, further comprising a first and second electrode formed to apply said suitable electric field to said first, second and third quantum well layers.

18. A semiconductor device according to claim 17, further comprising between said substrate and said multi-layered semiconductor quantum well structure:
   a first semi-insulating layer formed on said substrate by an epitaxial growth of undoped semi-insulating compound semiconductor;
   a conductive δ doped layer formed on said first semi-insulating layer to form said second electrode by doping impurity atoms to a thickness of an atomic order; and
   a second semi-insulating layer formed on said conductive δ doped layer by an epitaxial growth of undoped semi-insulating compound semiconductor.

19. A semiconductor device for absorbing light propagating along a waveguide path to change a characteristic of said propagating light, said device comprising:
   a semiconductor substrate;
   a light absorption control region located on said semiconductor substrate, comprising a multi-layered semiconductor quantum well structure including a first, second and third quantum well layer separated from each other by a respective semiconductor barrier layer; and
   a waveguide layer formed on said light absorption control region;
   wherein a base energy level of said first quantum well layer and a base energy level of said third quantum well layer are matched to a first-excited-state energy level of said second quantum well layer such that wave functions of electrons at each of said first, second and third quantum well layers interact in a resonant state;
   said resonant state occurs when said first, second and third quantum well layers are under an influence of a state selected from a group consisting of: no electrical field and a suitable electrical field applied in a direction perpendicular to a junction between said substrate and said multi-layered semiconductor quantum well structure; and
   wherein light propagating through said waveguide layer leaks to said light absorption control region.

20. A light absorption control semiconductor device comprising:
   a semiconductor substrate;
   a light absorption control region located on said semiconductor substrate, comprising a multi-layered semiconductor quantum well structure including a first, second and third quantum well layer separated from each other by a respective semiconductor barrier layer; and
   a photovoltaic semiconductor layer located on said semiconductor substrate for applying a perpendicular electric field to said light absorption control region;
   wherein a base energy level of said first quantum well layer and a base energy level of said third quantum well layer are matched to a first-excited-state energy level of said second quantum well layer such that wave functions of electrons at each of said first, second and third quantum well layers interact in a resonant state;
   said resonant state occurs when said first, second and third quantum well layers are under an influence of a state selected from a group consisting of: no electrical field and a suitable electrical field applied in a direction perpendicular to a junction between said substrate and said light absorption control region; and
   said electric field applied to said light absorption control region is controlled by a voltage generated by a control light beam incident upon said photovoltaic semiconductor layer and modulates a carrier light beam incident upon said light absorption control semiconductor region.

21. A light absorption control semiconductor device according to claim 14, wherein:
   a control light beam incident upon said first, second and third quantum well layers generates pairs of electrons and holes in said first, second and third quantum well layers and an absorption spectrum of said light absorption control semiconductor device is changed by an influence of an electric field generated by an unbalanced distribution of said electrons and holes in said first, second and third quantum well layers; and
   said changed absorption spectrum modulates a carrier light beam in said quantum well layers.

22. A light absorption control semiconductor device according to claim 20, further comprising:
   a waveguide layer formed to a side of said light absorption control region;
   wherein carrier light propagating through said waveguide layer leaks to said light absorption control region.

23. A light absorption control semiconductor device according to claim 21, further comprising:
   a waveguide layer formed to a side of said light absorption control region;
   wherein said carrier light beam propagating through said waveguide layer leaks to said light absorption control region so that said carrier light beam is modulated with said control light beam.

24. A variable wavelength semiconductor laser comprising:
   a semiconductor substrate;
   a semiconductor laser located on said semiconductor substrate; and
   a light absorption control region located on said semiconductor laser, comprising a multi-layered semiconductor quantum well structure including a first, second and third quantum well layer separated from each other by a respective semiconductor barrier layer;
   wherein a base energy level of said first quantum well layer and a base energy level of said third quantum well layer are matched to a first-excited-state energy level of said second quantum well layer such that wave functions of electrons at each of said first, second and third quantum well layers interact in a resonant state;
   said resonant state occurs when said first, second and third quantum well layers are under an influence of a state selected from a group consisting of: no electrical field and a suitable electrical field applied in a direction perpendicular to a junction between said substrate and said light absorption control region;

said semiconductor laser is formed to have a portion of a laser beam emminating therefrom leak to said light absorption control region; and wherein a light absorption of said light absorption control region is changed by controlling components of said suitable electrical field.

25. A variable wavelength light emitting diode comprising:
- a semiconductor substrate;
- a light emitting diode region located on said semiconductor substrate; and
- a light absorption control region formed on said semiconductor laser, comprising a multi-layered semiconductor quantum well structure including a first, second and third quantum well layer separated from each other by a respective semiconductor barrier layer;
- wherein a base energy level of said first quantum well layer and a base energy level of said third quantum well layer are matched to a first-excited-state energy level of said second quantum well layer such that wave functions of electrons at each of said first, second and third quantum well layers interact in a resonant state;
- said resonant state occurs when said first, second and third quantum well layers are under an influence of a state selected from a group consisting of: no electrical field and a suitable electrical field applied in a direction perpendicular to a junction between said substrate and said light absorption control region;
- wherein light emitted from said light emitting diode is incident upon said light absorption control region; and
- wherein a light absorption of said light absorption control region is changed by controlling components of said suitable electrical field.

26. A light absorption control semiconductor device according to claim 13, wherein said second quantum well layer is formed between said first and said third quantum well layers, and a thickness of said second quantum well layer is larger than a thickness of each of said first and said second quantum well layers.

27. A semiconductor device comprising:
- a quantum well layer structure formed by a junction of different types of semiconductors having different band gaps and enclosed by respective energy barriers, said quantum well layer structure comprising a first, second and third quantum well layers, said second quantum well layer being located between said first and third quantum well layers;
- a width of said first, second and third respective quantum well layers and respective barriers being set such that wave functions of electrons at said first, second and third respective quantum well layers interact in a resonance state where a first-excited-state energy level of said second quantum well layer and base energy levels of said first and third quantum well layers are matched;
- said width of said first, second and third quantum well layers and respective barriers being also set such that either one of conduction and valence bands is brought into said resonance state where said first-excited-state energy level of said second quantum well layer and said base energy levels of said first and third quantum well layers are matched in at least one state selected from a state where no electric field is applied and a state where a suitable electric field is applied in a direction perpendicular to said junction of different types of semiconductors; and
- a light absorption property of said quantum well layer structure being changed by controlling components of said electric field perpendicular to said junction of different types of semiconductors.

* * * * *